(12) United States Patent　　(10) Patent No.:　　US 12,657,126 B2

Kodama et al.　　(45) Date of Patent:　　Jun. 16, 2026

(54) VARIABLE LENGTH CODING DEVICE AND MEMORY SYSTEM

(71) Applicant: Kioxia Corporation, Tokyo (JP)

(72) Inventors: Sho Kodama, Kamakura Kanagawa (JP); Masato Sumiyoshi, Yokohama Kanagawa (JP); Keiri Nakanishi, Kawasaki Kanagawa (JP); Yosei Takasaki, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 130 days.

(21) Appl. No.: 18/801,968

(22) Filed: Aug. 13, 2024

(65) Prior Publication Data

US 2025/0077417 A1　　Mar. 6, 2025

(30) Foreign Application Priority Data

Sep. 1, 2023　　(JP) ................................. 2023-142321

(51) Int. Cl.
　*G06F 12/02*　　　(2006.01)
　*G06F 12/04*　　　(2006.01)
　　　　　(Continued)

(52) U.S. Cl.
　CPC .......... *G06F 12/0246* (2013.01); *G06F 12/04* (2013.01); *H03M 7/40* (2013.01);
　　　　　(Continued)

(58) Field of Classification Search
　CPC ............. G06F 12/0246; G06F 12/0238; G06F 2212/7202; G06F 12/04; H03M 7/40;
　　　　　(Continued)

(56) References Cited

U.S. PATENT DOCUMENTS 6,690,306 B1 * 2/2004 Acharya ................. H03M 7/40
　　　　　　　　　　　　　　341/67
7,545,293 B2　6/2009 Reznik
　　　　　　　(Continued)

FOREIGN PATENT DOCUMENTS

JP　　2022139227 A　　9/2022
JP　　2023127253 A　　9/2023
JP　　2024096621 A　　7/2024

OTHER PUBLICATIONS

L. Peter Deutsch, "Deflate Compressed Data Format Specification version 1.3", Request for Comments: 1951, 1996, pp. 1-17, DOI: 10.17487/RFC1951, https://dl.acm.org/doi/pdf/10.17487/RFC1951.

*Primary Examiner* — Khai M Nguyen
(74) *Attorney, Agent, or Firm* — Maier & Maier, PLLC

(57)　　　　ABSTRACT

According to one embodiment, a variable length coding device includes circuitry. The circuitry determines N code lengths corresponding to respective N symbols, based on a Huffman tree. In a case where the N code lengths include a first code length longer than a maximum code length, the circuitry selects a first symbol corresponding to the first code length from the N symbols, selects, from the N symbols, a second symbol corresponding to a second code length shorter than the maximum code length, changes the second code length corresponding to the second symbol to a code length obtained by adding one to the second code length, and changes the first code length corresponding to the first symbol to a code length equal to the changed second code length.

17 Claims, 42 Drawing Sheets

(51) Int. Cl.
*G11C 16/04* (2006.01)
*G11C 16/10* (2006.01)
*H03M 7/40* (2006.01)

(52) U.S. Cl.
CPC ....... *H03M 7/4037* (2013.01); *G06F 12/0238* (2013.01); *G06F 2212/7202* (2013.01); *G11C 16/0483* (2013.01); *G11C 16/10* (2013.01)

(58) Field of Classification Search
CPC ... H03M 7/4037; G11C 16/0483; G11C 16/10
USPC ...................................................... 341/65, 67
See application file for complete search history.

(56) References Cited

U.S. PATENT DOCUMENTS

| | | | | |
|---|---|---|---|---|
| 10,230,393 | B2 | 3/2019 | Wu et al. | |
| 10,756,758 | B1 * | 8/2020 | Abali | H03M 7/3077 |
| 2022/0294469 | A1 | 9/2022 | Kodama et al. | |
| 2023/0283295 | A1 | 9/2023 | Kodama et al. | |
| 2024/0223211 | A1 | 7/2024 | Nakanishi et al. | |

* cited by examiner

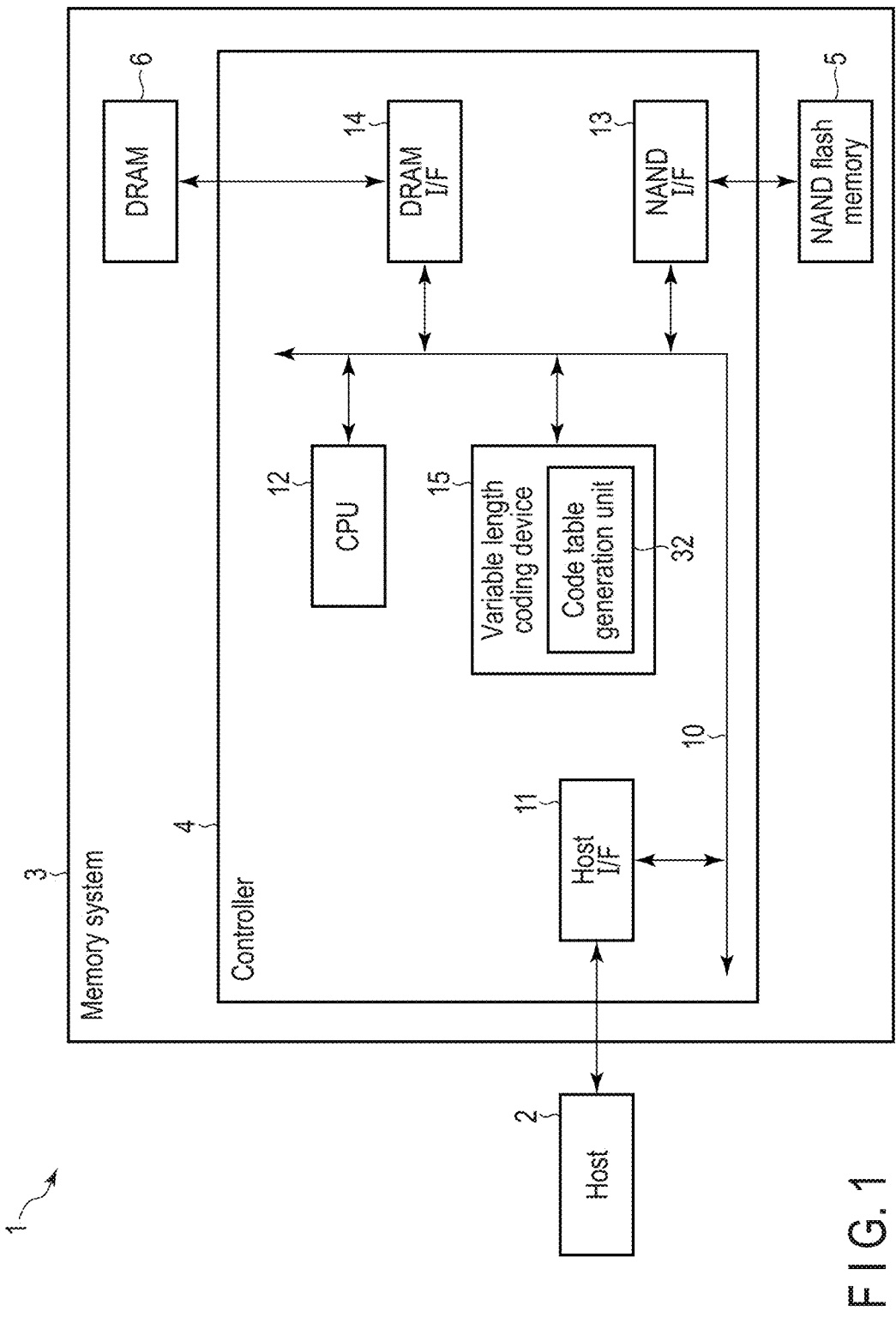
F I G. 1

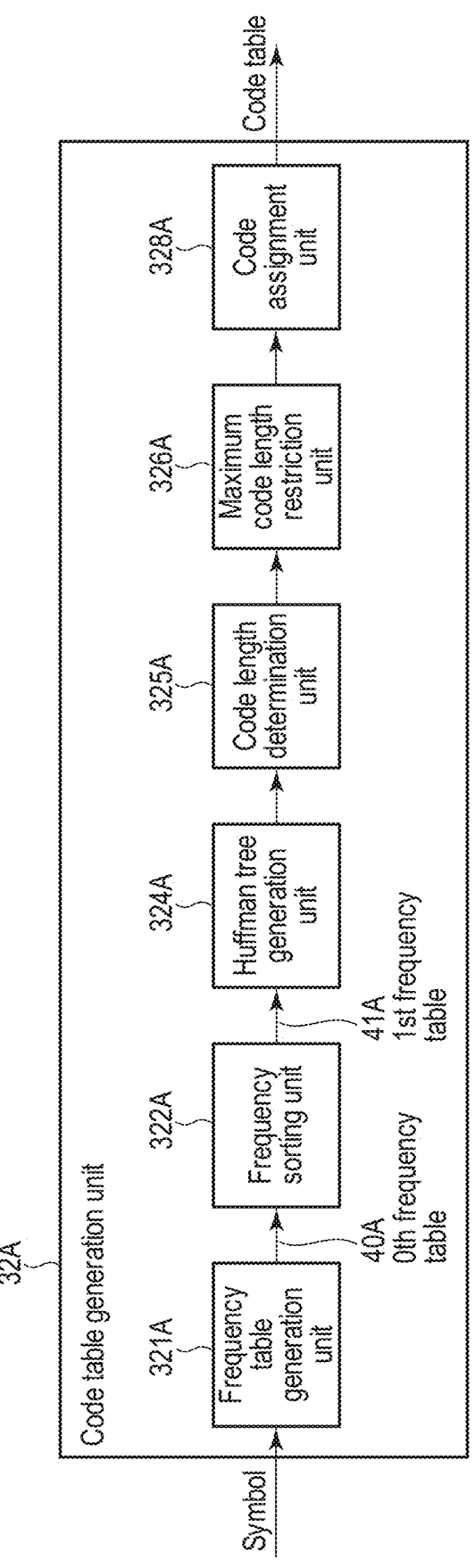
F I G. 2

| Symbol | Frequency of occurrence |
|--------|-------------------------|
| a | 120 |
| b | 60 |
| c | 29 |
| d | 14 |
| e | 4 |
| f | 3 |
| g | 3 |
| h | 2 |
| i | 0 |
| j | 0 |
| ⋮ | ⋮ |

| Symbol | Code length |
|--------|-------------|
| a | 1 |
| b | 2 |
| c | 3 |
| d | 4 |
| e | 6 |
| f | 6 |
| g | 6 |
| h | 6 |

FIG. 6

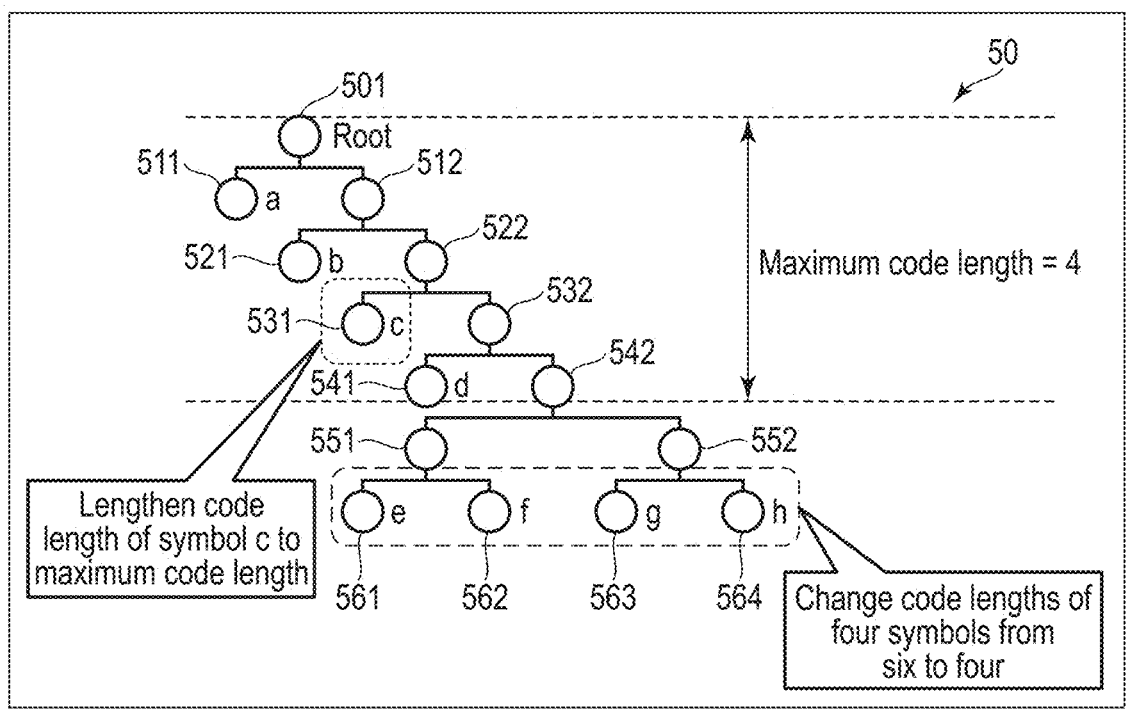
F I G. 8

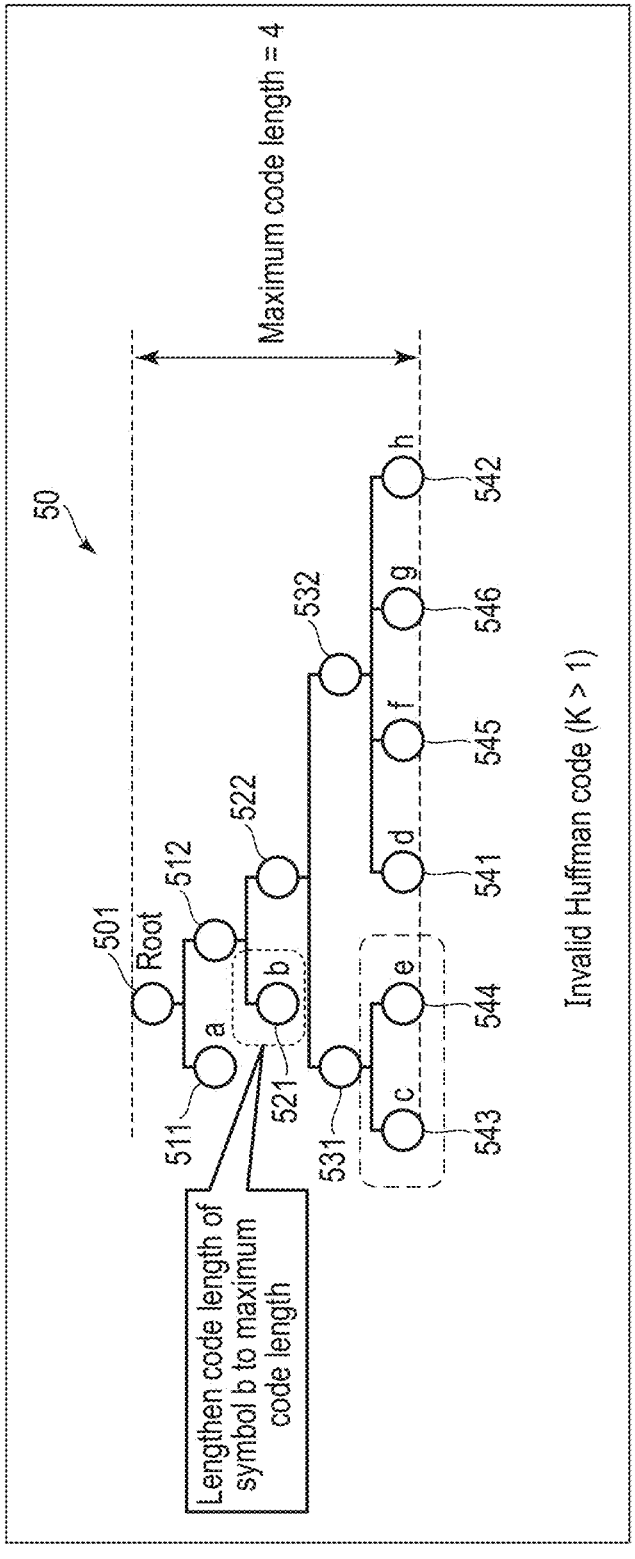
F I G. 9

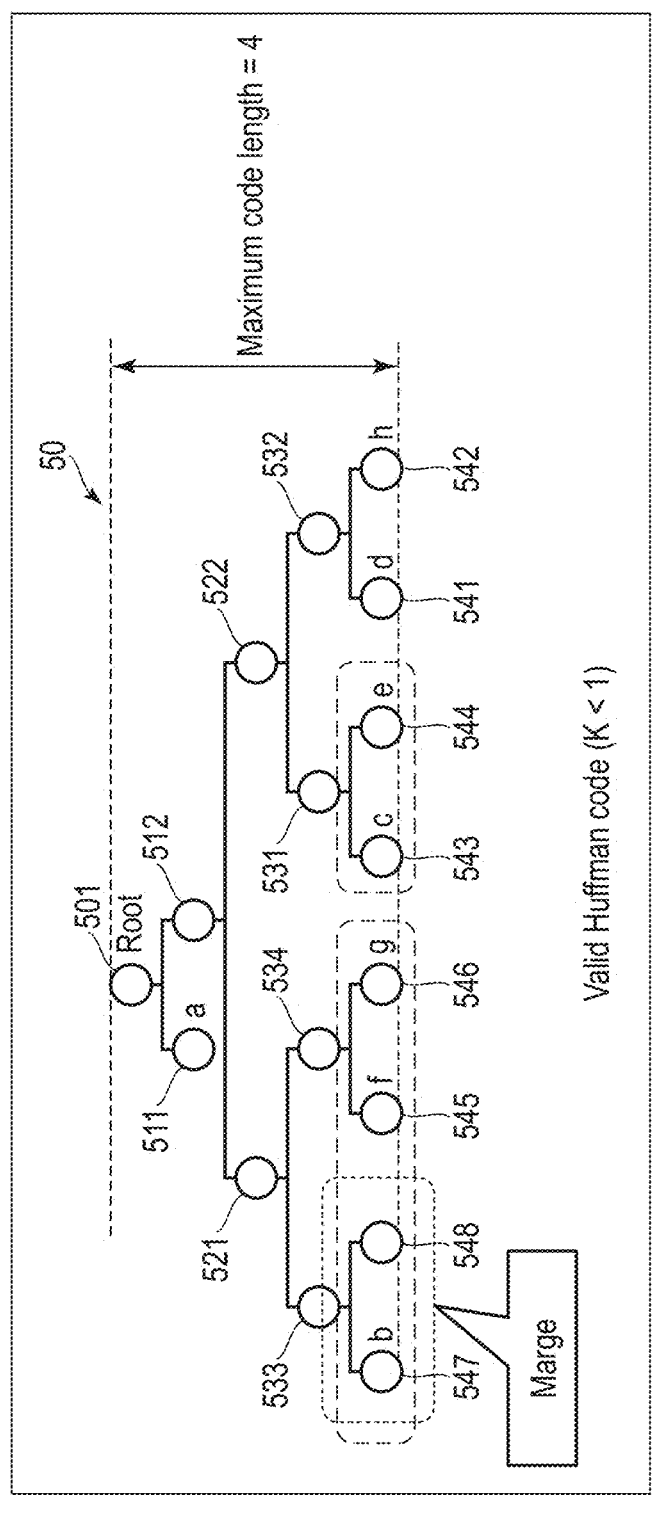
F I G. 10

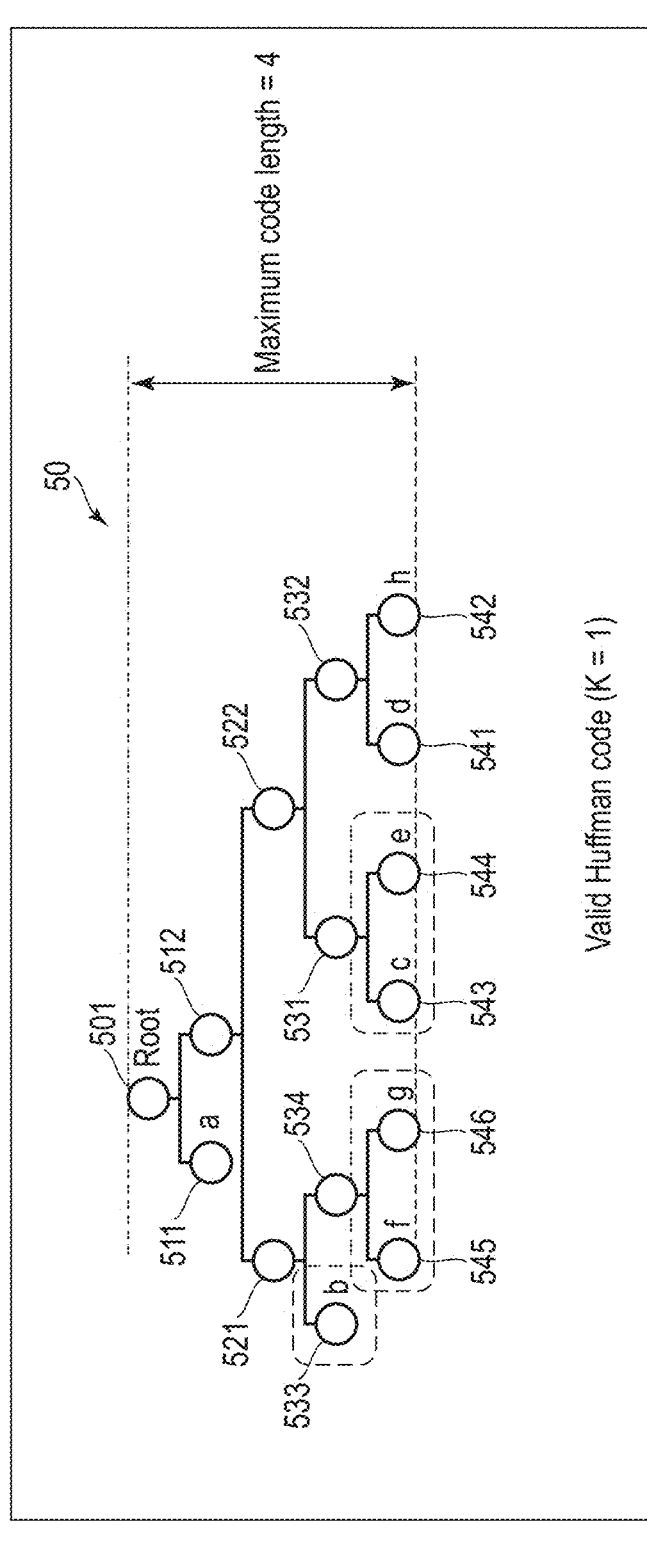
F I G. 11

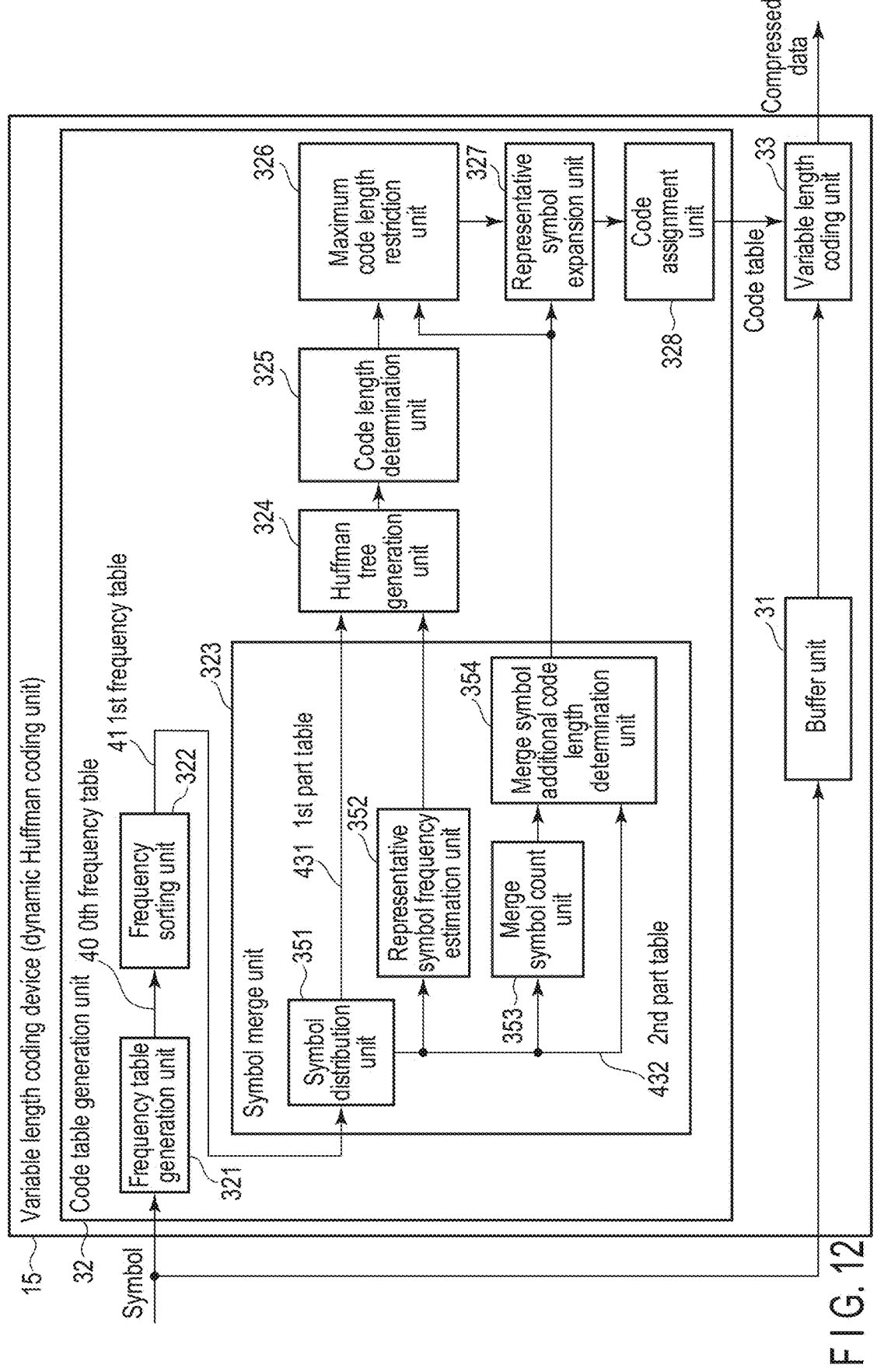
F I G. 12

| Index | Symbol number | Frequency of occurrence |
|-------|---------------|-------------------------|
| 0 | 0 | 3 |
| 1 | 1 | 16 |
| 2 | 2 | 1 |
| 3 | 3 | 0 |
| ⋮ | ... | ... |
| 253 | 253 | 30 |
| 254 | 254 | 0 |
| 255 | 255 | 4 |

F I G. 13

| Index | Symbol number | Frequency of occurrence |
|-------|---------------|-------------------------|
| 0 | 64 | 50 |
| 1 | 253 | 30 |
| 2 | 80 | 25 |
| 3 | 1 | 16 |
| ⋮ | ... | ... |
| 253 | 75 | 0 |
| 254 | 100 | 0 |
| 255 | 8 | 0 |

F I G. 14

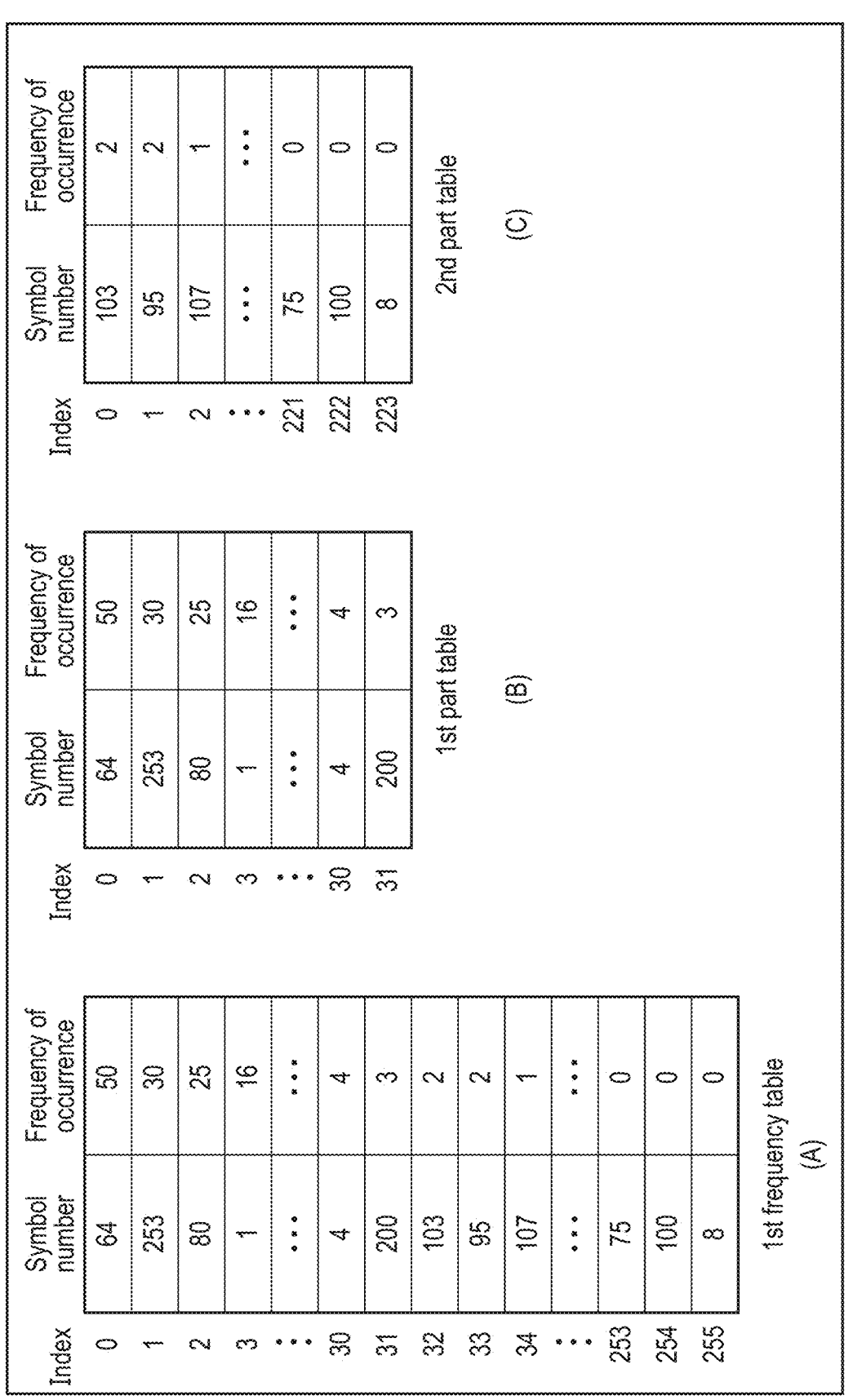
F I G. 15

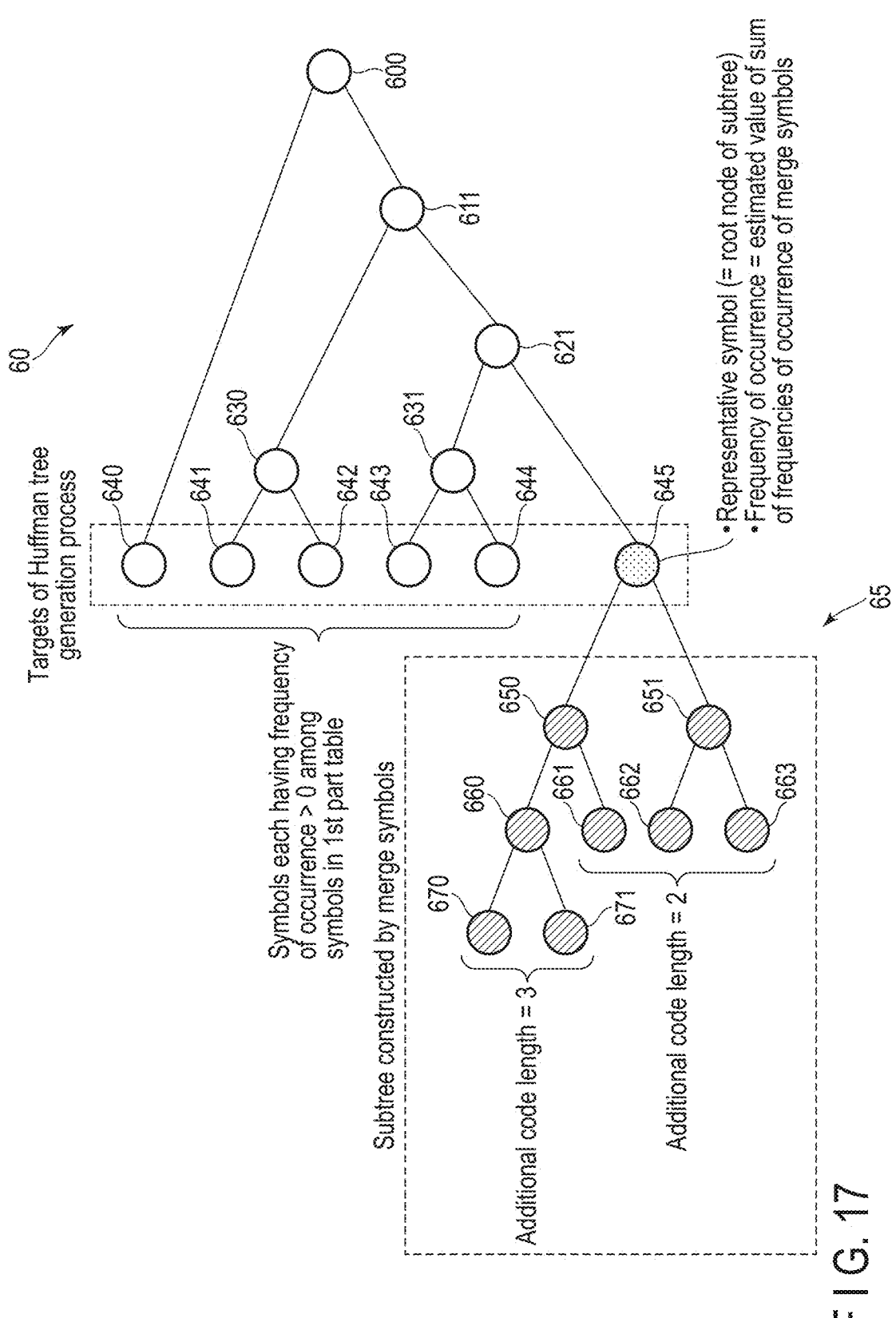
F I G. 17

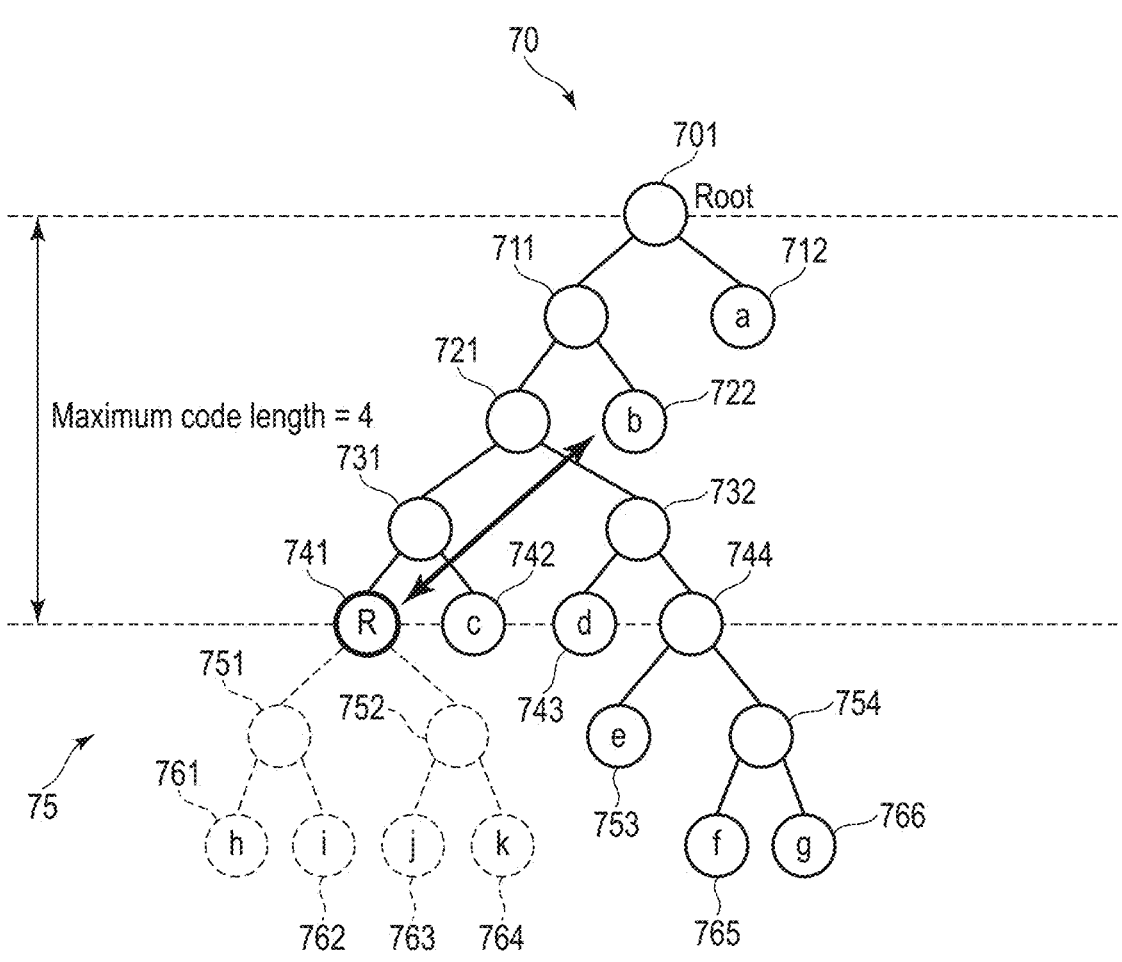
F I G. 20

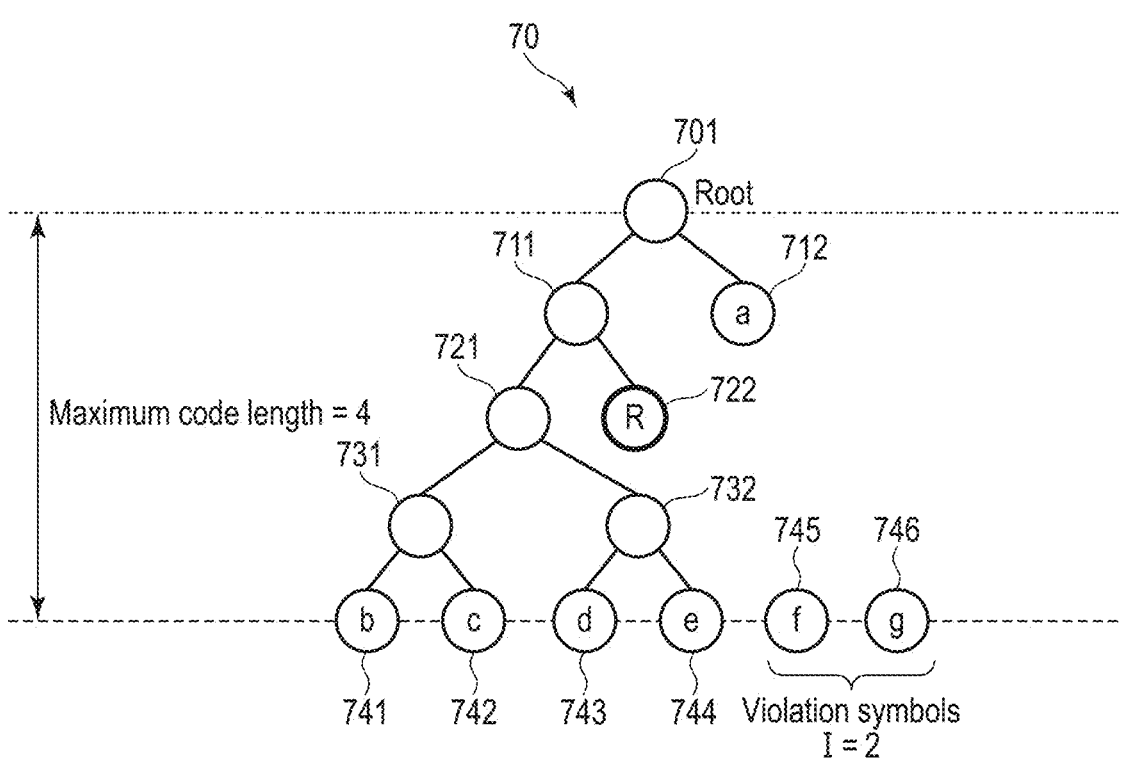
F I G. 21

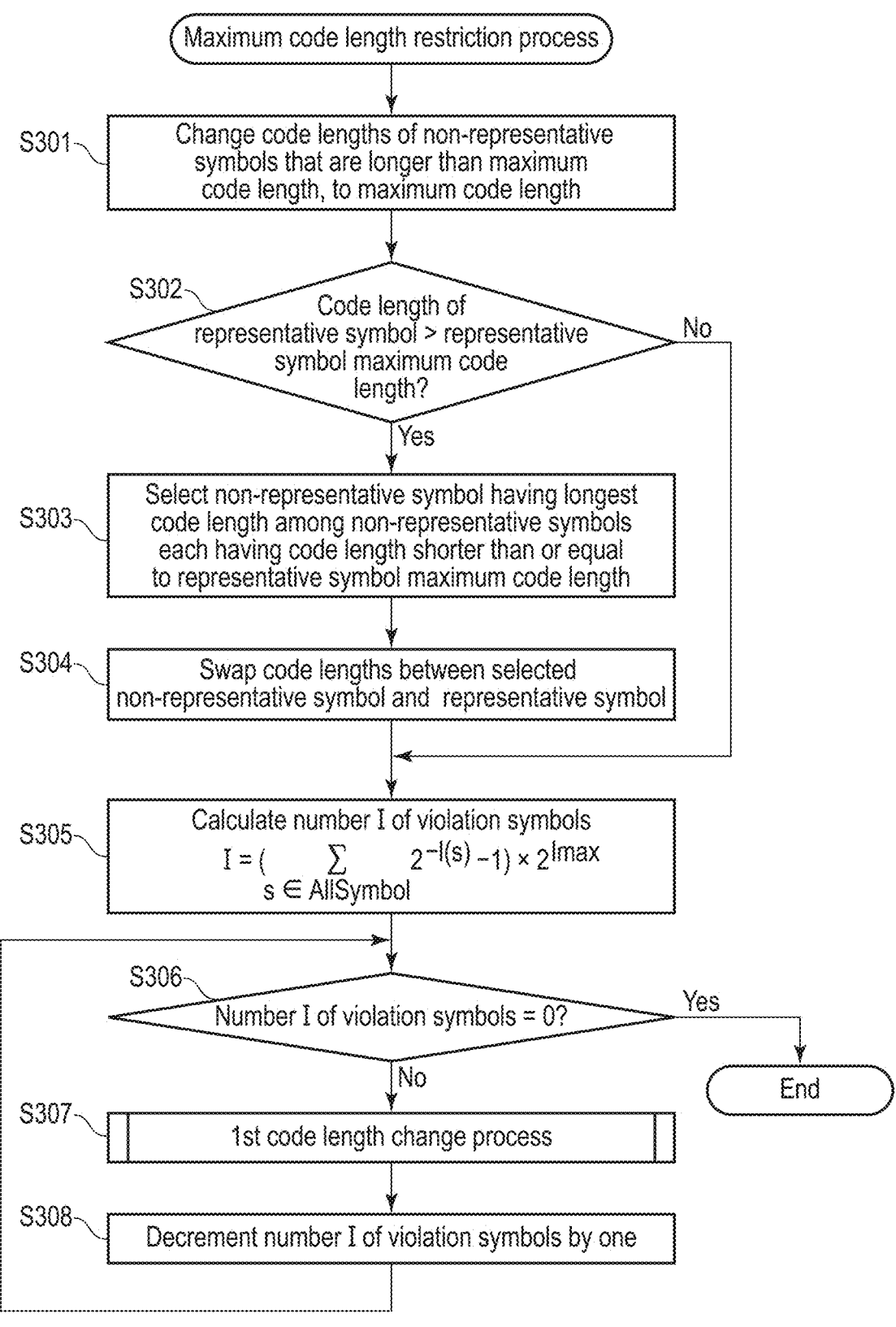
F I G. 24

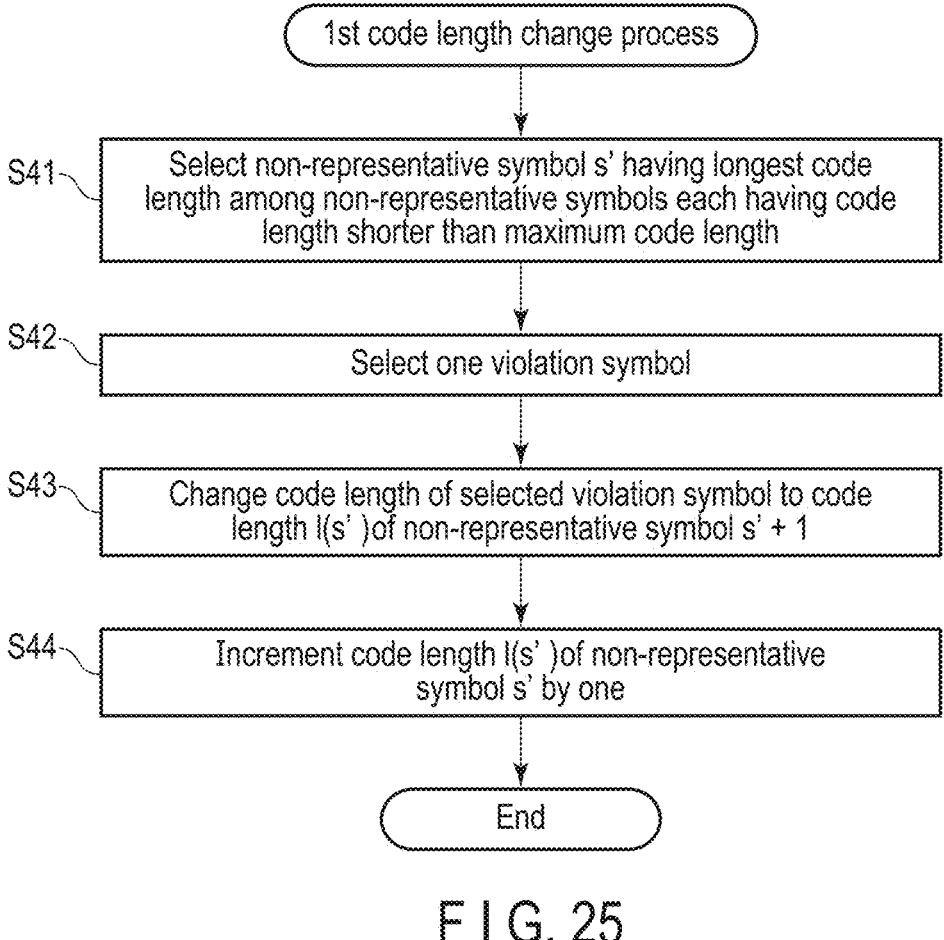
F I G. 25
```
code:= 0
while more symbols do//assign in ascending code length order and in predetermined
symbol order in case of same code length
    Code bit string of symbol = code
    code:=(code+1) << ((bit length of the next symbol) - (current bit length))
```
F I G. 26

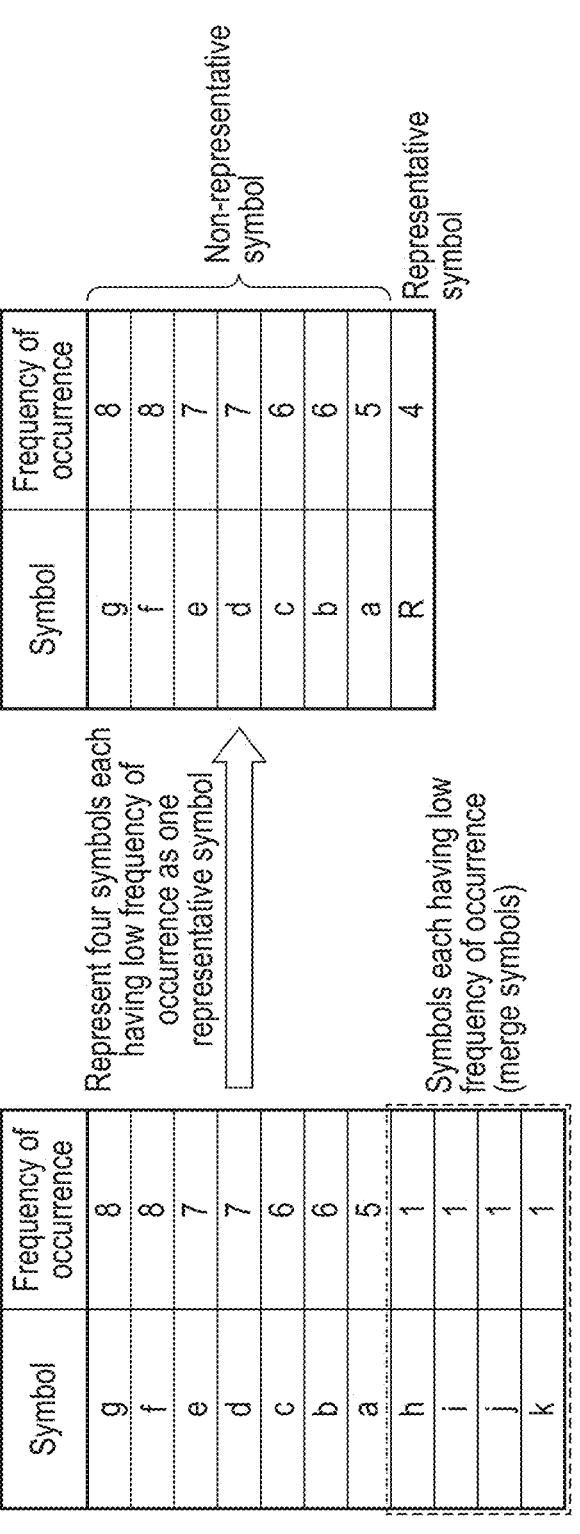
F I G. 27

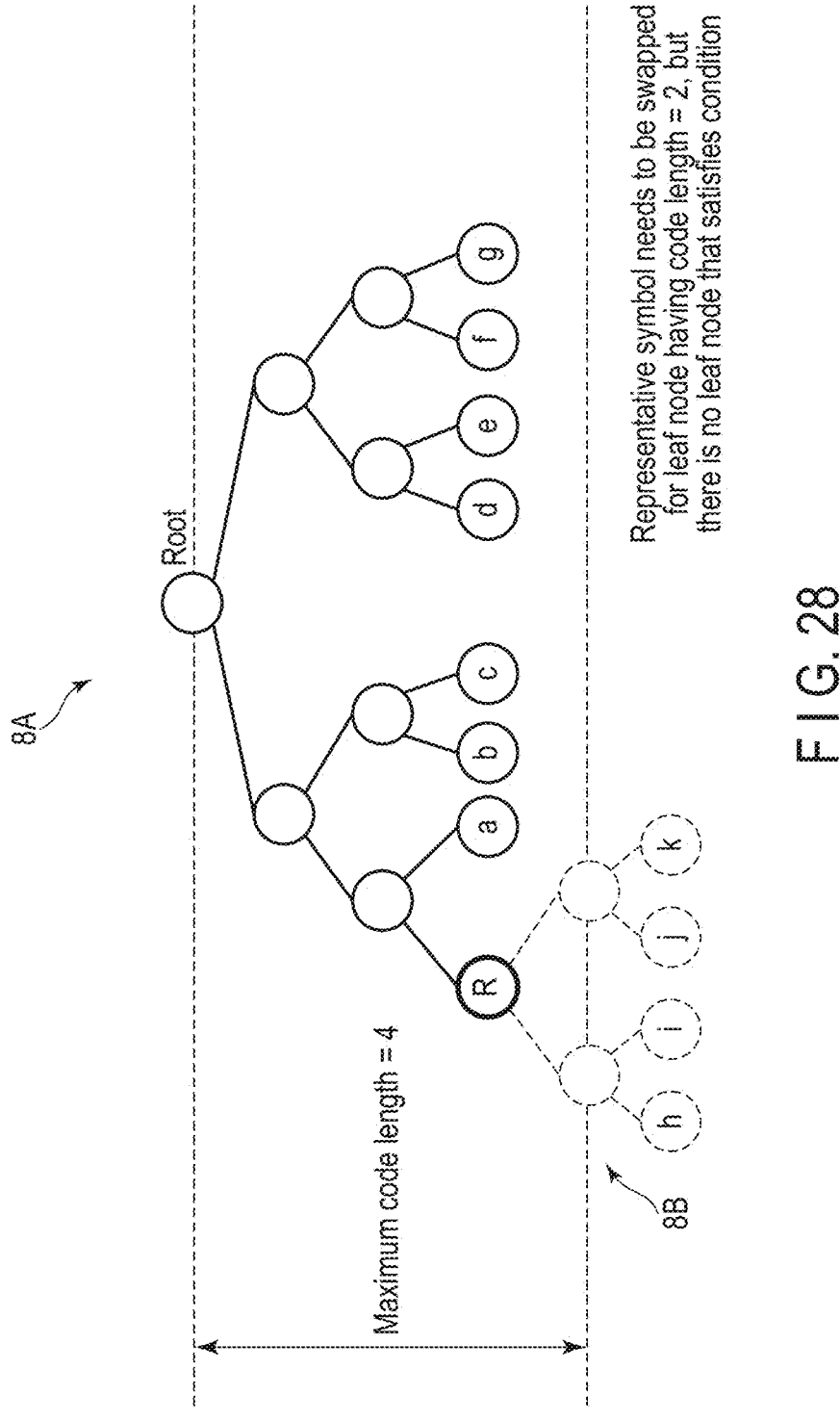
F I G. 28

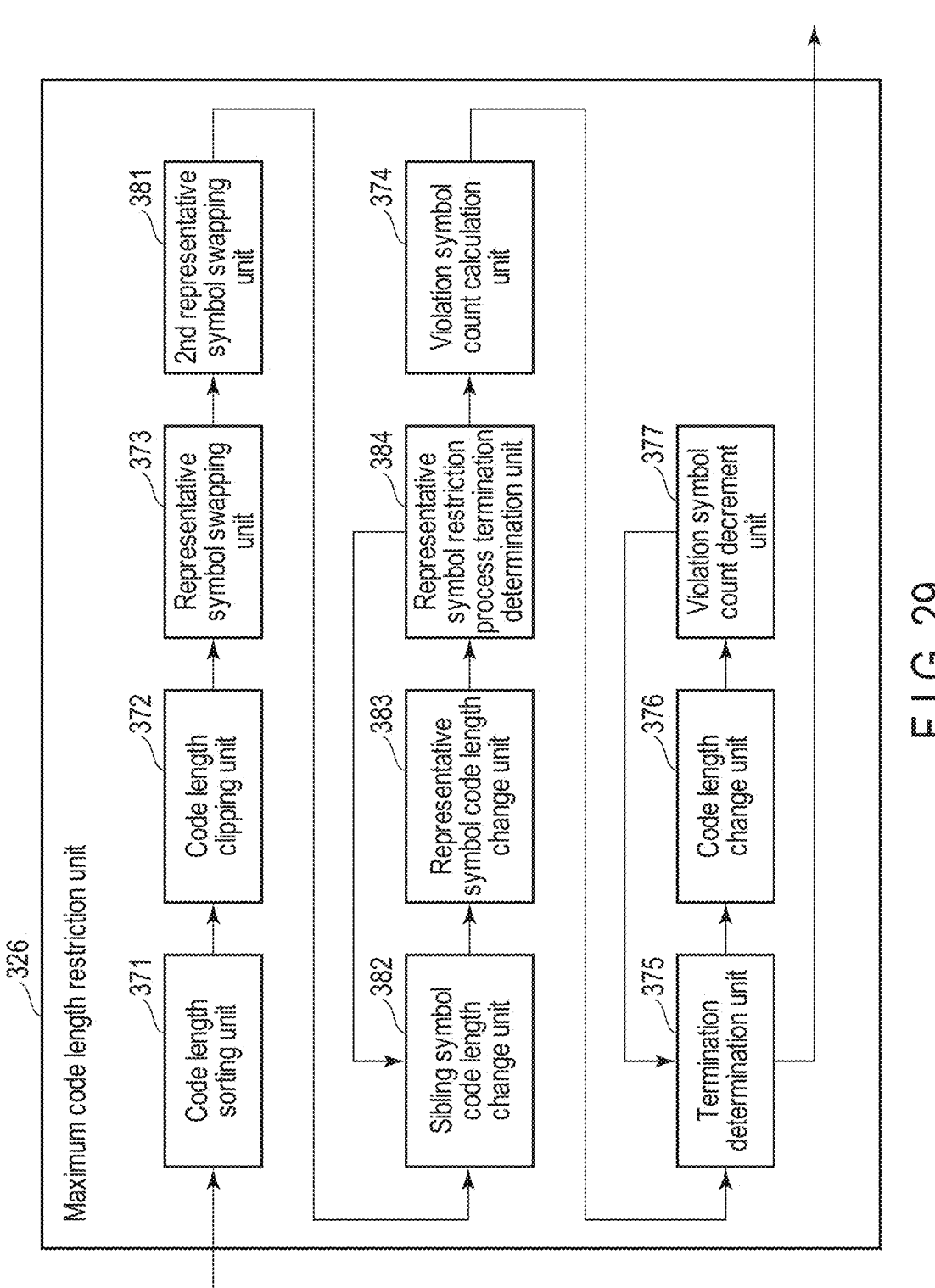
F I G. 29

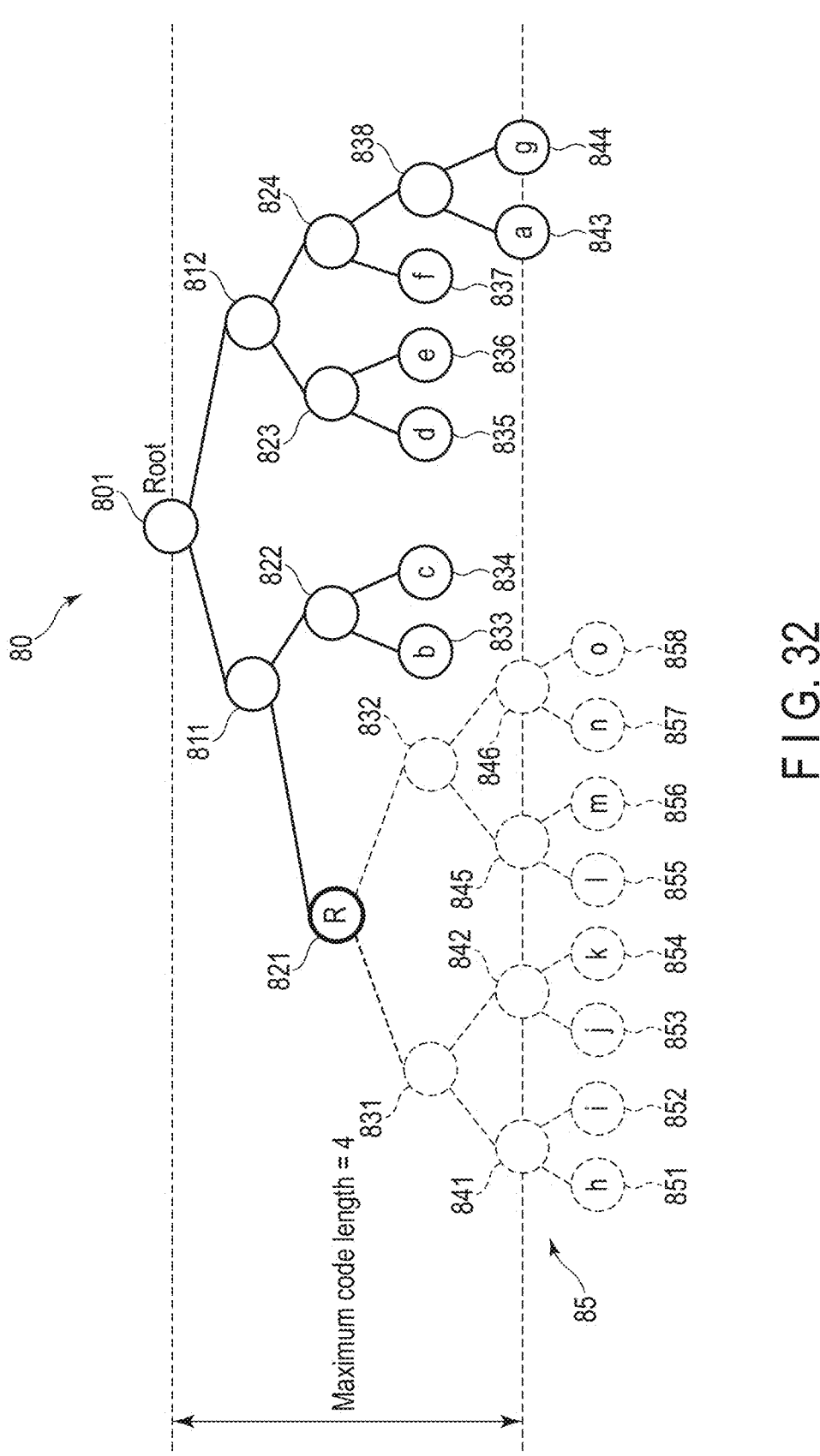
F I G. 32

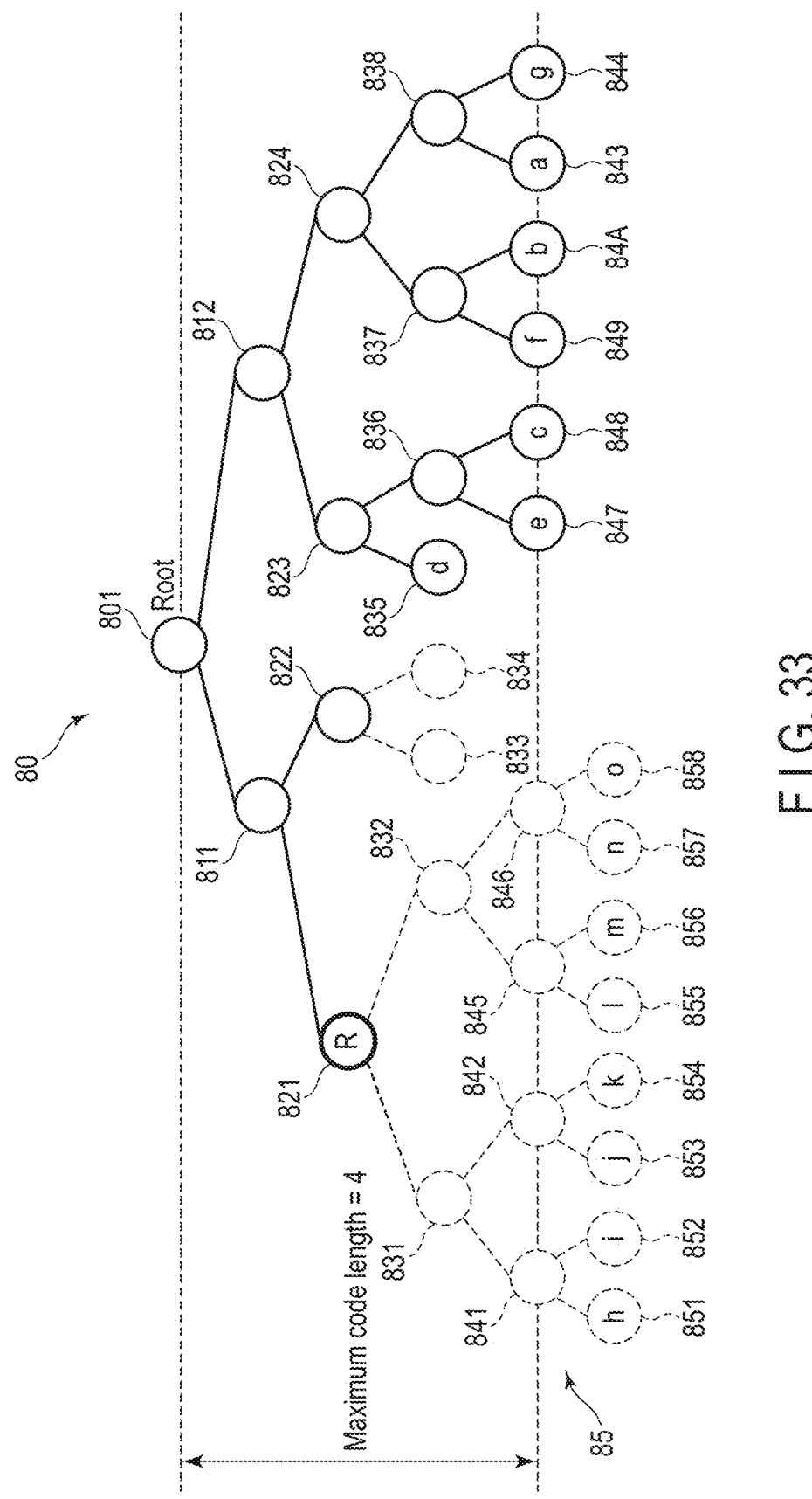
F I G. 33

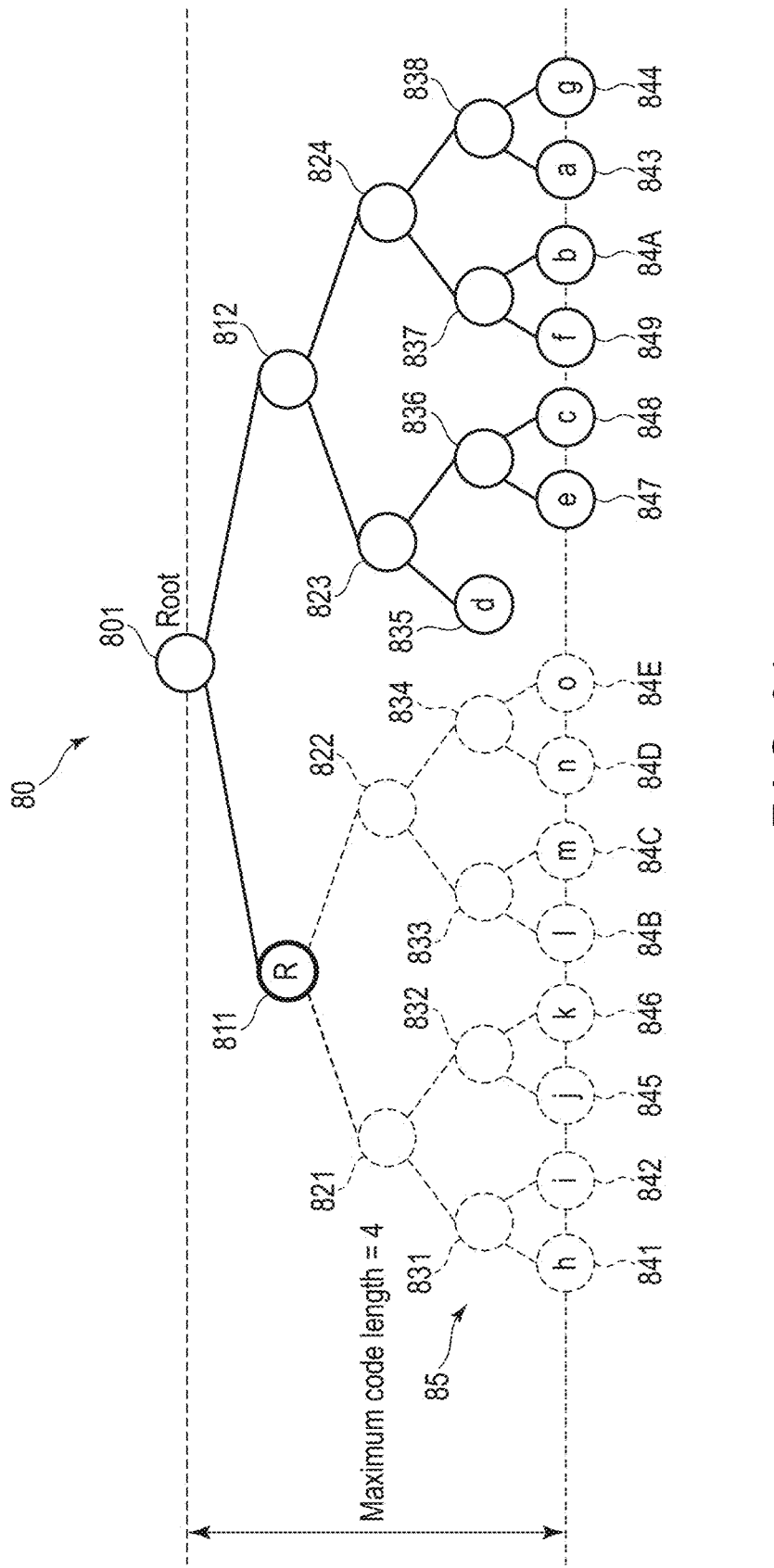
F I G. 34

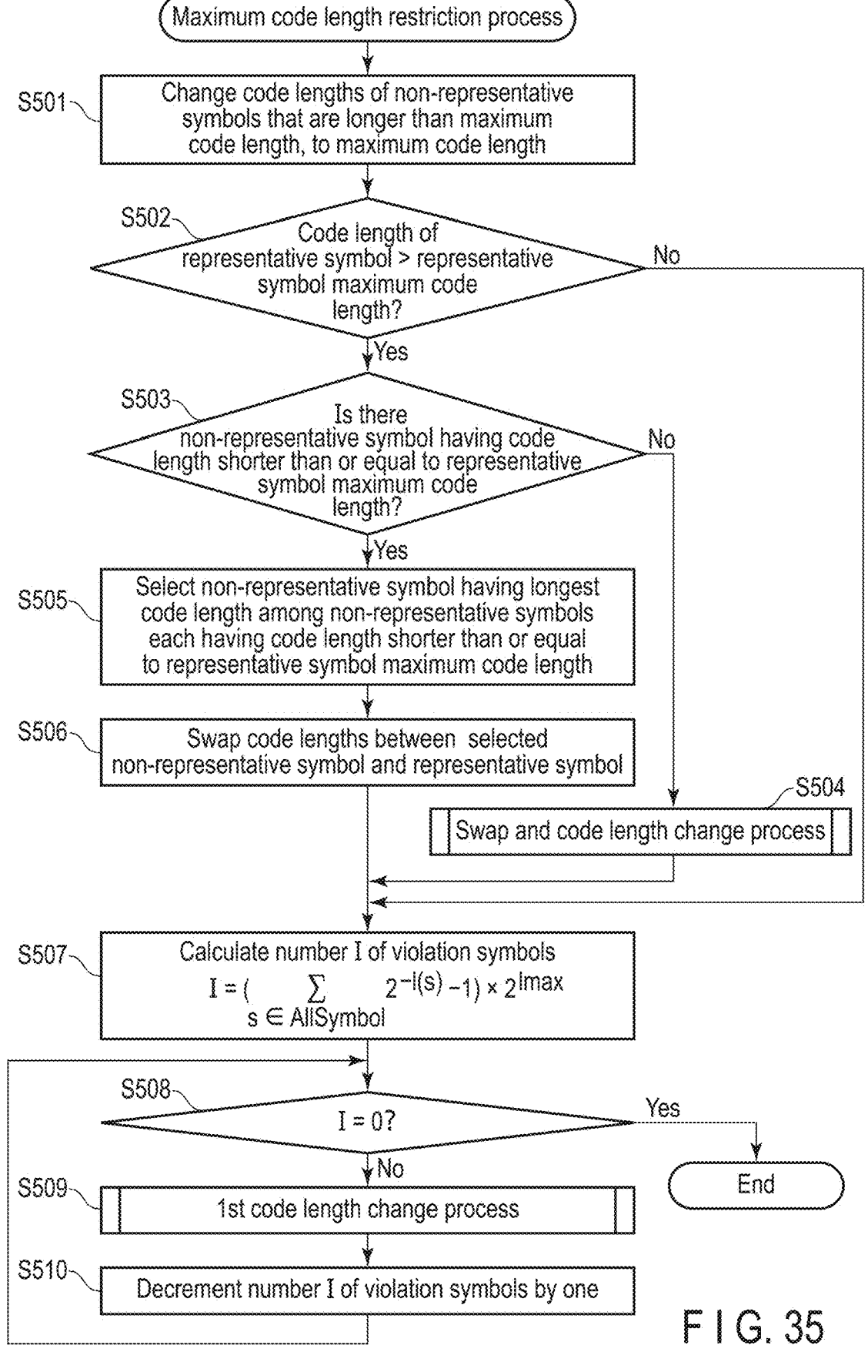
F I G. 35

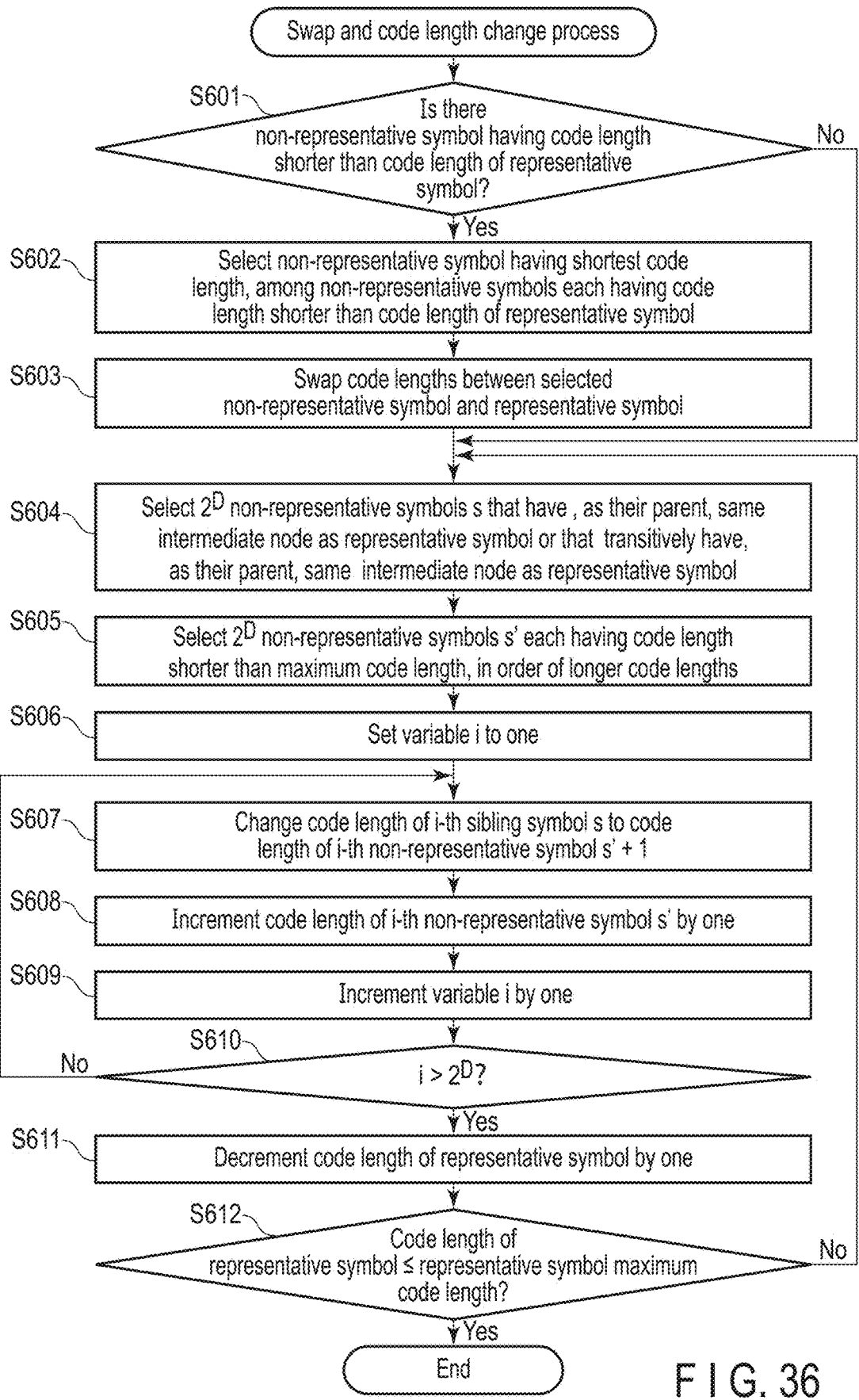
F I G. 36

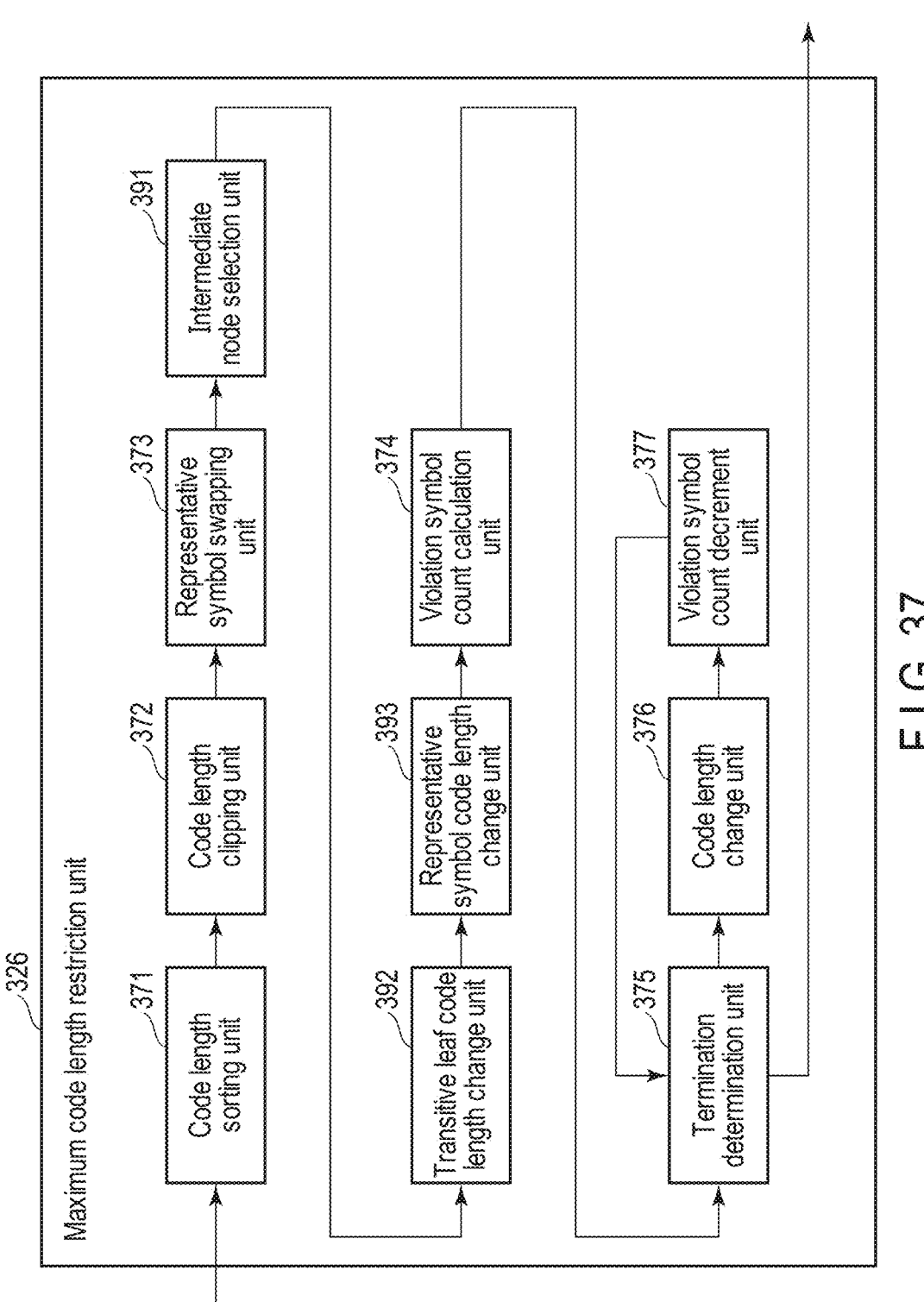
F I G. 37

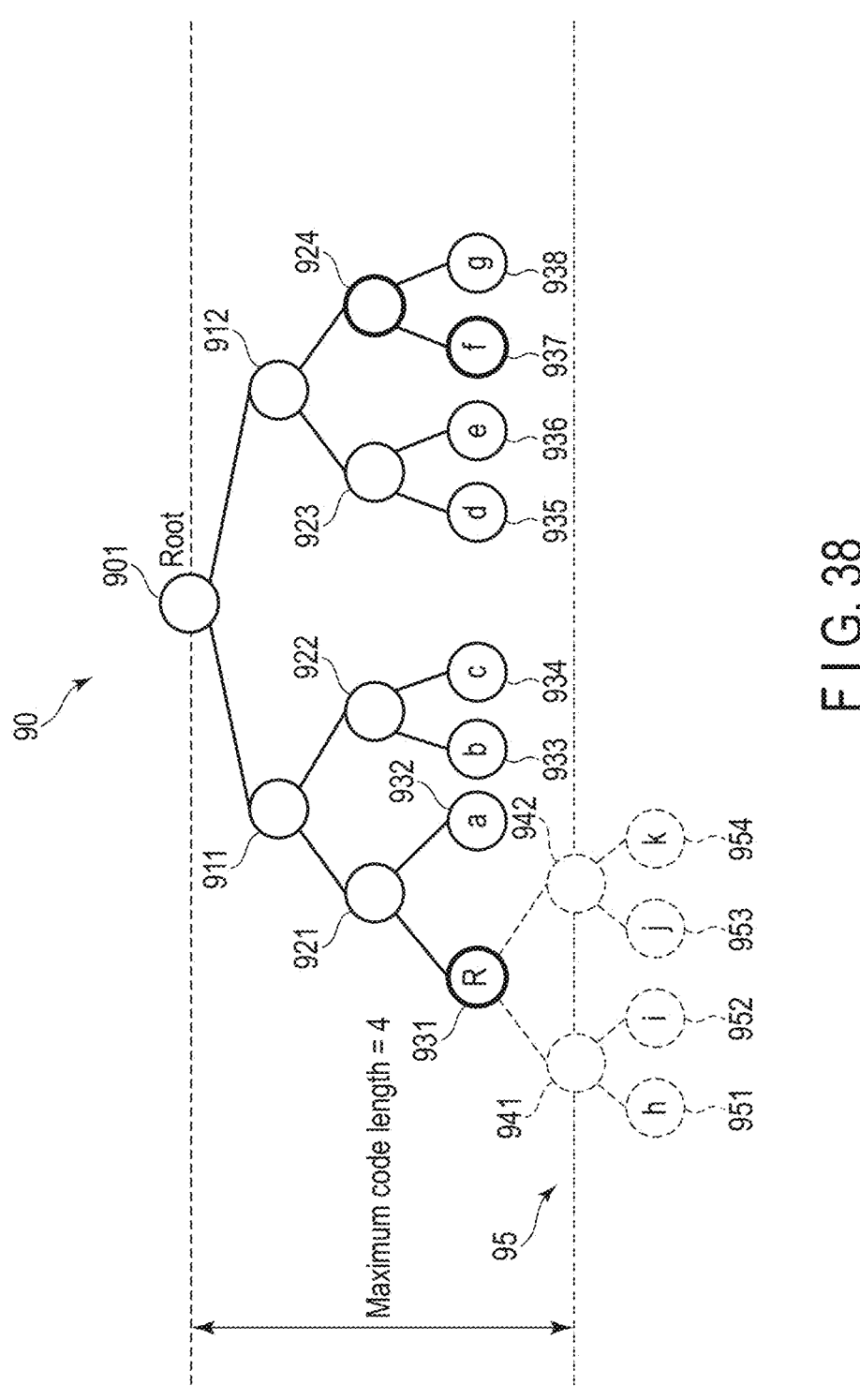
F I G. 38

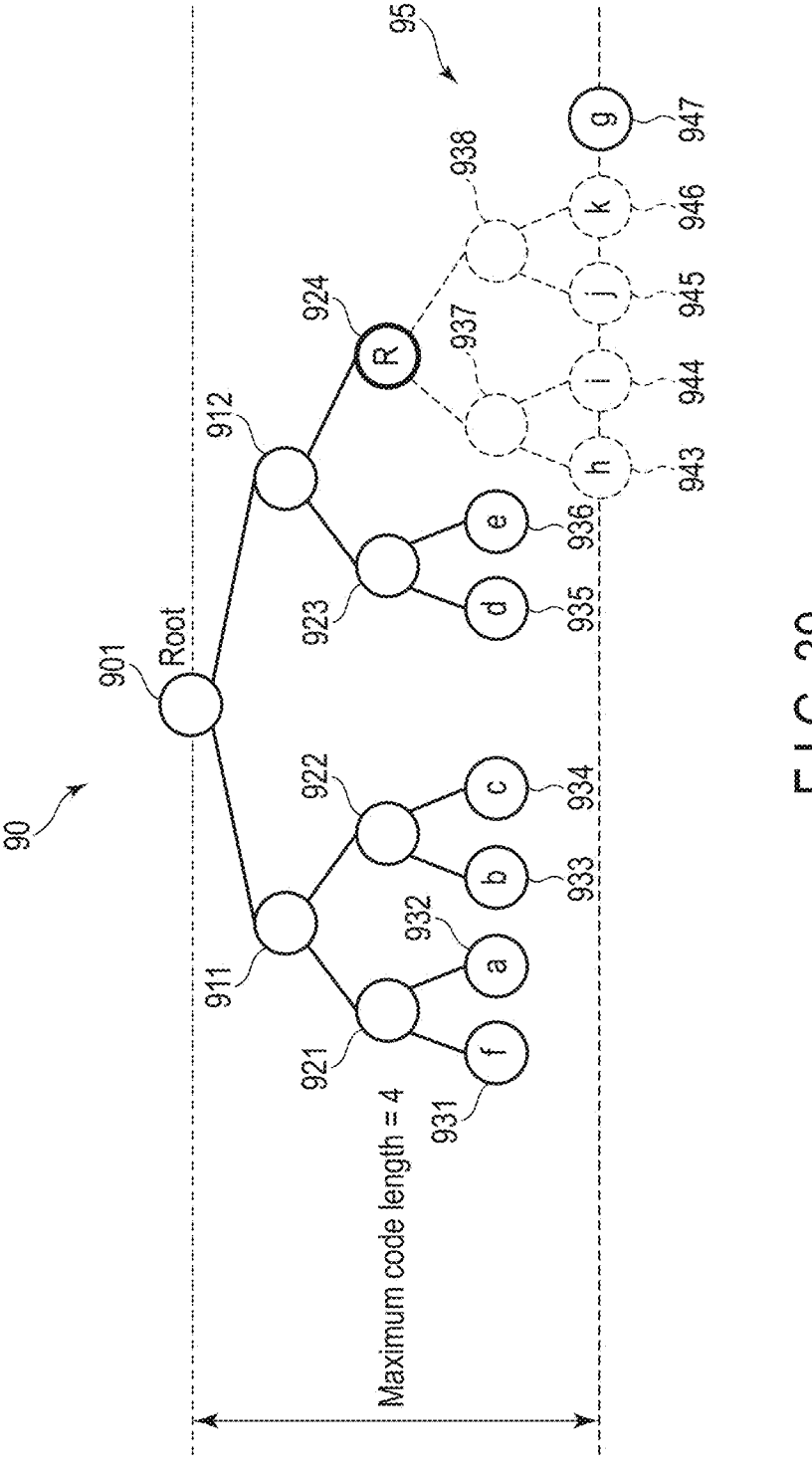
F I G. 39

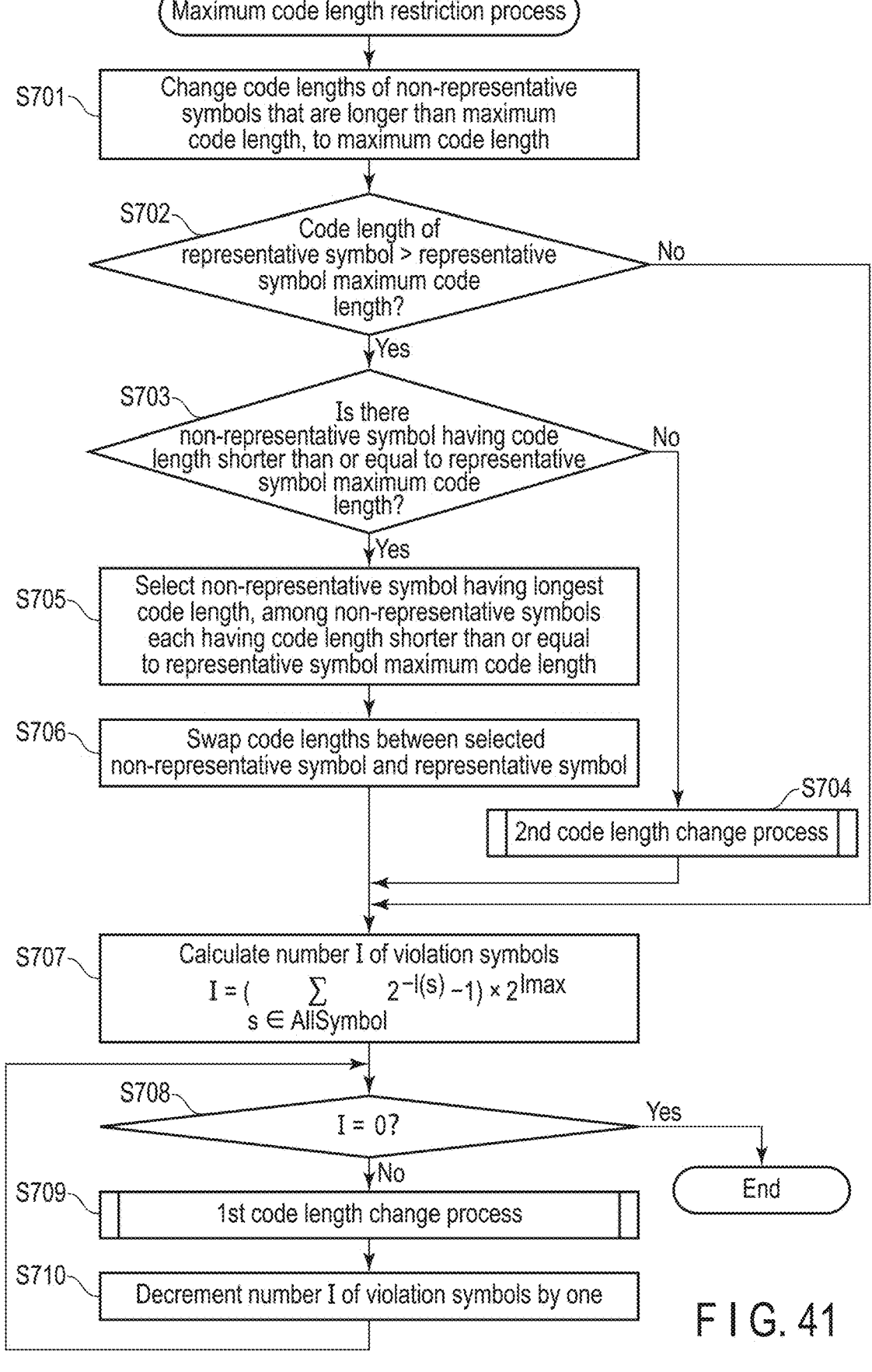
F I G. 41

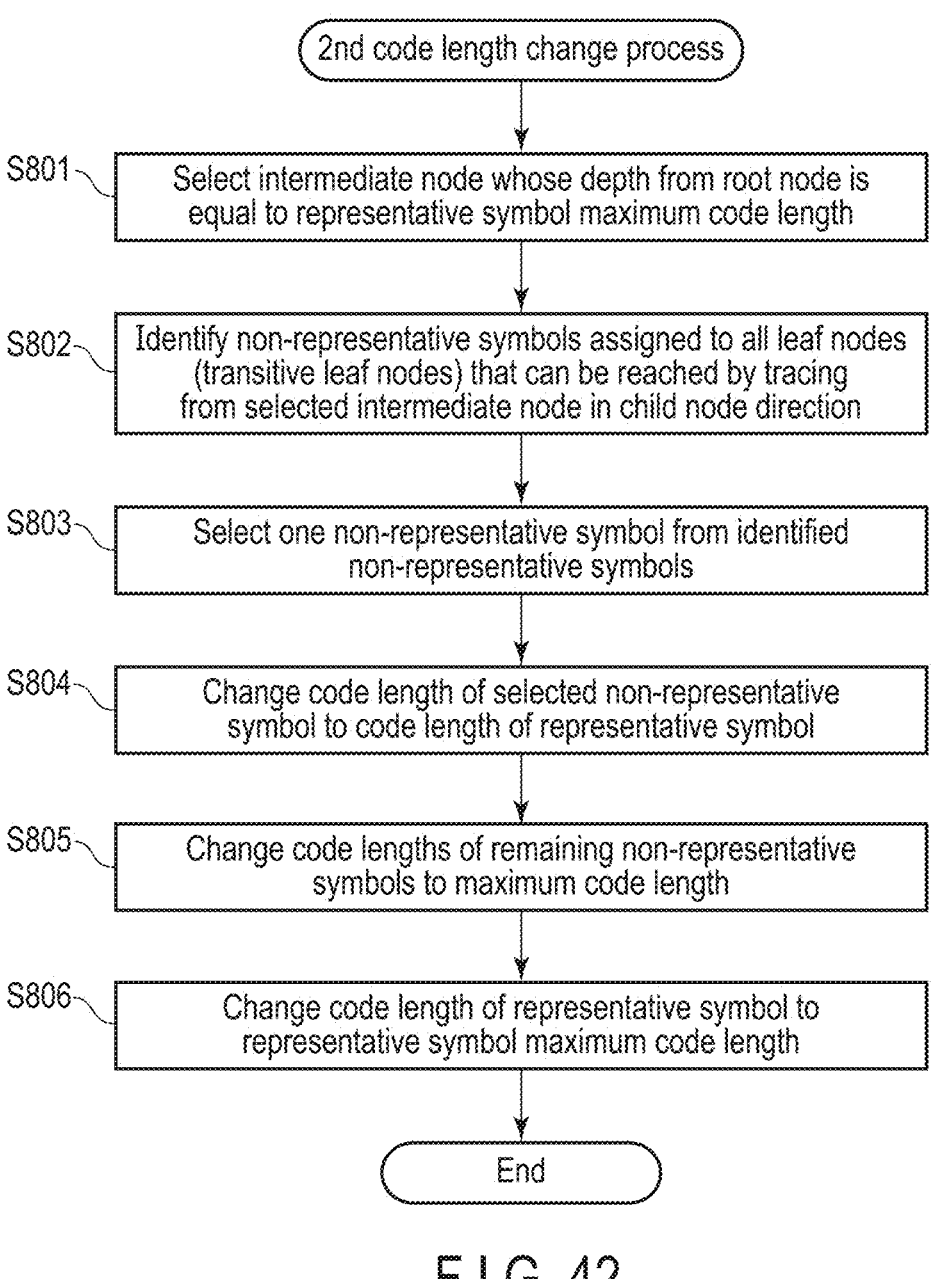
F I G. 42

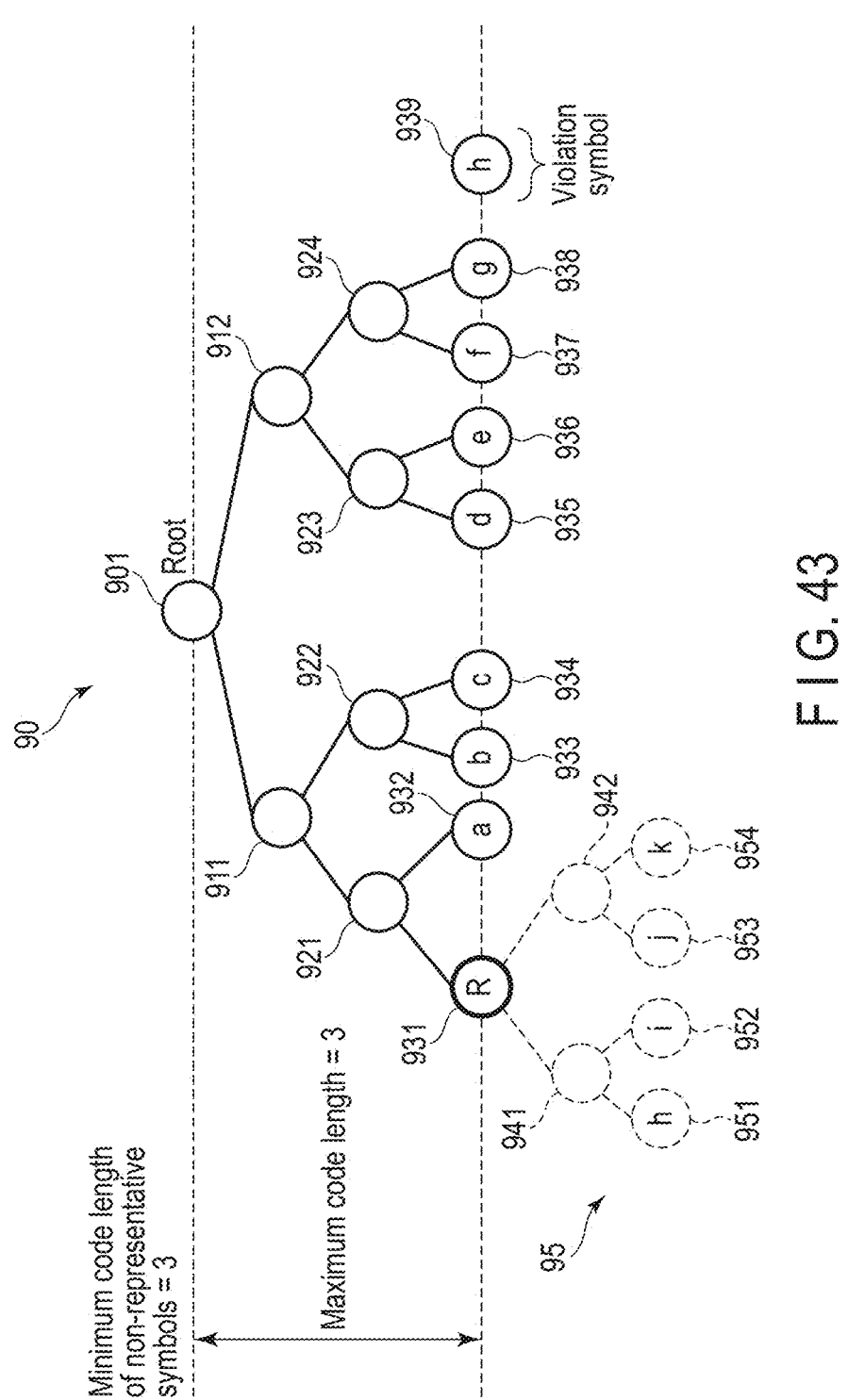
F I G. 43

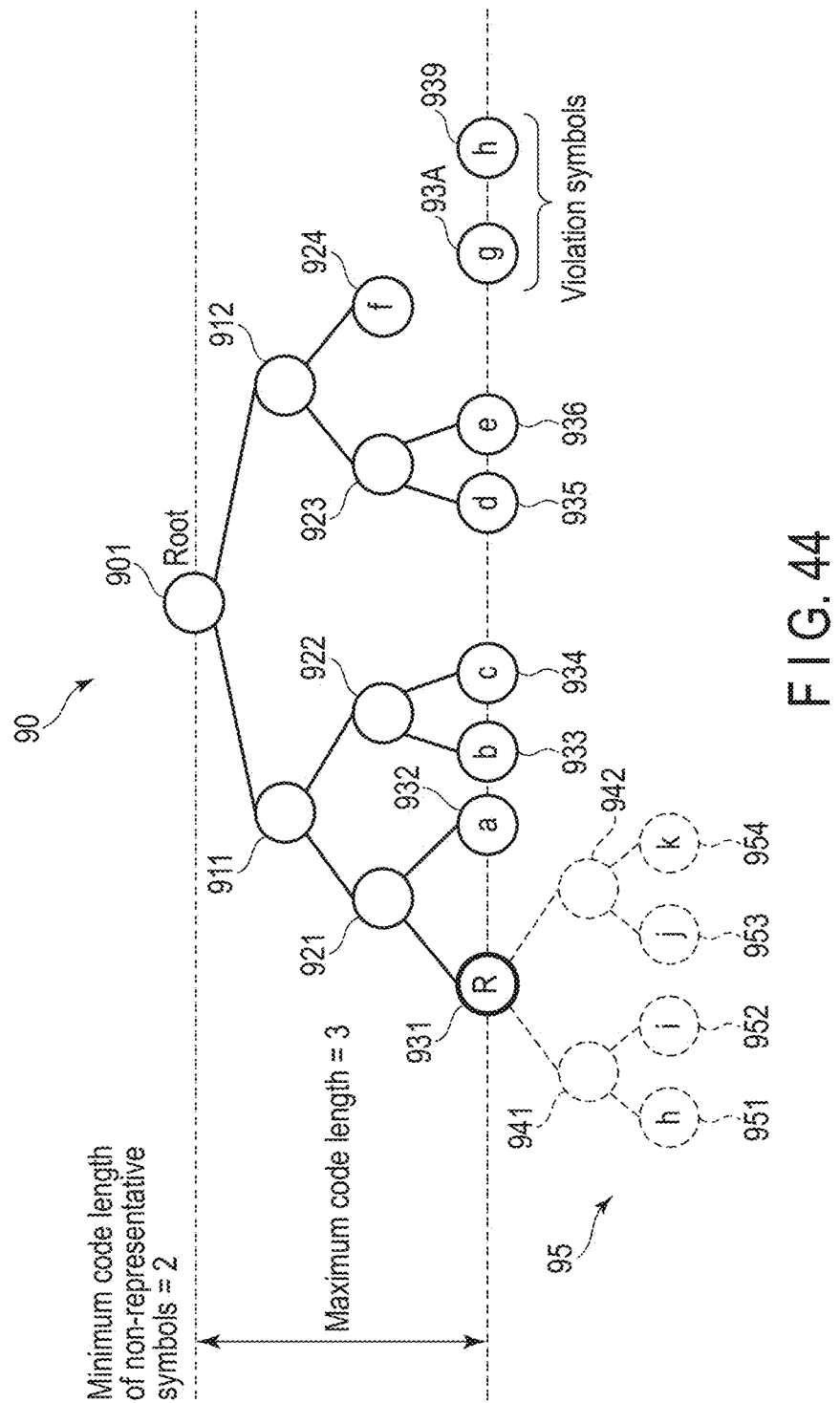
F I G. 44

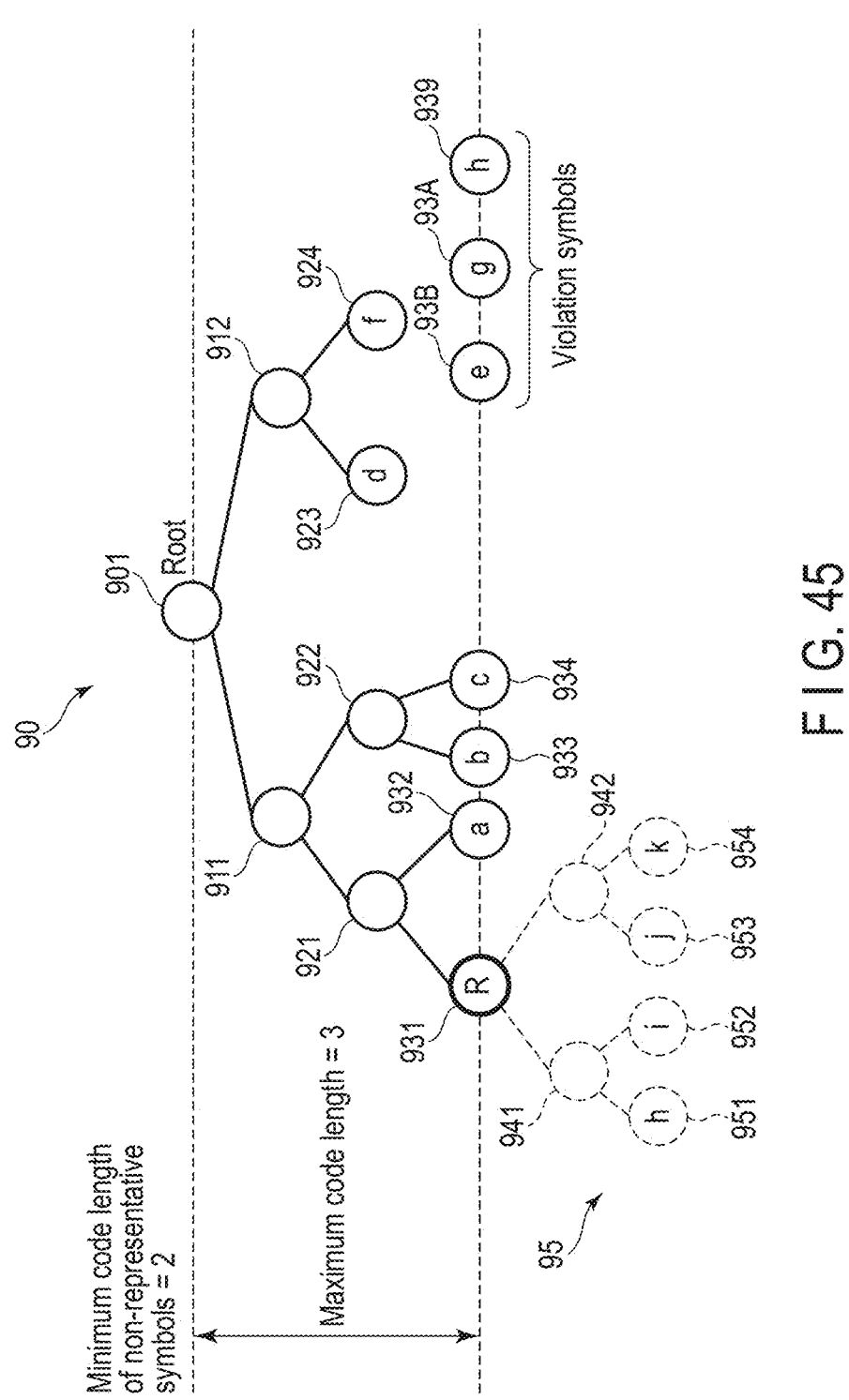
F I G. 45

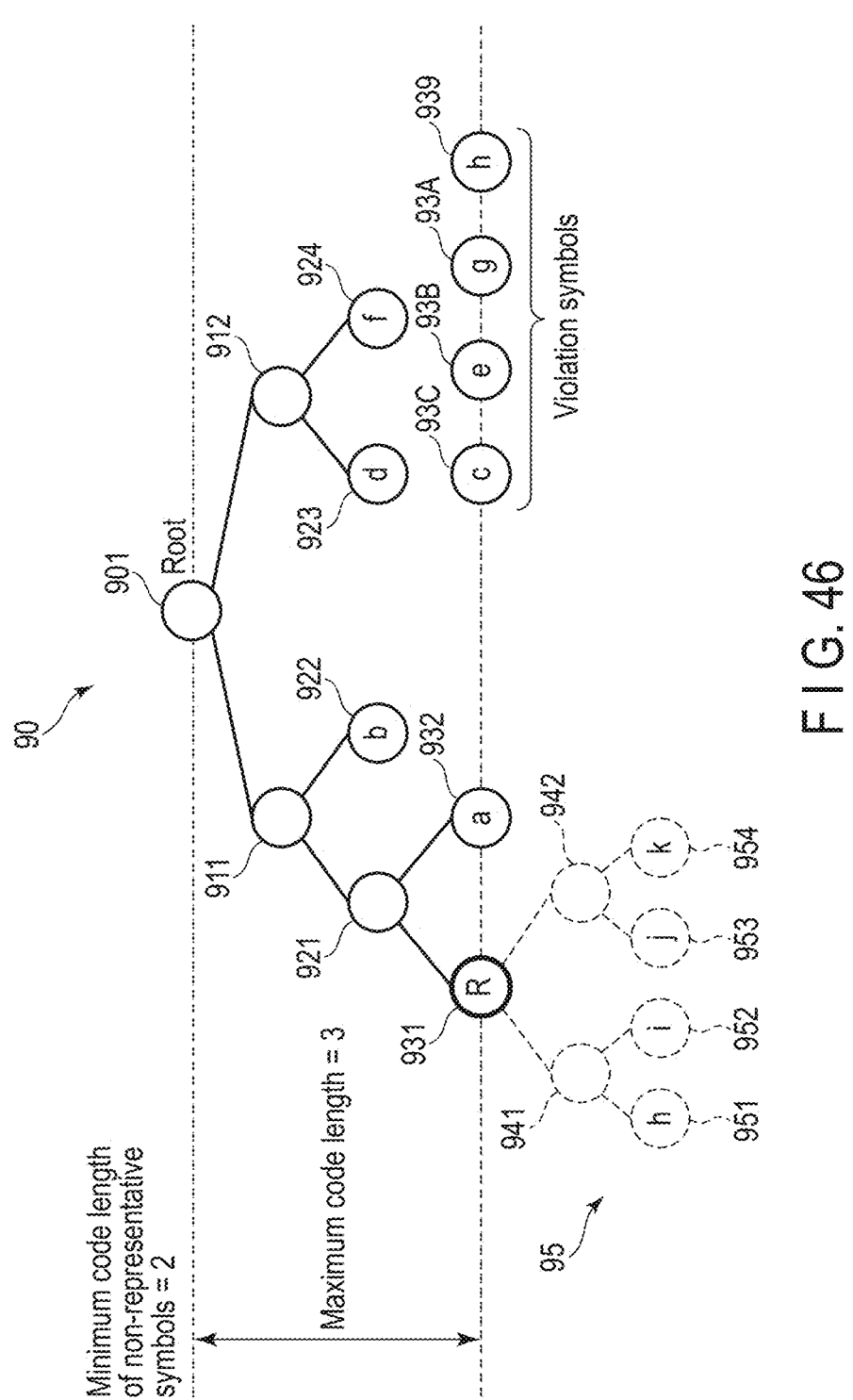
F I G. 46

VARIABLE LENGTH CODING DEVICE AND MEMORY SYSTEM

CROSS-REFERENCE TO RELATED APPLICATIONS

This application is based upon and claims the benefit of priority from Japanese Patent Application No. 2023-142321, filed Sep. 1, 2023, the entire contents of which are incorporated herein by reference.

FIELD

Embodiments described herein relate generally to a variable length coding device and a memory system.

BACKGROUND

Dynamic Huffman coding is a variable length coding for dynamically generating a code table based on a frequency of occurrence of each of symbols to be encoded. The code table indicates correspondence between a symbol and a code word that is assigned to the symbol. In the dynamic Huffman coding, a short code word is assigned to a symbol that occurs at a high frequency, and a long code word is assigned to a symbol that occurs at a low frequency. A code word (variable length code) assigned to a symbol is also referred to as a Huffman code.

In some data compression standards or data compression software (for example, gzip), it may be specified that the length of a code word (code length) assigned to each symbol is restricted not to exceed an upper limit. In such cases, it is necessary to generate a code table such that the length of a code word assigned to each symbol is shorter than or equal to the upper limit at the stage of generating the code table by using a frequency of occurrence of each symbol.

Furthermore, in the data compression standards or data compression software, it may be specified that code words that are assigned to symbols, respectively, in dynamic Huffman coding are perfect codes. The fact that code words that are assigned to symbols, respectively, in dynamic Huffman coding are perfect codes corresponds to the fact that the dynamic Huffman coding is based on a Huffman tree in which every intermediate node has two child nodes. In other words, the fact that code words that are assigned to symbols, respectively, in dynamic Huffman coding are perfect codes means that there is no waste in the code lengths of the assigned code words.

BRIEF DESCRIPTION OF THE DRAWINGS

FIG. 1 is a block diagram showing an example of a configuration of an information processing system that includes a variable length coding device according to a first embodiment.

FIG. 2 is a block diagram showing an example of a configuration of a code table generation unit according to a comparative example.

FIG. 6 is a diagram showing an example of code lengths determined in the code table generation unit according to the comparative example.

FIG. 8 is a diagram showing a modified example of the Huffman tree of FIG. 5, in the code table generation unit according to the comparative example.

FIG. 9 is a diagram showing a modified example of the Huffman tree of FIG. 8, in the code table generation unit according to the comparative example.

FIG. 10 is a diagram showing a modified example of the Huffman tree of FIG. 9, in the code table generation unit according to the comparative example.

FIG. 11 is a diagram showing a modified example of the Huffman tree of FIG. 10, in the code table generation unit according to the comparative example.

FIG. 12 is a block diagram showing an example of a configuration of the variable length coding device according to the first embodiment.

FIG. 13 is a diagram showing an example of a frequency table (zeroth frequency table) generated in the variable length coding device according to the first embodiment.

FIG. 14 is a diagram showing an example of a frequency table (first frequency table) sorted in the variable length coding device according to the first embodiment.

FIG. 15 is a diagram showing (A) an example of a first frequency table, and (B) an example of a first part table and (C) an example of a second part table into which the first frequency table is divided, that are used in the variable length coding device according to the first embodiment.

FIG. 17 is a diagram showing an example of a subtree of merge symbols used in the variable length coding device according to the first embodiment.

FIG. 20 is a diagram showing an example of a Huffman tree generated in the variable length coding device according to the first embodiment.

FIG. 21 is a diagram showing a modified example of the Huffman tree of FIG. 20 in the variable length coding device according to the first embodiment.

FIG. 24 is a flowchart showing an example of the procedure of a maximum code length restriction process executed in the variable length coding device according to the first embodiment.

FIG. 25 is a flowchart showing an example of the procedure of a first code length change process executed in the variable length coding device according to the first embodiment.

FIG. 26 is a diagram showing an example of a pseudo-program for assigning a code bit string to a symbol that is executed in the variable length coding device according to the first embodiment.

FIG. 27 is a diagram showing an example of non-representative symbols and a representative symbol that are used in the variable length coding device according to a second embodiment.

FIG. 28 is a diagram showing an example of a Huffman tree generated in a variable length coding device according to the second embodiment.

FIG. 29 is a block diagram showing an example of a configuration of a maximum code length restriction unit that is included in the variable length coding device according to the second embodiment.

Figure 30:
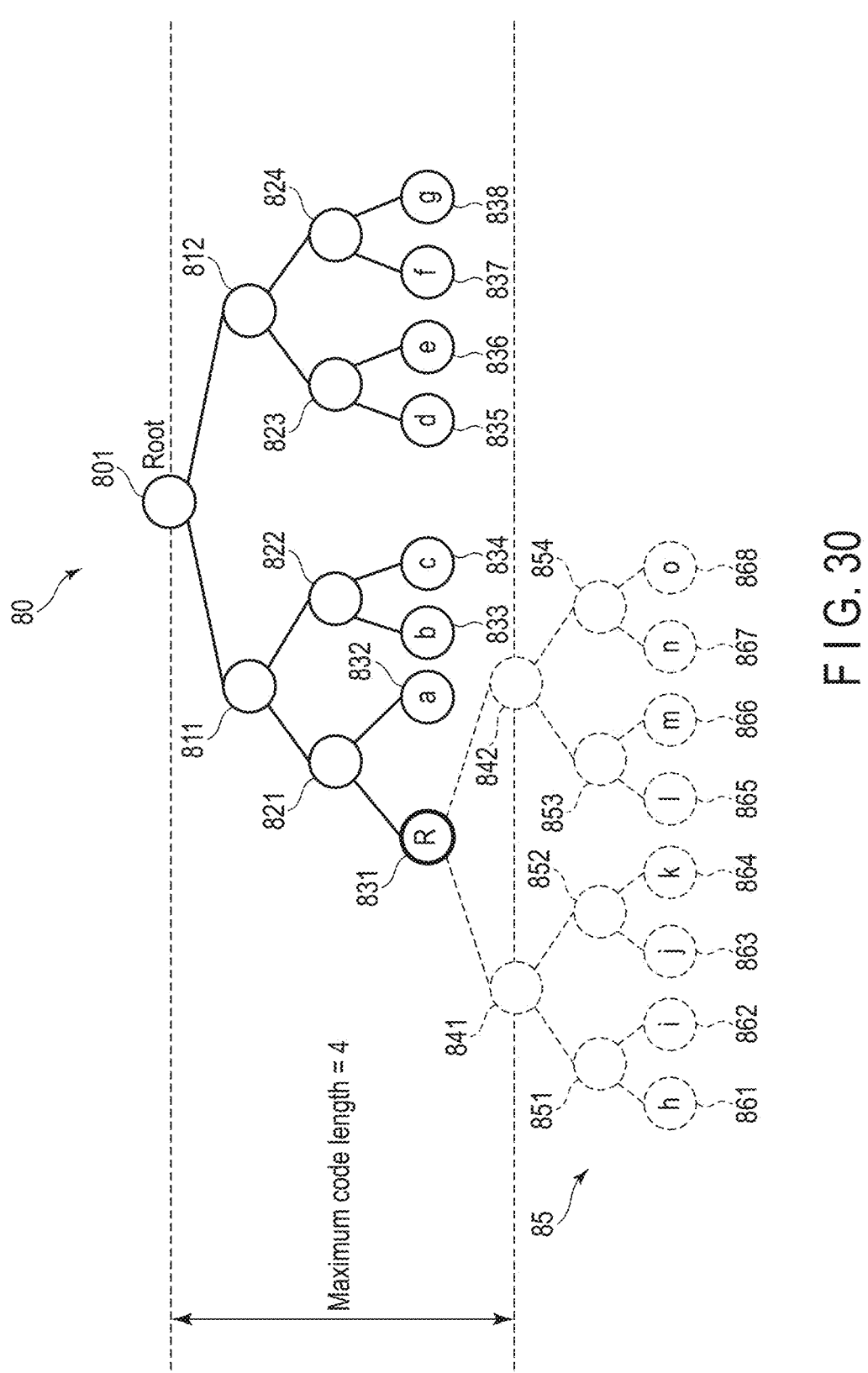

FIG. 30 is a diagram showing another example of the Huffman tree generated in the variable length coding device according to the second embodiment.

Figure 31:
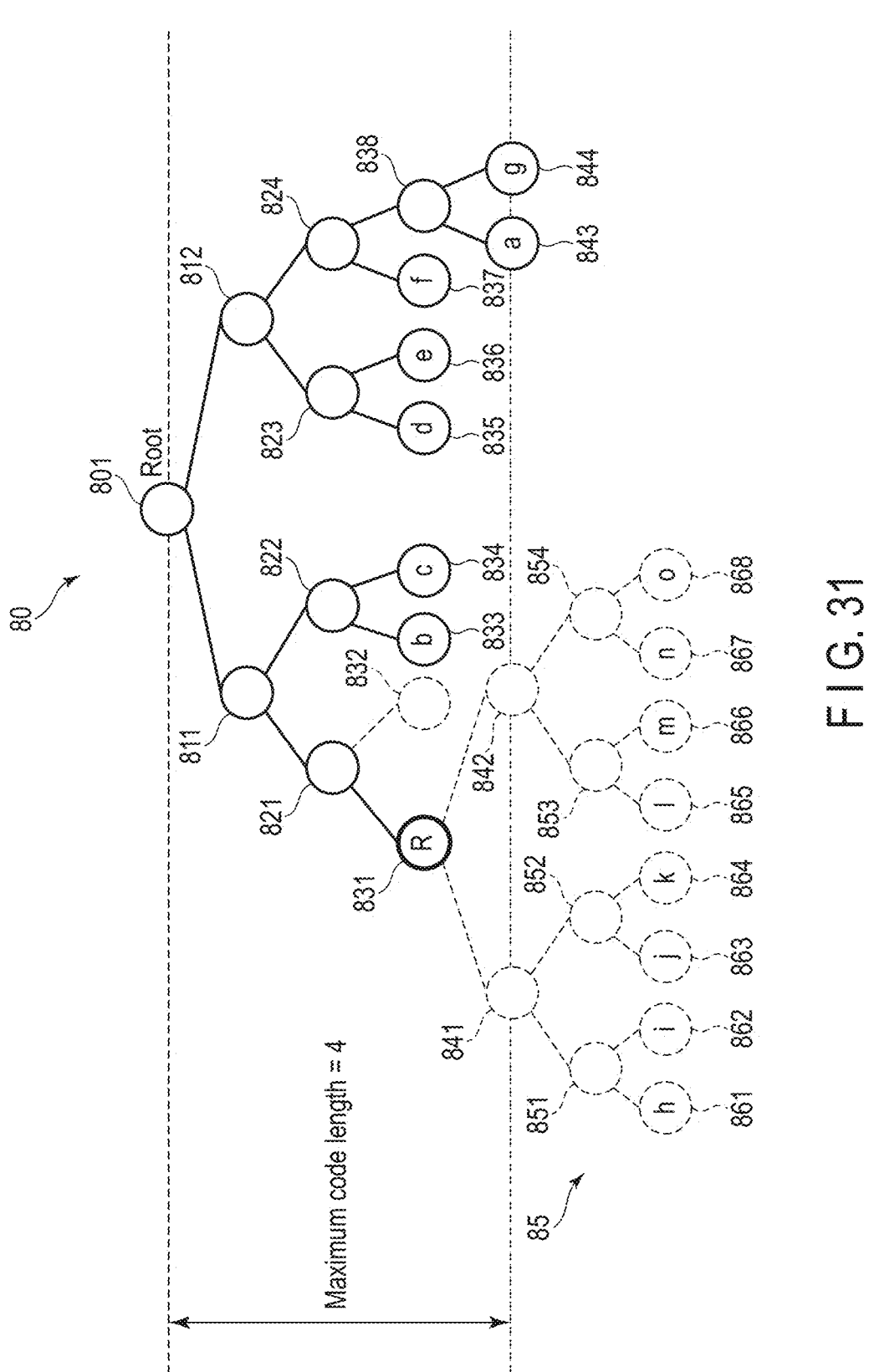

FIG. 31 is a diagram showing a modified example of the Huffman tree of FIG. 30 in the variable length coding device according to the second embodiment.

FIG. 32 is a diagram showing a modified example of the Huffman tree of FIG. 31 in the variable length coding device according to the second embodiment.

FIG. 33 is a diagram showing a modified example of the Huffman tree of FIG. 32 in the variable length coding device according to the second embodiment.

FIG. 34 is a diagram showing a modified example of the Huffman tree of FIG. 33 in the variable length coding device according to the second embodiment.

FIG. 35 is a flowchart showing an example of the procedure of a maximum code length restriction process executed in the variable length coding device according to the second embodiment.

FIG. 36 is a flowchart showing an example of the procedure of a swap and code length change process executed in the variable length coding device according to the second embodiment.

FIG. 37 is a block diagram showing an example of a configuration of a maximum code length restriction unit that is included in the variable length coding device according to a third embodiment.

FIG. 38 is a diagram showing an example of a Huffman tree generated in a variable length coding device according to the third embodiment.

FIG. 39 is a diagram showing a modified example of the Huffman tree of FIG. 38 in the variable length coding device according to the third embodiment.

Figure 40:
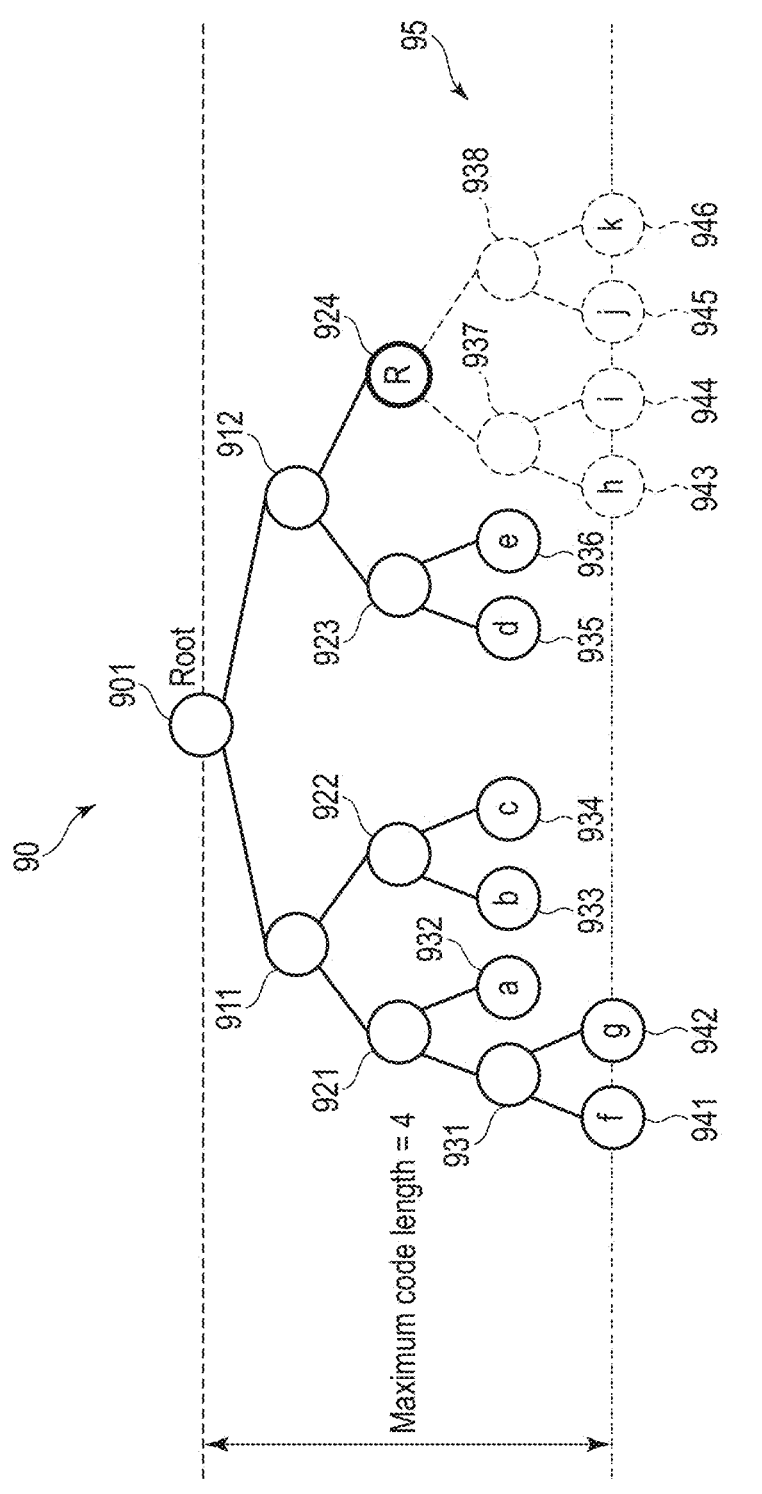

FIG. 40 is a diagram showing a modified example of the Huffman tree of FIG. 39 in the variable length coding device according to the third embodiment.

FIG. 41 is a flowchart showing an example of the procedure of a maximum code length restriction process executed in the variable length coding device according to the third embodiment.

FIG. 42 is a flowchart showing an example of the procedure of a second code length change process executed in the variable length coding device according to the third embodiment.

FIG. 43 is a diagram showing a first pattern of a Huffman tree assumed in a specific case in the variable length coding device according to the third embodiment.

FIG. 44 is a diagram showing a second pattern of the Huffman tree assumed in the specific case in the variable length coding device according to the third embodiment.

FIG. 45 is a diagram showing a third pattern of the Huffman tree assumed in the specific case in the variable length coding device according to the third embodiment.

FIG. 46 is a diagram showing a fourth pattern of the Huffman tree assumed in the specific case in the variable length coding device according to the third embodiment.

DETAILED DESCRIPTION

In general, according to one embodiment, a variable length coding device includes coding circuitry. The coding circuitry generates a frequency table based on frequencies of occurrence of input symbols for each symbol. The frequency table includes N symbols, and N frequencies of occurrence that are associated with the N symbols, respectively. The coding circuitry generates a Huffman tree based on the frequency table. The coding circuitry determines N code lengths that corresponds to the N symbols, respectively, based on the Huffman tree. In a case where the N code lengths include a first code length that is longer than a maximum code length, the coding circuitry selects a first symbol corresponding to the first code length from the N symbols, selects, from the N symbols, a second symbol corresponding to a second code length that is shorter than the maximum code length, changes the second code length corresponding to the second symbol to a code length that is obtained by adding one to the second code length, and changes the first code length corresponding to the first symbol to a code length that is equal to the changed second code length. The coding circuitry determines N variable length codes that are assigned to the N symbols, respectively, based on the N code lengths. The coding circuitry converts each of the input symbols into a variable length code, based on the N variable length codes that are assigned to the N symbols, respectively. N is an integer of two or more. The variable length code into which each of the input symbols is converted has a bit length between one bit length and the maximum code length inclusive.

Various embodiments will be described hereinafter with reference to the accompanying drawings.

First Embodiment

FIG. 1 shows an example of a configuration of an information processing system that includes a code table generation device according to a first embodiment. The information processing system 1 includes a host device 2 (hereinafter referred to as a host 2) and a memory system 3.

The memory system 3 is a semiconductor storage device configured to write data into a nonvolatile memory such as a NAND flash memory 5 and read data from the nonvolatile memory. The memory system 3 is implemented as, for example, a solid state drive (SSD) that includes the NAND flash memory 5. Hereinafter, an example in which the memory system 3 is implemented as an SSD will be explained, but the memory system 3 may be implemented as a hard disk drive (HDD).

The host 2 may be a storage server that stores a large amount of various data in the memory system 3 or may be a personal computer.

The memory system 3 may be used as a storage for the host 2. The memory system 3 may be provided inside the host 2 or may be connected to the host 2 via a cable or a network.

An interface for connecting the host 2 to the memory system 3 conforms to standards such as SCSI, Serial Attached SCSI (SAS), AT Attachment (ATA), Serial ATA (SATA), PCI Express™ (PCIe™), Ethernet™, Fibre channel, or NVM Express™ (NVMe™).

The memory system 3 includes a controller 4 and a NAND flash memory 5. The controller 4 may be implemented with circuitry such as a system-on-a-chip (SoC).

The memory system 3 may include a random access memory (RAN) which is a volatile memory, for example, include a dynamic random access memory (DRAM) 6. Alternatively, a RAM such as a static random access memory (SRAM) may be provided inside the controller 4. Note that the DRAM 6 may be provided inside the controller 4.

The DRAM 6 is a volatile memory. The RAM such as the DRAM 6 includes, for example, a storage area of firmware (FW) and a cache area of a logical-to-physical address translation table.

The NAND flash memory 5 includes multiple blocks. Each of the blocks includes multiple pages. The blocks each function as a minimum unit of a data erase operation. A block may be referred to as an erase block or a physical block. Each of the pages includes multiple memory cells connected to a single word line. The pages each function as a unit of a data write operation and a data read operation. Note that a word line may also function as a unit of a data write operation and a data read operation.

The tolerable maximum number of program/erase cycles (maximum number of P/E cycles) for each of the blocks is limited. One P/E cycle of a block includes a data erase operation to erase data stored in all memory cells in the block and a data write operation to write data in each page of the block.

The controller 4 includes, for example, a host interface (host I/F) 11, a CPU 12, a NAND interface (NAND I/F) 13, a DRAM interface (DRAM I/F) 14, and a variable length coding device 15. The host I/F 11, the CPU 12, the NAND I/F 13, the DRAM I/F 14, and the variable length coding device 15 may be interconnected via a bus 10.

The controller 4 is electrically connected to the NAND flash memory 5 via the NAND I/F 13 that conforms to an interface standard such as a toggle DDR and an open NAND flash interface (ONFI). The NAND I/F 13 functions as NAND control circuitry configured to control the NAND flash memory 5.

The controller 4 functions as a memory controller configured to control the NAND flash memory 5.

The controller 4 may function as a flash translation layer (FTL) configured to execute data management and block management of the NAND flash memory 5. The data management executed by the FTL includes (1) management of mapping information indicative a relationship between each logical address and each physical address of the NAND flash memory 5, and (2) to hide a difference between data read/data write operations in units of page and data erase operations in units of block. The block management includes management of defective blocks, wear leveling, and garbage collection.

The logical address is an address used by the host 2 for addressing a storage area of the memory system 3. Management of mapping between each logical address and each physical address is executed by using a logical-to-physical address translation table. The controller 4 uses the logical-to-physical address translation table to manage the mapping between each logical address and each physical address with a certain management size. A physical address corresponding to a logical address indicates a physical memory location in the NAND flash memory 5 to which data of the logical address is written. The logical-to-physical address translation table may be loaded from the NAND flash memory 5 to the DRAM 6 when the memory system 3 is boot up.

The data write operation into one page is executable only once in a single P/E cycle. Thus, the controller 4 writes updated data corresponding to a logical address not to an original physical memory location in which previous data corresponding to the logical address is stored but to a different physical memory location. Then, the controller 4 updates the logical-to-physical address translation table to associate the logical address with this different physical memory location and to invalidate the previous data.

The host I/F 11 is a hardware interface that performs communication between the memory system 3 and the host 2, which is an external device of the memory system 3. The host I/F 11 includes circuitry which receives various commands, for example, an input/output (I/O) command and a control command, from the host 2. The I/O commands may be a write command or a read command. The control command may be an unmap command (trim command) or a format command. The host I/F 11 includes circuitry that transmits a response to a command and data to the host 2.

The DRAM I/F 14 functions as DRAM control circuitry configured to control access to the DRAM 6.

The CPU 12 is a processor configured to control the host I/F 11, the NAND I/F 13, the DRAM I/F 14, and the variable length coding device 15. The CPU 12 performs various processes by executing the FW loaded to the DRAM 6. In other words, the FW is a control program for controlling an operation of the CPU 12. The CPU 12 may perform, in addition to the above-described processes of FTL, command processes to process various commands received from the host 2. Note that part of or the entire FTL processes and command processes may be executed by dedicated hardware in the controller 4.

The variable length coding device 15 is a dynamic Huffman coding unit that encodes data to be written into the NAND flash memory 5 to compress the data. For example, the CPU 12 inputs write data received from the host 2 in accordance with receiving a write command, to the variable length coding device 15 as plain text data. The variable length coding device 15 encodes the plain text data input from the CPU 12. In order to compress data, the variable length coding device 15 has, for example, a configuration for implementing dynamic Huffman coding.

The dynamic Huffman coding is a variable length coding for dynamically generating a code table (coding table) by using a frequency of occurrence of each symbol to be encoded. The code table includes information indicative of N types of symbols and N variable length codes (code words) that are associated with the N types of symbols, respectively. N is, for example, an integer of two or more. In the dynamic Huffman coding, a short code word is assigned to a symbol whose frequency of occurrence is high, and a long code word is assigned to a symbol whose frequency of occurrence is low. The variable length coding device 15 converts an input symbol into a code word in accordance with such assignment. Accordingly, a code word obtained by the conversion is a variable length code. Note that the symbol is, for example, data of a fixed length.

A symbol to be encoded is one of the N types of symbols. Hereinafter, a case where N is 256 will be mainly described.

Each of 256 types of symbols is, for example, 1-byte data. In this case, the 256 types of symbols correspond to values from 0 to 255, respectively. Any of the values from 0 to 255 that correspond to the 256 types of symbols, respectively, is also referred to as a symbol number. Note that the number of the types of symbols and the values corresponding to the symbols are mere examples and may be changed in accordance with characteristics of data that includes symbols to be encoded.

The variable length coding device 15 includes a code table generation unit 32. The code table generation unit 32 is a module that generates a code table for converting a symbol into a variable length code. The code table generation unit 32 may be a device provided inside the variable length coding device 15, or may be part of circuitry that realizes the variable length coding device 15.

Here, generation of a code table in a code table generation unit 32A according to a comparative example will be described with reference to FIG. 2 to FIG. 11.

FIG. 2 is a block diagram showing a configuration of the code table generation unit 32A according to the comparative example. The code table generation unit 32A includes, for example, a frequency table generation unit 321A, a frequency sorting unit 322A, a Huffman tree generation unit 324A, a code length determination unit 325A, a maximum code length restriction unit 326A, and a code assignment unit 328A.

The frequency table generation unit 321A generates a frequency table 40A (hereinafter, referred to as a zeroth frequency table 40A) by using input symbols. The zeroth frequency table 40A is a table indicative of symbols and frequencies of occurrence of the respective symbols. The frequency table generation unit 321A sends the zeroth frequency table 40A to the frequency sorting unit 322A.

The frequency sorting unit 322A sorts entries in the zeroth frequency table 40A in descending order of the frequencies of occurrence. The frequency table obtained by the sorting is referred to as a first frequency table 41A. The frequency sorting unit 322A sends the first frequency table 41A to the Huffman tree generation unit 324A.

The Huffman tree generation unit 324A generates a Huffman tree by using the first frequency table 41A.

Figure 3:
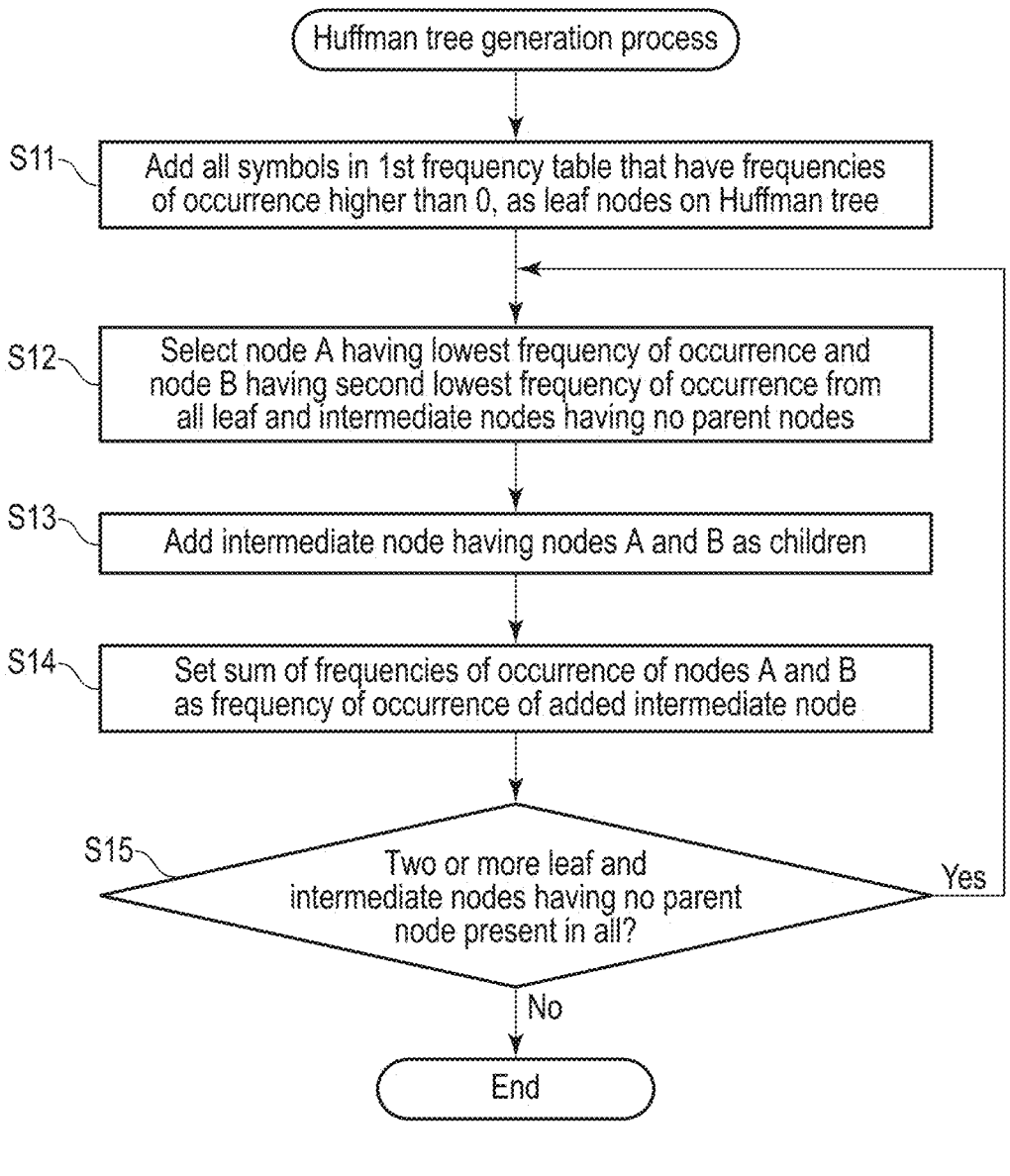
FIG. 3 is a flowchart showing the procedure of a Huffman tree generation process executed in the code table generation unit according to the comparative example.

FIG. 3 is a flowchart showing an example of the procedure of a Huffman tree generation process executed by the Huffman tree generation unit 324A.

First, the Huffman tree generation unit 324A adds all symbols in the first frequency table 41A that have frequencies of occurrence higher than 0, as leaf nodes on a Huffman tree (step S11). In other words, the Huffman tree generation unit 324A generates a Huffman tree including as many leaf nodes as the symbols in the first frequency table 41A that have frequencies of occurrence higher than 0. The number of symbols for which the Huffman tree is to be generated (i.e., the number of leaf nodes of the Huffman tree to be generated) by the Huffman tree generation unit 324A is at most N.

Next, the Huffman tree generation unit 324A selects a node A having the lowest frequency of occurrence and a node B having the second lowest frequency of occurrence from all leaf and intermediate nodes having no parent nodes in the Huffman tree (step S12). The Huffman tree generation unit 324A adds an intermediate node having the selected nodes A and B as children to the Huffman tree (step S13). Then, the Huffman tree generation unit 324A sets the sum of the frequencies of occurrence of the nodes A and B as a frequency of occurrence of the added intermediate node (step S14).

The Huffman tree generation unit 324A determines whether or not there are two or more leaf and intermediate nodes having no parent nodes in all in the Huffman tree (step S15). When there are two or more leaf and intermediate nodes having no parent nodes in all in the Huffman tree (Yes in step S15), the process by the Huffman tree generation unit 324A proceeds to step S12. That is, the Huffman tree generation unit 324A further performs a procedure for adding an intermediate node that has leaf and intermediate nodes having no parent nodes as children.

When the number of leaf and intermediate nodes having no parent nodes in the Huffman tree is smaller than two (No in step S15), the Huffman tree generation unit 324A ends the Huffman tree generation process.

With the above Huffman tree generation process, the Huffman tree generation unit 324A can generate the Huffman tree. The generated Huffman tree includes the leaf nodes respectively corresponding to the symbols whose frequencies of occurrence are higher than 0. The Huffman tree generation unit 324A constructs the Huffman tree bottom-up from a leaf node corresponding to a symbol that has a lower frequency of occurrence.

The description returns to FIG. 2. The Huffman tree generation unit 324A sends the generated Huffman tree to the code length determination unit 325A.

The code length determination unit 325A determines a code length of each of the symbols by using the Huffman tree received from the Huffman tree generation unit 324A. A depth of a leaf node starting from a root node (i.e., the number of edges traced from the root node to the leaf node) corresponds to a code length of the corresponding symbol. As the distance from the root node to a node is longer, the depth of the node is deeper and a code length of a symbol corresponding to the node is longer. Thus, the code length determination unit 325A can determine the code length of each of the symbols by using the Huffman tree. The code length determination unit 325A sends the determined code length of each of the symbols to the maximum code length restriction unit 326A.

In some data compression standards, code lengths may be restricted not to exceed an upper limit (that is, limited to the upper limit). In such a case, the maximum code length restriction unit 326A executes a process of restricting (limiting) the code length to the upper limit (hereinafter referred to as a maximum code length restriction process). Specifically, the maximum code length restriction unit 326A restricts the code length of each of the symbols determined by the code length determination unit 325A to a code length that is shorter than or equal to the upper limit. The maximum code length restriction unit 326A sends the code length of each of the symbols restricted to the code length that is shorter than or equal to the upper limit, to the code assignment unit 328A. The upper limit of code length is also referred to as a maximum code length in the following descriptions. A specific example of the maximum code length restriction process will be described later with reference to FIG. 7 to FIG. 11.

The code assignment unit 328A generates a code table by using the code length of each of the symbols received from the maximum code length restriction unit 326A. The code assignment unit 328A generates the code table according to, for example, canonical Huffman coding. The canonical Huffman coding is capable of determining a code bit string (variable length code) to be assigned to a symbol, using only the code lengths of the symbols. A specific example of generating a code table according to the canonical Huffman coding will be described later with reference to FIG. 26.

A specific example in which the code lengths are determined by using the first frequency table 41A will be described with reference to FIG. 4 to FIG. 6.

Figures 4, 5:
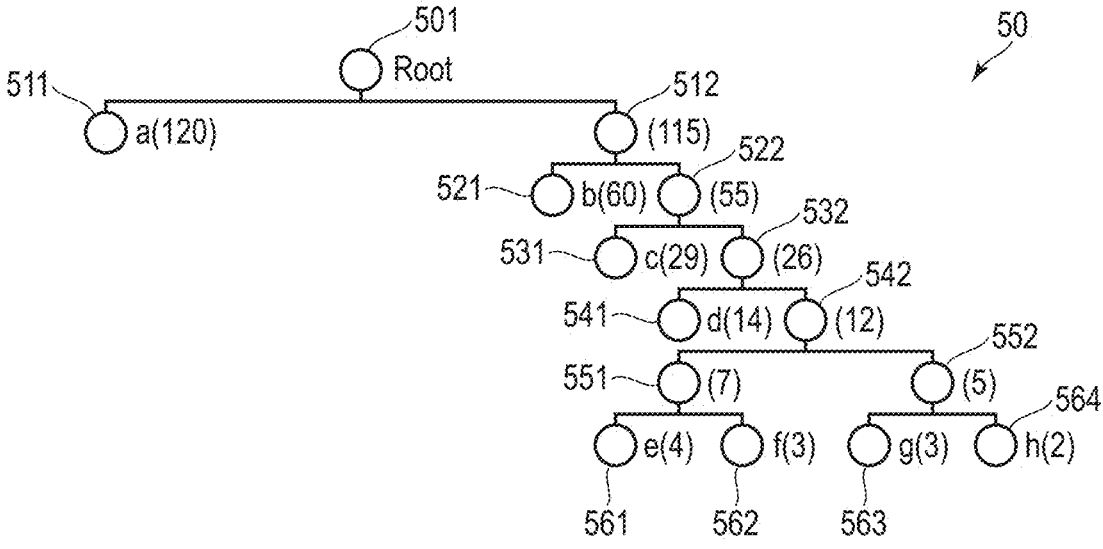
FIG. 4 is a diagram showing an example of a frequency table used in the code table generation unit according to the comparative example.
FIG. 5 is a diagram showing an example of a Huffman tree generated in the code table generation unit according to the comparative example.

FIG. 4 shows an example of a configuration of the first frequency table 41A generated by the frequency table generation unit 321A and then sorted by the frequency sorting unit 322. The first frequency table 41A includes multiple entries that correspond to symbols, respectively. Each of the entries includes, for example, a symbol field and a frequency of occurrence field.

The symbol field indicates a corresponding symbol.

The frequency of occurrence field indicates a frequency of occurrence of the corresponding symbol. More specifically, the frequency of occurrence field indicates, for example, the number of times the corresponding symbol occurs in the input data to be processed.

Note that, hereinafter, a value indicated in the symbol field is also simply referred to as a symbol. The same will apply to values indicated in other fields of the first frequency table 41A and values indicated in fields of other tables.

In the example shown in FIG. 4, a frequency of occurrence of a symbol "a" is 120. A frequency of occurrence of a symbol "b" is 60. A frequency of occurrence of a symbol "c" is 29. A frequency of occurrence of a symbol "d" is 14. A frequency of occurrence of a symbol "e" is four. A frequency of occurrence of each of symbols "f" and "g" is three. A frequency of occurrence of a symbol "h" is two. A frequency of occurrence of each of symbols "i" and "j" is 0.

FIG. 5 shows an example of a Huffman tree 50 generated by the Huffman tree generation unit 324A. Here, a case where the Huffman tree generation unit 324A generates the Huffman tree 50 by using the first frequency table 41A illustrated in FIG. 4 will be explained.

First, the Huffman tree generation unit 324A selects, from the first frequency table 41A, the eight symbols "a", "b", "c", "d", "e", "f", "g", and "h" that have the frequencies of occurrence larger than 0. The Huffman tree generation unit 324A generates the Huffman tree 50 including eight leaf nodes 511, 521, 531, 541, 561, 562, 563, and 564 to which the selected eight symbols are assigned, respectively. For each of the leaf nodes, the frequency of occurrence of the corresponding symbol is set.

The Huffman tree generation unit 324A selects the leaf node 564 of the symbol "h" having the smallest frequency of occurrence and the leaf node 563 of the symbol "g" having the next smallest frequency of occurrence from all leaf and intermediate nodes in the Huffman tree 50 that have no parent nodes. Then, the Huffman tree generation unit 324A adds an intermediate node 552 having the selected leaf nodes 564 and 563 as children to the Huffman tree 50. The Huffman tree generation unit 324A sets the sum of the frequency of occurrence of the leaf node 564 and the frequency of occurrence of the leaf node 563 (=2+3=5) as the frequency of occurrence of the intermediate node 552.

Next, the Huffman tree generation unit 324A selects the leaf node 562 of the symbol "f" having the smallest frequency of occurrence and the leaf node 561 of the symbol "e" having the next smallest frequency of occurrence, from all leaf and intermediate nodes in the Huffman tree 50 that have no parent nodes. Then, the Huffman tree generation unit 324A adds an intermediate node 551 having the selected leaf nodes 562 and 561 as children to the Huffman tree 50. The Huffman tree generation unit 324A sets the sum of the frequency of occurrence of the leaf node 562 and the frequency of occurrence of the leaf node 561 (=3+4=7) as the frequency of occurrence of the added intermediate node 551.

Next, the Huffman tree generation unit 324A selects the intermediate node 552 having the smallest frequency of occurrence and the intermediate node 551 having the next smallest frequency of occurrence, from all leaf and intermediate nodes in the Huffman tree 50 that have no parent nodes. Then, the Huffman tree generation unit 324A adds an intermediate node 542 having the selected intermediate nodes 552 and 551 as children to the Huffman tree 50. The Huffman tree generation unit 324A sets the sum of the frequency of occurrence of the intermediate node 552 and the frequency of occurrence of the intermediate node 551 (=5+7=12) as the frequency of occurrence of the added intermediate node 542.

Similarly, the Huffman tree generation unit 324A repeats the operation of adding an intermediate node until the number of leaf and intermediate nodes in the Huffman tree 50 that have no parent nodes becomes one or less (i.e., until only a root node 501 is obtained as a node having no parent node). As a result, the Huffman tree 50 shown in FIG. 5 can be constructed.

The code length determination unit 325A determines code lengths that are associated with the symbols, respectively, by using the constructed Huffman tree 50. Specifically, the code length determination unit 325A determines the code length of each of the eight symbols "a", "b", "c", "d", "e", "f", "g", and "h" by using the constructed Huffman tree 50. The depth of a leaf node corresponding to a symbol starting from the root node 501 indicates the code length of the symbol. For example, the depth of the leaf node 511 of the symbol "a" starting from the root node 501 is one. Thus, the code length of the symbol "a" is 1 bit. In addition, for example, the depth of the leaf node 564 of the symbol "h" starting from the root node 501 is six. Thus, the code length of the symbol "h" is 6 bits.

FIG. 6 shows an example of the code length of each symbol determined by the code length determination unit 325A by using the Huffman tree 50 shown in FIG. 5.

Specifically, the code length of the symbol "a" is 1 bit. The code length of the symbol "b" is 2 bits. The code length of the symbol "c" is 3 bits. The code length of the symbol "d" is 4 bits. In addition, the code length of each of the symbols "e", "f", "g", and "h" is 6 bits.

Figure 7:
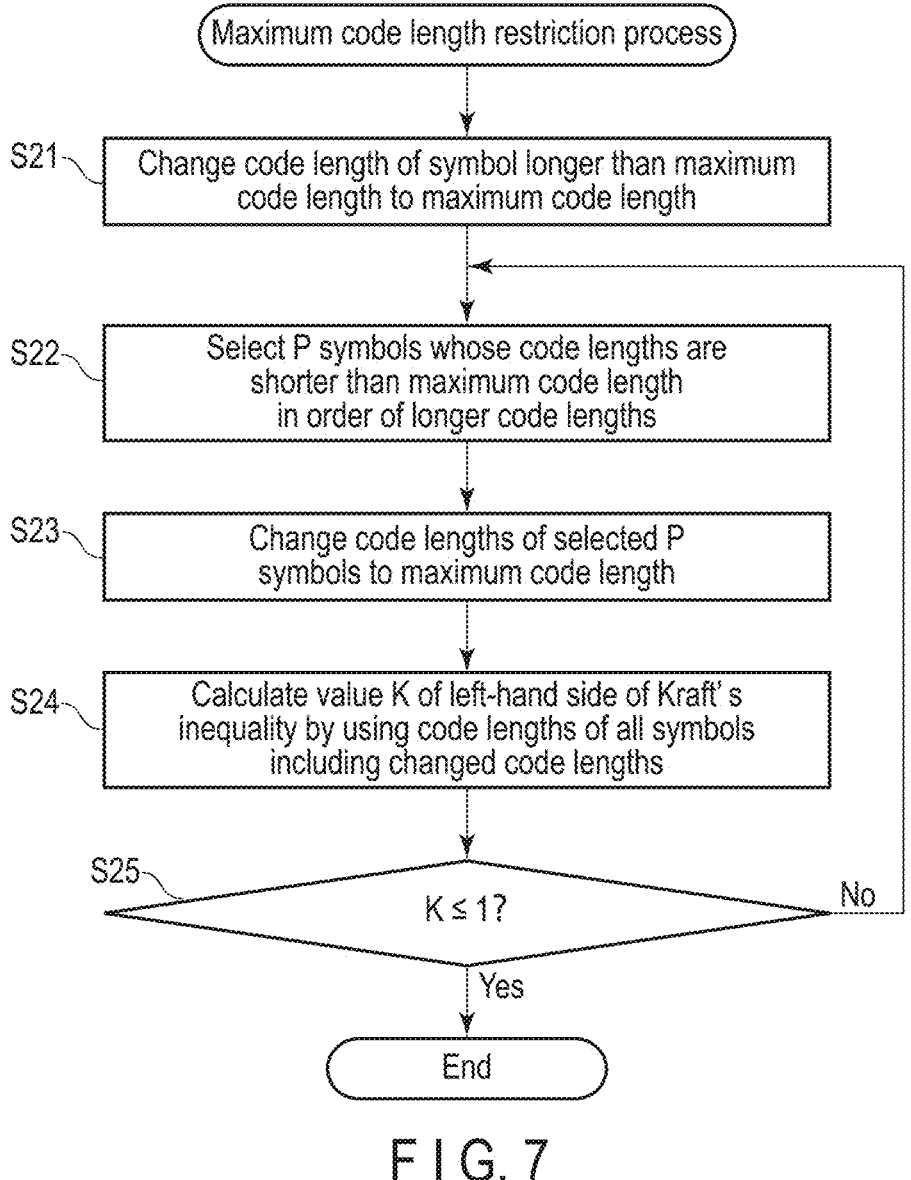
FIG. 7 is a flowchart showing the procedure of a maximum code length restriction process executed in the code table generation unit according to the comparative example.

FIG. 7 is a flowchart showing an example of the procedure of the maximum code length restriction process executed by the maximum code length restriction unit 326A. The maximum code length restriction process is a process of restricting the code lengths of the respective symbols determined by the code length determination unit 325A to the maximum code length (i.e., to a code length shorter than or equal to the maximum code length).

First, the maximum code length restriction unit 326A changes all the code lengths of the symbols that are longer than the maximum code length, to the maximum code length (step S21). The maximum code length restriction unit 326A selects P symbols whose code lengths are shorter than the maximum code length, in the order of longer code lengths (step S22). P is an integer of one or more. Then, the maximum code length restriction unit 326A changes the code lengths of the selected P symbols to the maximum code lengths in parallel (step S23). As P is larger, the number of symbols whose code lengths are changed to the maximum code lengths at a time is increased. In the following descriptions, P is also referred to as a degree of parallelism.

Next, the maximum code length restriction unit 326A calculates a value K of the left-hand side of Kraft's inequality by using the code lengths of all the symbols including the changed code lengths (step S24). The Kraft's inequality is expressed by using the following equation (1).

$$K = \sum_{s \in AllSymbol} 2^{-l}(s) \qquad \text{Equation 1}$$

Note that AllSymbol is a symbol set including all the symbols. s is an element (i.e., a symbol) of the symbol set AllSymbol. l(s) is a code length corresponding to symbol s.

When code length l(s) of symbol s∈AllSymbol satisfies Kraft's inequality, existence of a valid code table is guaranteed. In other words, encoding and decoding that use the code table generated based on code length l(s) of symbol s∈AllSymbol can be correctly executed.

In contrast, when code length l(s) of symbol s∈AllSymbol does not satisfy Kraft's inequality, there is no valid code table. Therefore, encoding and decoding that use a code table generated based on code length l(s) of symbol s∈AllSymbol cannot be correctly executed.

The maximum code length restriction unit 326A determines whether or not the calculated value K of the left-hand side of Kraft's inequality is smaller than or equal to one (step S25). In other words, the maximum code length restriction unit 326A determines whether or not code length l(s) of symbol s E AllSymbol satisfies Kraft's inequality.

When the value K of the left-hand side of Kraft's inequality is larger than one (No in step S25), the process by the maximum code length restriction unit 326A returns to step S22. In other words, the maximum code length restriction unit 326A repeats a process of: selecting P symbols whose code lengths are shorter than the maximum code length and that have not yet been selected, in the order of longer code lengths; changing the code lengths of the selected P symbols to the maximum code length; and calculating the value K of the left-hand side of Kraft's inequality, until code length l(s) of symbol s E AllSymbol satisfies Kraft's inequality (i.e., until the value of the left-hand side of Kraft's inequality is smaller than or equal to one).

When the value K of the left-hand side of Kraft's inequality is smaller than or equal to one (Yes in step S25), the maximum code length restriction unit 326A ends the maximum code length restriction process.

With the above maximum code length restriction process, the maximum code length restriction unit 326A can change a code length associated with a symbol that is longer than the maximum code length, to the maximum code length. The code lengths of all the symbols including the changed code length do not satisfy Kraft's inequality. Therefore, the maximum code length restriction unit 326A further performs a process of selecting P symbols each corresponding to a code length shorter than the maximum code length and changing the code lengths of the selected P symbols to the maximum code length, repeatedly until Kraft's inequality is satisfied. The maximum code length restriction unit 326A can thereby associate all the symbols with code lengths that are shorter than or equal to the maximum code length and satisfy the Kraft's inequality.

With reference to FIG. 8 to FIG. 10, an operation of the maximum code length restriction unit 326A to restrict the code lengths of the symbols to the maximum code length will be explained by using modified examples of the Huffman tree 50 of FIG. 5. The Huffman tree 50 of FIG. 5 is a Huffman tree constructed by the Huffman tree generation unit 324A, based on the frequencies of occurrence of the symbols, without considering the maximum code length. The maximum code length restriction unit 326A transforms the Huffman tree 50 of FIG. 5 to satisfy both the restriction on the maximum code length and Kraft's inequality. Here, it is assumed that the maximum code length is 4 bits. In addition, the degree of parallelism P is one in order to make the description easy to understand.

FIG. 8 shows an example in which the maximum code length restriction unit 326A determines symbols each having a code length longer than the maximum code length and a symbol whose code length is to be lengthened to the maximum code length.

Specifically, the maximum code length restriction unit 326A determines the four symbols "e", "f", "g", and "h" (i.e., leaf nodes 561, 562, 563, and 564) each having the code length longer than 4 bits. The maximum code length restriction unit 326A changes the code lengths of the determined four symbols "e", "f", "g", and "h" from 6 bits to 4 bits.

In addition, the maximum code length restriction unit 326A determines the symbol "c" (i.e., leaf node 531) having the longest code length among the symbols each having the code length shorter than 4 bits. The maximum code length restriction unit 326A changes the code length of the determined symbol "c" from 3 bits to 4 bits.

FIG. 9 shows the Huffman tree 50 in which the code lengths of the four symbols "e", "f", "g", and "h" and the code length of the symbol "c" have been changed according to the above-described changes.

In accordance with the code length of the symbol "c" being changed from 3 bits to 4 bits, the node 531 is changed from a leaf node to an intermediate node, and two leaf nodes 543 and 544 having the intermediate node 531 as their parent node are added to the Huffman tree 50. The symbol "c" is assigned to the leaf node 543. The symbol "e" is assigned to the leaf node 544.

In addition, in the Huffman tree 50, in accordance with the code lengths of the four symbols "e", "f", "g", and "h being changed from 6 bits to 4 bits, four leaf nodes 541, 545, 546, and 542 having an intermediate node 532 as their parent node are generated. Accordingly, this Huffman tree 50 is an invalid Huffman tree. Therefore, Huffman codes determined based on this Huffman tree 50 are invalid Huffman codes that do not satisfy Kraft's inequality (i.e., K>1).

Thus, the maximum code length restriction unit 326A further determines a leaf node whose code length is to be lengthened to the maximum code length. Specifically, the maximum code length restriction unit 326A determines the symbol "b" (i.e., leaf node 521) having the longest code length among the symbols whose code lengths are shorter than 4 bits. The maximum code length restriction unit 326A changes the code length of the determined symbol "b" from 2 bits to 4 bits.

FIG. 10 shows the Huffman tree 50 in which the code length of the symbol "b" has been changed.

In accordance with the code length of the symbol "b" being changed from 2 bits to 4 bits, the node 521 is changed from a leaf node to an intermediate node, and two intermediate nodes 533 and 534 having the intermediate node 521 as their parent node, two leaf nodes 547 and 548 having the intermediate node 533 as their parent node, and two leaf nodes 545 and 546 having the intermediate node 534 as their parent node are added to the Huffman tree 50. This Huffman tree 50 is a valid Huffman tree 50. Therefore, Huffman codes determined based on this Huffman tree 50 are valid Huffman codes that satisfy Kraft's inequality (i.e., K<1).

The Huffman tree 50 obtained by the maximum code length restriction unit 326A may include the redundant leaf node 548 to which no symbol is assigned. In this case, the maximum code length restriction unit 326A further removes the redundant leaf node 548 to which no symbol is assigned.

FIG. 11 shows the Huffman tree 50 in which the redundant leaf node 548 has been removed.

A binary tree that includes the redundant leaf node 548, the leaf node 547, and the intermediate node 533 is merged to become the leaf node 533. The process of merging a binary tree having a redundant leaf node is also simply referred to as a merge process. The symbol "b" assigned to the leaf node 547 is assigned to the leaf node 533. In other words, the code length of the symbol "b" is reduced by one bit, thereby changed from 4 bits to 3 bits.

This Huffman tree 50 is a valid Huffman tree. Therefore, Huffman codes determined based on this Huffman tree 50 are valid Huffman codes that satisfy Kraft's inequality and that have no redundant code assignment (i.e., K=1). In other words, the Huffman codes determined based on the Huffman tree 50 are perfect codes since every intermediate node of the Huffman tree 50 has two child nodes.

Thus, in the code table generation unit 32A of the comparative example, the process of constructing the Huffman tree 50 to determine the code length of each symbol and restricting the code lengths to the maximum code length may require the merge process. There is a case where this merge process may be necessary not only to improve a coding efficiency of Huffman codes, but also to satisfy a requirement that the Huffman codes are perfect codes. This case is, for example, a case where compression standards or compression software require that Huffman codes are perfect codes. When the maximum code length restriction process shown in FIG. 7 has been completed, the maximum code length restriction unit 326A cannot guarantee that the Huffman codes assigned based on the code length of each symbol are perfect codes, and may have to additionally execute the merge process. For this reason, the code table generation unit 32A of the comparative example may require additional processing time and additional processing resources (for example, hardware cost).

In contrast, the variable length coding encoder 15 according to the embodiment realizes a maximum code length restriction process that guarantees that Huffman codes are perfect codes. In the maximum code length restriction process, the code table generation unit 32 of the variable length coding device 15 restricts code lengths of symbols to the maximum code length (that is, to a code length shorter than or equal to the maximum code length) and guarantees that Huffman codes assigned based on the code length of each symbol are perfect codes.

For example, in a case where N code lengths corresponding to respective N symbols determined based on a Huffman tree include a first code length longer than the maximum code length, the code table generation unit 32 restricts the first code length to the maximum code length in the maximum code length restriction process. Specifically, the code table generation unit 32 selects at least one first symbol corresponding to the first code length from the N symbols. The code table generation unit 32 selects at least one second symbol corresponding to a second code length that is shorter than the maximum code length, from the N symbols. The code table generation unit 32 changes the second code length corresponding to the second symbol to a code length obtained by adding one to the second code length. Then, the code table generation unit 32 changes the first code length corresponding to the first symbol to a code length equal to the changed second code length.

In other words, the code table generation unit 32 selects the first symbol that does not satisfy a code length restriction of being the code length shorter than or equal to the maximum code length, and selects another second symbol that satisfies the code length restriction. Then, the code table generation unit 32 sets a leaf node on the Huffman tree corresponding to the second symbol as an intermediate node, and then connects leaf nodes to which the first and second symbols are assigned, respectively, as children nodes of the intermediate node. Accordingly, the process for satisfying the code length restriction can be executed while the Huffman codes assigned based on the Huffman tree being perfect codes are maintained.

Therefore, the code table generation unit 32 can guarantee that the Huffman codes assigned based on the code length of each symbol are perfect codes when the maximum code length restriction process has been completed. Therefore, the code table generation unit 32 of the embodiment can reduce the processing time and the processing resources as compared to the code table generation unit 32A of the comparative example, which additionally executes the merge process.

FIG. 12 shows an example of a configuration of the variable length coding device 15 according to the embodiment. The variable length coding device 15 includes, for example, a buffer unit 31, the code table generation unit 32, and a variable length coding unit 33.

The buffer unit 31 stores (buffers) symbols input to the variable length coding device 15. The buffer unit 31 delays the stored symbols until, for example, a specific timing and then sends the symbols to the variable length coding unit 33. The specific timing is, for example, the timing when the code table generation unit 32 has completed generation of a code table.

The code table generation unit 32 generates a code table by using the symbols input to the variable length coding device 15. The code table includes information indicative of symbols and variable length codes (i.e., code bit strings) that are associated with the symbols, respectively.

More specifically, the code table generation unit 32 generates the code table, based on frequencies of occurrence of symbols that are included in input data of a specific unit. The specific unit may be a unit of a specific data amount or may be a specific group such as a file. In a case where the unit is a specific group, the code table generation unit 32 detects data indicative of the end of the input data to recognize the input data of the specific unit. The code table generation unit 32 sends the generated code table to the variable length coding unit 33.

The variable length coding unit 33 converts the symbols sent from the buffer unit 31 into variable length codes (code bit strings) by using the code table sent from the code table generation unit 32. The variable length coding unit 33 outputs the variable length codes obtained by the conversion as compressed data.

With the above configuration, the variable length coding unit 15 can perform dynamic Huffman coding on the input symbols to convert the input symbols into variable length codes. For example, in a case where the input symbols are data required to be written into the NAND flash memory 5 by the host 2, the CPU 12 writes compressed data that includes one or more variable length codes and the code table that is compressed, into the NAND flash memory 5 via the NAND I/F 13.

The controller 4 may further include an ECC encoder and an ECC decoder. In this case, the ECC encoder generates a parity for error correction (ECC parity) for the compressed data output from the variable length coding unit 33 and generates a code word having the generated ECC parity and the compressed data. The CPU 12 is configured to write the code word to the NAND flash memory 5 via the NAND I/F 13. In other words, the CPU 12 is configured to write data based on the compressed data output from the variable length coding device 15 into the NAND flash memory 5 via the NAND I/F 13. Further, for example, in a case where a read command is received from the host 2 via the host I/F 11, the CPU 12 reads the data based on the read command from the NAND flash memory 5 via the NAND I/F 13. The ECC decoder executes an error correction process on the read data. The read data on which the error correction process has been executed is input to a decompressor by the CPU 12 as compressed data, and the decompressor decompresses the input compressed data. The CPU 12 transmits the decompressed data to the host 2 in response to the read command from the host 2. In other words, in response to the read command from the host 2, the CPU 12 is configured to decompress data based on data read from the NAND flash memory 5 and transmit the decompressed data to the host 2.

Note that part or all of the variable length coding device 15 may be implemented as hardware such as circuitry or implemented as programs (i.e., software) executed by at least one processor.

Next, a specific configuration of the code table generation unit 32 will be described. The code table generation unit 32 includes, for example, a frequency table generation unit 321, a frequency sorting unit 322, a symbol merge unit 323, a Huffman tree generation unit 324, a code length determination unit 325, a maximum code length restriction unit 326, a representative symbol expansion unit 327, and a code assignment unit 328.

The frequency table generation unit 321 generates a frequency table 40 (hereinafter referred to as a zeroth frequency table 40) based on frequencies of occurrence of the input symbols for each symbol. For example, the frequency table generation unit 321 counts the number of occurrences of the input symbols for each symbol, thereby generating the zeroth frequency table 40. For example, the frequency table generation unit 321 generates the zeroth frequency table 40 every time 4096 symbols are input. The zeroth frequency table 40 is a table indicative of symbols and frequencies of occurrence (e.g., the numbers of times of occurrence) that are associated with the symbols, respectively. The frequency table generation unit 321 sends the zeroth frequency table 40 to the frequency sorting unit 322.

The frequency sorting unit 322 sorts the entries in the zeroth frequency table 40 in descending order of the frequencies of occurrence. The frequency table obtained by the sorting is referred to as a first frequency table 41. The frequency sorting unit 322 sends the first frequency table 41 to the symbol merge unit 323.

FIG. 13 shows an example of the zeroth frequency table 40 generated by the frequency table generation unit 321. The zeroth frequency table 40 includes N entries that correspond to N types of symbols, respectively. Indexes from 0 to N−1 are assigned to the N entries, respectively, in order from the head. Thus, each of the N entries is identifiable by the index. In the example shown in FIG. 13, N is 256. Each entry includes a symbol number field and a frequency of occurrence field.

In an entry corresponding to a symbol, the symbol number field indicates a symbol number corresponding to the symbol. The frequency of occurrence field indicates a frequency (for example, the number of times) at which the corresponding symbol occurs in one or more symbols included in the input data.

Thus, each entry indicates a combination of a symbol number and a frequency of occurrence. The combination of a symbol number and a frequency of occurrence is also referred to as a <symbol number, frequency of occurrence> pair.

In the zeroth frequency table 40 shown in FIG. 13, for example, an entry with the index "0" indicates that a frequency of occurrence of a symbol with a symbol number "0" is three. For example, an entry with the index "1" indicates that a frequency of occurrence of a symbol with a symbol number "1" is 16. Furthermore, for example, an entry with the index "253" indicates that a frequency of occurrence of a symbol with a symbol number "253" is 30.

FIG. 14 shows an example of the first frequency table 41 acquired by the frequency sorting unit 322. The first frequency table 41 is a table in which the 256 entries in the zeroth frequency table 40 are arranged in descending order of the frequencies of occurrence. Indexes from 0 to 255 are assigned to the 256 entries in the first frequency table 41, respectively, in order from the head.

In the first frequency table 41 shown in FIG. 14, for example, an entry with the index "0" indicates that a frequency of occurrence of a symbol with a symbol number "64" is 50. For example, an entry with the index 1 indicates that the frequency of occurrence of the symbol with the symbol number "253" is 30. Furthermore, for example, an entry with the index 255 indicates that a frequency of occurrence of a symbol with a symbol number "8" is 0.

As described above, in the first frequency table 41, the 256 entries are arranged in descending order of the frequencies of occurrence.

The description returns to FIG. 12.

The symbol merge unit 323 divides L symbols among all the symbols (i.e., N symbols) included in the first frequency table 41 into M symbol sets, and performs a process for regarding each of the M symbol sets as one symbol (hereinafter referred to as a representative symbol) while a Huffman tree is constructed. The symbol merge unit 323 generates M representative symbols that represents the M symbol sets, respectively. L is an integer of one or more. M is an integer of one or more. Hereinafter, a case where M is one will be mainly described in order to make the description easy to understand. In this case, the symbol merge unit 323 performs a process of regarding the L symbols among all the symbols included in the first frequency table 41 as one representative symbol. Note that in a case where M is two or more, a process for the one representative symbol to be described below is executed for each of M representative symbols. The symbol merge unit 323 includes, for example, a symbol distribution unit 351, a representative symbol frequency estimation unit 352, a merge symbol count unit 353, and a merge symbol additional code length determination unit 354.

The symbol distribution unit 351 divides the first frequency table 41 into a first part table 431 and a second part table 432. The first part table 431 includes, for example, the top H entries in descending order of the frequencies of occurrence among the N entries included in the first frequency table 41. H is an integer of one or more. In addition, the sum of H and L is N. The H entries are entries of H symbols having high frequencies of occurrence. The H symbols having high frequencies of occurrence are also referred to as high-order symbols. The second part table 432 includes, for example, the remaining L (=N−H) entries that are obtained by excluding the top H entries from the N entries included in the first frequency table 41. The L entries are entries of L symbols having low frequencies of occurrence. The L entries are more likely to include a symbol whose frequency of occurrence is 0 than the high-order H entries. The L symbols having the low frequencies of occurrence are also referred to as low-order symbols. The L low-order symbols are regarded as one representative symbol while a Huffman tree is constructed. In other words, the representative symbol is a symbol that represents the L low-order symbols. In contrast, each of the H high-order symbols represents its own high-order symbol and does not represent any other symbol. For this reason, the high-order symbols are also referred to as non-representative symbols.

Note that, for example, the symbol distribution unit 351 decides to include, in the second part table 432, the bottom (lower-order) L entries in descending order of the frequencies of occurrence among the N entries included in the first frequency table 41, and then decides to include, in the first part table 431, the remaining entries that are obtained by excluding the L entries from the N entries. Alternatively, the symbol distribution unit 351 may decide to include, in the first part table 431, the top (higher-order or upper-order) H entries in descending order of the frequencies of occurrence among the N entries included in the first frequency table 41, and then decide to include, in the second part table 432, the remaining entries obtained by excluding the H entries from the N entries. In other words, which of the entries included in the second part table 432 and the entries included in the first part table 431 is preferentially decided can be freely determined.

The symbol distribution unit 351 sends the first part table 431 to the Huffman tree generation unit 324. The symbol distribution unit 351 sends the second part table 432 to the representative symbol frequency estimation unit 352, merge symbol count unit 353, and the merge symbol additional code length determination unit 354.

FIG. 15 is a diagram showing (A) an example of the first frequency table 41, and (B) an example of the first part table 431 and (C) the second part table 432 that are obtained by dividing the first frequency table 41. In the example shown in FIG. 15, N is 256, H is 32, and L is 224.

The first frequency table 41 shown in FIG. 15(A) is a table in which the N entries are arranged in descending order of the frequencies of occurrence, similarly to the first frequency table 41 shown in FIG. 14. The first frequency table 41 is divided into the first part table 431 and the second part table 432.

As shown in FIG. 15(B), the first part table 431 includes the high-order H entries (i.e., H entries from the head) among the entries included in the first frequency table 41. Indexes from 0 to H−1 are respectively assigned to the H entries in the first part table 431 in order from the head.

As shown in FIG. 15(C), the second part table 432 includes the low-order L entries (i.e., L entries from the bottom) among the entries included in the first frequency table 41. Indexes from 0 to L−1 are respectively assigned to the L entries in the second part table 432 in order from the head.

The description returns to FIG. 12.

In order that the L low-order symbols included in the second part table 432 are regarded as one representative symbol while a Huffman tree is constructed, the representative symbol frequency estimation unit 352 determines a frequency of occurrence of the representative symbol. The representative symbol frequency estimation unit 352 determines the frequency of occurrence of the representative symbol, based on the frequencies of occurrence of the L low-order symbols. Specifically, the representative symbol frequency estimation unit 352 estimates the frequency of occurrence of the representative symbol by, for example, estimating the sum of the frequencies of occurrence of the L low-order symbols.

Here, an example of calculating an estimated value of the sum of frequencies of occurrence of 224 low-order symbols will be described. The representative symbol frequency estimation unit 352 calculates an estimated value S of the sum of the frequencies of occurrence of the low-order symbols by the following equation (2) using a frequency of occurrence F(i) of a symbol indicated in an entry in the second part table 432 that is identified by an index i.

$$S = \sum_{k=0}^{13} \frac{F(k \times 16) + F(k \times 16 + 15)}{2} \times 16 \qquad \text{Equation 2}$$

In the calculation according to the equation (2), the 224 entries included in the second part table 432 are divided into entries for every 16 indexes from the head, and 14 ranges (hereinafter referred to as index ranges) are set. A k-th index range from the head among the 14 index ranges is referred to as a k-th index range. Note that k is any value from 0 to 13.

The representative symbol frequency estimation unit 352 calculates an estimated value of a frequency of occurrence for each of the 0-th to 13-th index ranges. Specifically, the representative symbol frequency estimation unit 352 multiplies an average value of a frequency of occurrence F ($k\times16$) indicated in the first entry of the k-th index range and a frequency of occurrence F ($k\times16+15$) indicated in the last entry of the k-th index range by the number of symbols in one index range (here, 16), thereby calculating the estimated value of the frequency of occurrence corresponding to the k-th index range. Then, the representative symbol frequency estimation unit 352 calculates the sum of the estimated values of the frequencies of occurrence that correspond to the 0-th to 13-th index ranges, respectively, thereby obtaining an estimated value S of the sum of the frequencies of occurrence of the low-order symbols.

In the calculation according to the equation (2), the number of times of addition required to calculate the estimated value S is reduced by assuming that the frequencies of occurrence corresponding to the respective indexes vary linearly from the head entry to the last entry in each index range. Note that the method of calculating the estimated value S is an example, and other methods may be used. For example, the number of index ranges set by dividing the 224 entries included in the second part table 432 may be appropriately changed in consideration of a calculation amount required to calculate the estimated value S and accuracy of the calculated estimated value S to be estimated.

The representative symbol frequency estimation unit 352 sends the estimated value S of the sum of the frequencies of occurrence of the low-order symbols to the Huffman tree generation unit 324 as a frequency of occurrence of the representative symbol.

The Huffman tree generation unit 324 generates a Huffman tree by using the frequency of occurrence of each of the H non-representative symbols in the first part table 431 and the frequency of occurrence of the representative symbol. Specifically, the Huffman tree generation unit 324 arranges, as leaf nodes, symbols each having a frequency of occurrence larger than 0 among the H non-representative symbols in the first part table 431 and the representative symbol and then performs a Huffman tree generation process. This Huffman tree generation process is similar to the Huffman tree generation process described above with reference to FIG. 3. Specifically, this Huffman tree generation process is the Huffman tree generation process described above with reference to FIG. 3 in which step S11 is replaced with a step of adding, as leaf nodes on the Huffman tree, symbols each having a frequency of occurrence larger than 0 among the H non-representative symbols in the first part table 431 and the representative symbol. The Huffman tree generation unit 324 sends the generated Huffman tree to the code length determination unit 325. Note that in a case where there are M representative symbols, the Huffman tree generation unit 324 generates the Huffman tree, based on frequencies of occurrence of symbols that are larger than 0 among the H non-representative symbols and the M representative symbols.

Figure 16:
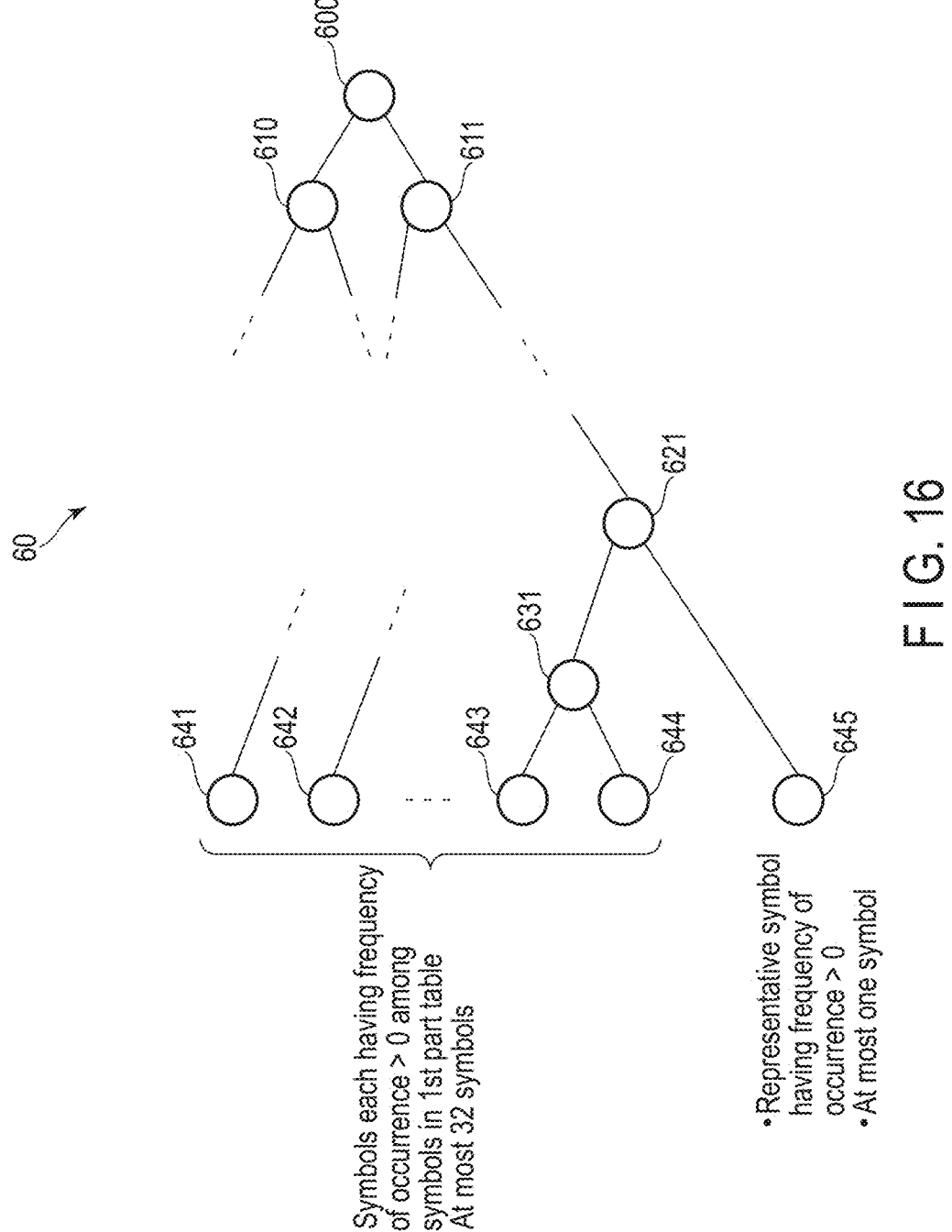
FIG. 16 is a diagram showing an example of a Huffman tree constructed in the variable length coding device according to the first embodiment.

FIG. 16 shows an example of the Huffman tree 60 generated by the Huffman tree generation unit 324. The Huffman tree 60 includes a root node 600, intermediate nodes 610, 611, 621, and 631, first-type leaf nodes 641, 642, 643, and 644, and a second-type leaf node 645.

Each of the first-type leaf nodes 641, 642, 643, and 644 corresponds to a symbol having a frequency of occurrence larger than 0 among the symbols (non-representative symbols) included in the first part table 431. The number of first-type leaf nodes is at most H.

The second-type leaf node 645 corresponds to the representative symbol whose frequency of occurrence is larger than 0. The number of second-type leaf nodes is at most M (here, M=1).

Thus, the number of the symbols on which the Huffman tree generation is performed (i.e., the number of leaf nodes of the Huffman tree to be generated) by the Huffman tree generation unit 324 is at most (H+M). In contrast, as described above, the number of symbols on which the Huffman tree generation is performed by the Huffman tree generation unit 324A of the code table generation unit 32A according to the comparative example is at most N. For example, in a case where N is 256, H is 32, and M is 1, the number of the symbols on which the Huffman tree generation is performed by the Huffman tree generation unit 324 is significantly reduced from at most 256 to at most 33 (=32+1) in the code table generation unit 32 of the present embodiment as compared to the Huffman tree generation unit 324A of the comparative example. Accordingly, in the code table generation unit 32, it is possible to reduce a time period required for the code table generation process or to reduce a circuit scale (for example, the number of gates) for completing the code table generation within a specific time period.

However, as a result of all the symbols included in the second part table 432 being treated as one representative symbol, there is a concern that coding efficiency of dynamic Huffman coding is lowered. In order to address the concern, the H high-order symbols (non-representative symbols) that are included in the first part table 431 and account for most of the frequencies of occurrence are treated as H symbols (that is, H leaf nodes) also on the Huffman tree. Accordingly, accuracy of the dynamic Huffman coding is secured. In other words, the number H of symbols included in the first part table 431 is reduced within a range in which the accuracy of the dynamic Huffman coding can be secured. In addition, the L low-order symbols included in the second part table 432 often have small frequencies of occurrence. Thus, even if a non-optimal code lengths are set for the low-order symbols, influence on the coding efficiency is small.

Therefore, the code table generation unit 32 of the present embodiment can reduce a time period required for the code table generation process or can reduce a circuit scale for completing the code table generation within a specific time, while keeping decrease in the coding efficiency within a practically acceptable range.

The merge symbol count unit 353 counts the number C of symbols in the second part table 432 that have frequencies of occurrence larger than 0, respectively. C is an integer equal to or larger than 0. If the second part table 432 includes no symbol whose frequency of occurrence is larger than 0, C is 0. A symbol in the second part table 432 whose frequency of occurrence is larger than 0 is referred to as a merge symbol. The merge symbol is a symbol to which a variable length code needs to be assigned among the symbols included in the second part table 432. The number C of merge symbols counted by the merge symbol count unit 353 is the number of merge symbols that are represented by the representative symbol. The merge symbol count unit 353 sends the number C of merge symbols to the merge symbol additional code length determination unit 354.

The merge symbol additional code length determination unit 354 determines, for each merge symbol, a code length to be added to the code length of the representative symbol (hereinafter, referred to as an additional code length) by using a subtree that is based on the second part table 432 and the number C of merge symbols. The merge symbol additional code length determination unit 354 sends the additional code length for each of the C merge symbols to the representative symbol expansion unit 327. In addition, the merge symbol additional code length determination unit 354 also sends the maximum value of the additional code lengths of the C merge symbols to the maximum code length restriction unit 326.

A code length of each merge symbol is obtained by adding its additional code length to the code length of the representative symbol. This is equivalent to determining a structure of a subtree having leaf nodes to which the respective merge symbols are assigned, and determining a position on the Huffman tree 60 for the root node of the subtree by the Huffman tree generation process.

FIG. 17 shows an example of a subtree 65 of merge symbols that is used by the merge symbol additional code length determination unit 354. The subtree 65 is a binary tree whose root node is the leaf node 645 of the Huffman tree 60. Here, a case where the number C of merge symbols is five will be exemplified.

The Huffman tree 60 includes the root node 600, the intermediate nodes 611, 621, 630, and 631, the first-type leaf nodes 640, 641, 642, 643, and 644, and the second-type leaf node 645, similarly to the Huffman tree 60 described above with reference to FIG. 16.

Each of the first-type leaf nodes 641, 642, 643, and 644 corresponds to a symbol having a frequency of occurrence larger than 0 among the symbols (non-representative symbols) included in the first part table 431.

The second-type leaf node 645 corresponds to a representative symbol whose frequency of occurrence larger than 0. The second-type leaf node 645 is the root node of the subtree 65. The frequency of occurrence associated with the second-type leaf node 645 is the estimated value S of the sum of the frequencies of occurrence of the merge symbols.

The subtree 65 includes the leaf node 645 of the Huffman tree 60 as its root node and includes intermediate nodes 650, 651, and 660 and leaf nodes 661, 662, 663, 670, and 671. The leaf nodes 661, 662, 663, 670, and 671 correspond to the five merge symbols, respectively.

Thus, a code length of each merge symbol is determined by adding, as an additional code length, a depth (the number of edges) of each of the leaf nodes 661, 662, 663, 670, and 671 starting from the root node (i.e., the leaf node 645) in the subtree 65 to a code length of the representative symbol corresponding to the leaf node 645.

From the viewpoint of reduction in a processing amount, it is desirable that the subtree 65 including C leaf nodes that correspond to C merge symbols, respectively, has a structure in which the additional code length for each merge symbol can be easily obtained by using the number C of merge symbols.

Thus, the merge symbol additional code length determination unit 354 adopts, for example, a balanced binary tree as the structure of the subtree 65. The balanced binary tree is a binary tree in which, for all the leaf nodes, a difference in a depth between the leaf nodes is at most one. Note that a structure other than the balanced binary tree may be used as the subtree 65. The merge symbol additional code length determination unit 354 may determine the structure of the subtree 65, based on the frequencies of occurrence of the C merge symbols. In addition, the merge symbol additional code length determination unit 354 may also determine the structure of the subtree 65 by selecting from tree structures (for example, templates of tree structure) prepared in advance.

When using the balanced binary tree as the structure of the subtree 65, the merge symbol additional code length determination unit 354 determines the additional code length for each merge symbol by the following procedure (A1) and (A2).

(A1) Calculate a minimum integer X that satisfies $2^X \geq C$.

(A2) Set additional code lengths of $(2^X - C)$ merge symbols in ascending order of the indexes on the second part table 432 (that is, in descending order of the frequencies of occurrence) among the C merge symbols to $(X-1)$ bits, and set additional code lengths of the remaining $(2C - 2^X)$ merge symbols to X bits. X is the maximum value of the additional code lengths of the C merge symbols.

In the example shown in FIG. 17, C=5. Thus, in a case where X is calculated according to the above-described procedure, the merge symbol additional code length determination unit 354 calculates X=3 since $2^3 > 5$. Then, the merge symbol additional code length determination unit 354 sets the addition code lengths of three $(=2^3 - 5)$ merge symbols in ascending order of the indexes on the second part table 432 among the five merge symbols (corresponding to the leaf nodes 661, 662, and 663) to 2 (=3−1) bits. In addition, the merge symbol additional code length determination unit 354 sets additional code lengths of the remaining two $(=2 \times 5 - 2^3)$ merge symbols (corresponding to the leaf nodes 670 and 671) to 3 bits. The maximum value of the additional code lengths of the five merge symbols is three.

Here, a function f(K(r)) that derives the maximum value of additional code lengths corresponding to a symbol set will be considered in a case where r is a representative symbol that represents the symbol set and K(r) is the number of symbols having frequencies of occurrence larger than 0 (i.e., the number of merge symbols) among symbols included in the symbol set represented by the representative symbol r. That is, f is a function of K(r). The following equation (3) defines f(K(r)).

$$f(K(r)) = \lceil \log_2(K(r)) \rceil \qquad \text{Equation 3}$$

The merge symbol additional code length determination unit 354 may calculate the maximum value of the additional code lengths of the C merge symbols by this function f(K(r)) in which C is substituted for K(r) (i.e., K(r)=C).

The description returns to FIG. 12.

By using the Huffman tree 60 generated by the Huffman tree generation unit 324, the code length determination unit 325 determines a code length of each of symbols having frequencies of occurrence larger than 0 among the H non-representative symbols (high-order symbols) included in the first part table 431, and a code length of the representative symbol. Hereinafter, in order to make the description easy to understand, an example in which the frequencies of occurrence of all the H non-representative symbols are larger than 0 will be described. Note that in practice, the H non-representative symbols may include a symbol whose frequency of occurrence is 0. In this case, the code length determination unit 325 does not calculate a code length of a symbol whose frequency of occurrence is 0 among the H non-representative symbols.

Specifically, the code length determination unit 325 determines the number of edges passing from a leaf node corresponding to each of the symbols, which include the H non-representative symbols and the representative symbol, to the root node 600 by tracing edges in the Huffman tree 60, as the code length of the symbol. In the example shown in FIG. 17, for example, the code length of the non-representative symbol corresponding to the leaf node 640 is 1 bit. For example, the code length of the non-representative symbol corresponding to the leaf node 643 is 4 bits. In addition, for example, the code length of the representative symbol corresponding to the leaf node 645 is 3 bits.

The code length determination unit 325 sends the determined H combinations of the non-representative symbol and the code length, and the combination of the representative symbol and the code length, to the maximum code length restriction unit 326. Hereinafter, a combination of a non-representative symbol and a code length is also referred to as a <non-representative symbol, code length> pair. A combination of a representative symbol and a code length is also referred to as a <representative symbol, code length> pair.

The maximum code length restriction unit 326 executes a process of restricting a code length corresponding to a symbol to the maximum code length (maximum code length restriction process) by using the maximum value of the additional code lengths sent from the merge symbol additional code length determination unit 354, and the H <non-representative symbol, code length> pairs and the <representative symbol, code length> pair that are sent from the code length determination unit 325. By using the maximum value of the additional code lengths sent from the merge symbol additional code length determination unit 354 and the <representative symbol, code length> pair sent from the code length determination unit 325, the maximum code length restriction unit 326 obtains a combination of the representative symbol, the code length, and the maximum value of the additional code lengths. Hereinafter, the combination of the representative symbol, the code length, and the maximum value of the additional code lengths is also referred to as a <representative symbol, code length, maximum value of additional code lengths> pair.

Figure 18:
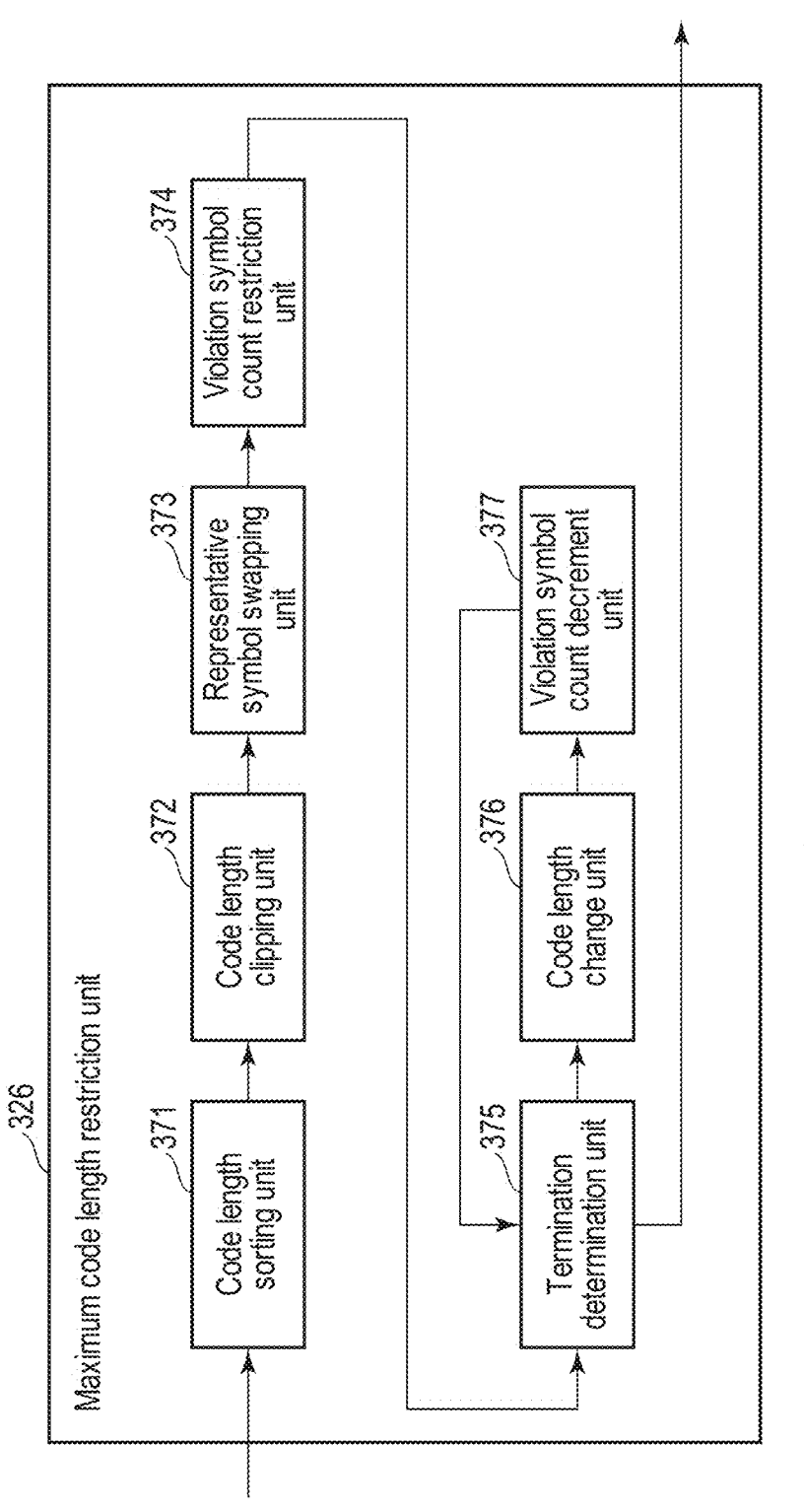
FIG. 18 is a block diagram showing an example of a configuration of a maximum code length restriction unit that is included in the variable length coding device according to the first embodiment.

FIG. 18 is a block diagram showing an example of a configuration of the maximum code length restriction unit 326. The maximum code length restriction unit 326 includes, for example, a code length sorting unit 371, a code length clipping unit 372, a representative symbol swapping unit 373, a violation symbol count calculation unit 374, a termination determination unit 375, a code length change unit 376, and a violation symbol count decrement unit 377.

First, the code length sorting unit 371 sorts the H <non-representative symbol, code length> pairs and the <representative symbol, code length, maximum value of additional code lengths> pair in descending order of the code lengths.

Next, the code length clipping unit 372 changes (i.e., clips) a code length longer than the maximum code length included in the H <non-representative symbol, code length> pairs, to the maximum code length. Specifically, the code length clipping unit 372 identifies all combinations each including a code length longer than the maximum code length, among the H <non-representative symbol, code length> pairs. The code length clipping unit 372 changes the code length included in each of the identified combinations, to the maximum code length. This change causes the H <non-representative symbol, code length> pairs to include non-representative symbols corresponding to illegally short code lengths. In other words, variable length codes assigned based on the H <non-representative symbol, code length> pairs are invalid Huffman codes. Such illegally short code lengths are corrected by the code length change unit 376 to be described later.

Note that in a case where the H <non-representative symbol, code length> pairs do not include any combination including a code length longer than the maximum code length, the code length clipping unit 372 does not perform a process on the H <non-representative symbol, code length> pairs and the <representative symbol, code length, maximum value of additional code lengths> pair.

Next, when the code length of the representative symbol violates the restriction on the maximum code length, the representative symbol swapping unit 373 performs a process of swapping (exchanging) the code lengths between the representative symbol and a non-representative symbol that satisfies a specific condition (swap process). The representative symbol swapping unit 373 determines whether or not the code length of the representative symbol violates the restriction on the maximum code length by using the following inequality (4).

$$\text{Code length of representative symbol} + \text{maximum value of} \atop \text{additional code lengths} > \text{maximum code length} \qquad \text{Inequality (4)}$$

Code lengths of the merge symbols represented by the representative symbol are at most a length obtained by adding the maximum value of the additional code lengths to the code length of the representative symbol. Therefore, when the code length of the representative symbol does not satisfy this inequality, it is guaranteed that the code lengths of all the merge symbols represented by the representative symbol are shorter than or equal to the maximum code length.

In contrast, when the code length of the representative symbol satisfies this inequality, the representative symbol swapping unit 373 executes a process of swapping the code lengths between the representative symbol and the non-representative symbol that satisfies the specific condition. The non-representative symbol that satisfies the specific condition is a non-representative symbol that satisfies the following inequality (5) and has the longest code length.

$$\text{Code length} \leq \text{maximum code length} - \text{maximum value of} \atop \text{additional code lengths} \qquad \text{Inequality (5)}$$

In other words, the representative symbol swapping unit 373 executes the swap process when the code length of the representative symbol is longer than a representative symbol maximum code length.

The representative symbol maximum code length indicates an upper limit of the code length of the representative symbol. The representative symbol maximum code length is set such that the code lengths of all the merge symbols represented by the representative symbol are restricted to the maximum code length. Therefore, the representative symbol maximum code length is obtained by subtracting the maximum value of the additional code lengths from the maximum code length, as shown below in equation (6). Note that the number of the merge symbols represented by the representative symbol is denoted by C.

$$\text{Representative symbol maximum code length} = \text{maximum} \atop \text{code length} - \lceil \log_2(C) \rceil \qquad \text{Equation 6}$$

When the code length of the representative symbol is shorter than or equal to the representative symbol maximum code length, it is guaranteed that the code lengths of all the merge symbols represented by the representative symbol are shorter than or equal to the maximum code length.

In contrast, when the code length of the representative symbol is longer than the representative symbol maximum code length, the code length of at least one of the merge symbols represented by the representative symbol is longer than the maximum code length. Therefore, the representative symbol swapping unit 373 swaps the code length of the representative symbol for the longest code length among the code lengths of the non-representative symbols that are shorter than the representative symbol maximum code length.

More specifically, when the code length of the representative symbol is longer than the representative symbol maximum code length, the representative symbol swapping unit 373 identifies non-representative symbols whose code lengths are shorter than or equal to the representative symbol maximum code length, by using the H <non-representative symbol, code length> pairs. The representative symbol swapping unit 373 further identifies a non-representative symbol having the longest code length (hereinafter referred to as a swap target non-representative symbol) among the non-representative symbols whose code lengths are shorter than or equal to the representative symbol maximum code length. The representative symbol swapping unit 373 swaps the code lengths between the <representative symbol, code length> pair (i.e., <representative symbol, code length, maximum value of additional code lengths> pair) and the <swap target non-representative symbol, code length> pair.

Note that when the code length of the representative symbol is shorter than or equal to the representative symbol maximum code length, the representative symbol swapping unit 373 does not execute a process for the H <non-representative symbol, code length> pairs and the <representative symbol, code length, maximum value of additional code lengths> pair.

Next, the violation symbol count calculation unit 374 calculates the number I of violation symbols, based on the H <non-representative symbol, code length> pairs and the <representative symbol, code length, maximum value of additional code lengths> pair. The number I of violation symbols indicates the number of symbols to which variable length codes cannot be assigned. When the number I of violation symbols is larger than 0, Huffman codes determined based on the H <non-representative symbol, code length> pairs and the <representative symbol, code length, maximum value of additional code lengths> pair are invalid Huffman codes. The violation symbol count calculation unit 374 calculates the number I of violation symbols by the following equation (7).

$$I = \left( \sum_{s \in AllSymbol} 2^{-l(s)} - 1 \right) \times 2^{lmax} \qquad \text{Equation 7}$$

Here, symbol set AllSymbol includes the H non-representative symbols and the representative symbol. lmax is the maximum code length.

Note that the violation symbol count calculation unit 374 may calculate the number I of violation symbols by the following equation (8).

$$I = \left( \sum_{s \in AllSymbol} 2^{-clip(l(s))} - 1 \right) \times 2^{lmax} \qquad \text{Equation 8}$$

The equation (8) represents an equation of deriving the number I of violation symbols that includes the clipping of the code lengths of the non-representative symbols executed by the code length clipping unit 372. clip(l(s)) is a function of clipping code length (l(s)) of symbol s to maximum code length lmax. When code length l(s) is longer than maximum code length lmax, clip(l(s)) is maximum code length lmax (i.e., clip(l(s))=lmax). When code length l(s) is shorter than or equal to maximum code length lmax, clip(l(s)) is code length l(s) (i.e., clip(l(s))=l(s)).

The termination determination unit 375 determines whether or not to terminate the maximum code length restriction process in the maximum code length restriction unit 326, based on the number I of violation symbols. Specifically, when the number I of violation symbols is 0, the termination determination unit 375 determines that the maximum code length restriction process is terminated. When the number I of violation symbols is larger than 0, the termination determination unit 375 determines that the maximum code length restriction process is continued.

When the termination determination unit 375 has determined that the maximum code length restriction process is continued, the following processes are executed by the code length change unit 376 and the violation symbol count decrement unit 377.

The code length change unit 376 changes the code lengths of the non-representative symbols such that the number I of violation symbols decreases by using the H <non-representative symbol, code length> pairs. Specifically, the code length change unit 376 changes the code lengths of the non-representative symbols according to the following steps (B1) to (B4).

(B1) Select a violation symbol s by using the H <non-representative symbol, code length> pairs. The violation symbol s is a non-representative symbol that corresponds to a code length equal to the maximum code length. The violation symbol s is, for example, a symbol whose code length was longer than the maximum code length but has been changed to the maximum code length by the code length clipping unit 372.

(B2) Select a non-representative symbol s' whose code length is shorter than the maximum code length and is longer by using the H <non-representative symbol, code length> pairs.

(B3) Change the code length l(s) of the violation symbol s to a length that is obtained by adding one to the code length l(s') of the non-representative symbol s'.

(B4) Change the code length l(s') of the non-representative symbol s' by incrementing the length by one.

Note that the steps (B3) and (B4) may be replaced with other steps that achieves similar results with respect to changing the code lengths. For example, the steps (B3) and (B4) may be replaced with the following steps (B3') and (B4').

(B3') Change the code length l(s') of the non-representative symbol s' by incrementing the length by one.

(B4') Change the code length l(s) of the violation symbol s to a length that is equal to the changed code length l(s') of the non-representative symbol s'.

After the code length l(s) of the violation symbol s and the code length l(s') of the non-representative symbol s' are changed by the code length change unit 376, the violation symbol count decrement unit 377 decrements the number I of violation symbols by one thereby updating the number I of violation symbols.

The termination determination unit 375 determines whether or not to terminate the maximum code length restriction process in the maximum code length restriction unit 326, based on the updated number I of violation symbols. Therefore, the processes of the code length change unit 376 and the violation symbol count decrement unit 377 are repeated until the number I of violation symbols becomes 0. When the number I of violation symbols has reached 0, the H <non-representative symbol, code length> pairs and the <representative symbol, code length> pair that have been changed to code lengths from which valid Huffman codes are generated, are obtained. The maximum code length restriction unit 326 sends the obtained H <non-representative symbol, code length> pairs and <representative symbol, code length> pair to the representative symbol expansion unit 327.

A specific example in which code lengths are restricted to the maximum code length in the maximum code length restriction unit 326 will be described with reference to FIG. 19 to FIG. 23. Here, it is assumed that the maximum code length is 4 bits.

Figure 19:
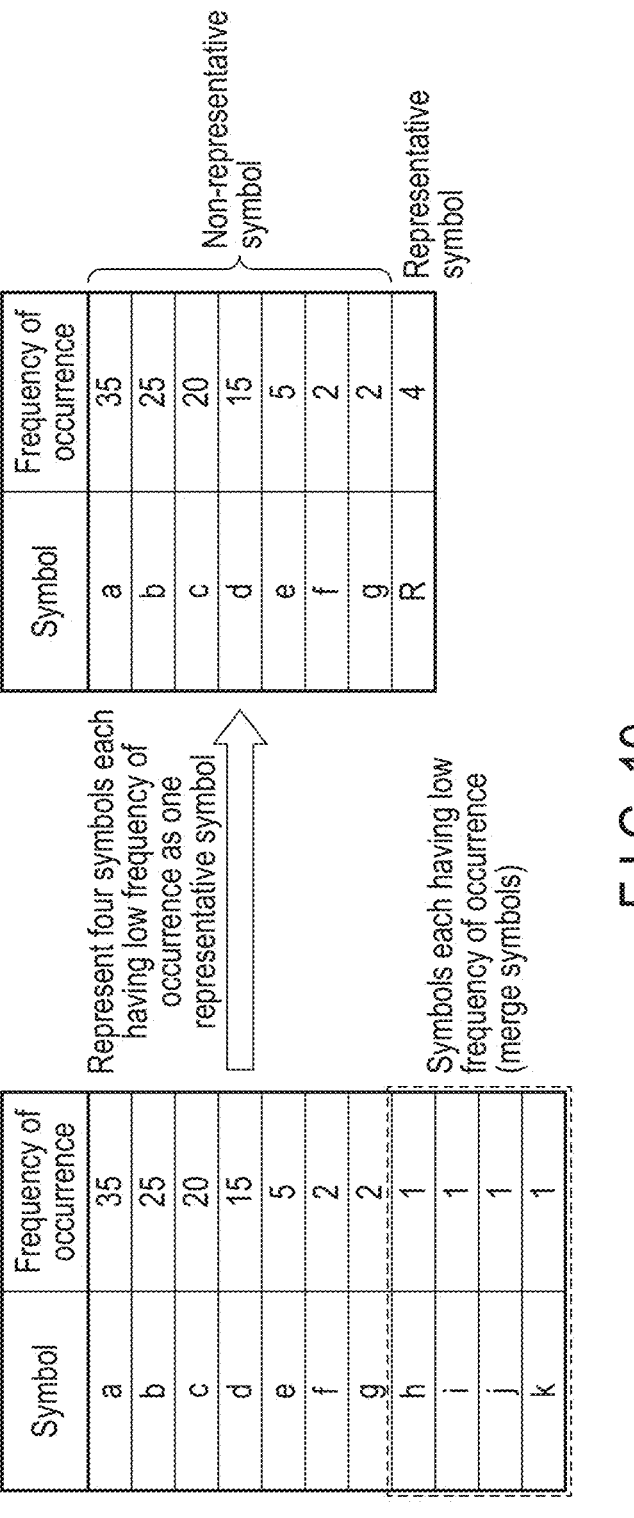
FIG. 19 is a diagram showing an example of non-representative symbols and a representative symbol that are used in the variable length coding device according to the first embodiment.

FIG. 19 shows an example of non-representative symbols and a representative symbol determined based on frequencies of occurrence. In the example shown in FIG. 19, the bottom four symbols "h", "i", "j", and "k" among symbols arranged in descending order of frequencies of occurrence are represented by a representative symbol R. In other words, the four symbols "h", "i", "j", and "k" are merge symbols. The sum of the frequencies of occurrence of the four merge symbols "h", "i", "j", and "k", i.e., four is set as a frequency of occurrence of the representative symbol "R". The remaining seven symbols "a", "b", "c", "d", "e", "f", and "g" (hereinafter referred to as non-representative symbols "a" to "g") are non-representative symbols.

FIG. 20 shows an example of a Huffman tree 70 corresponding to the non-representative symbols and the representative symbol shown in FIG. 19. The Huffman tree 70 is generated based on the frequency of occurrence of each of the seven non-representative symbols "a" to "g" and the frequency of occurrence of the representative symbol "R". Specifically, the Huffman tree 70 is generated by, for example, the Huffman tree generation process described above with reference to FIG. 3 in which step S11 is replaced with a step of adding, as leaf nodes, the seven non-representative symbols "a" to "g" and the representative symbol "R".

Note that in the description on the process in the maximum code length restriction unit 326, an example in which a structure of a Huffman tree is shown and symbols are assigned to leaf nodes is illustrated in order to make change of code lengths easy to understand. Then, even when an example in which a structure of a Huffman tree is shown and symbols are assigned to leaf nodes is illustrated, the maximum code length restriction unit 326 may not actually manage the structure of the Huffman tree and the relationship between each leaf node and each symbol. The maximum code length restriction unit 326 manages, for example, the <representative symbol, code length> pair and a list of the <non-representative symbol, code length> pairs, thereby performing the selection of symbols and the change of code lengths.

In the generated Huffman tree 70, the non-representative symbol "a" is assigned to a leaf node 712. The non-representative symbol "b" is assigned to a leaf node 722. The non-representative symbols "c" and "d" are assigned to leaf nodes 742 and 743, respectively. The non-representative symbol "e" is assigned to a leaf node 753. The non-representative symbols "f" and "g" are assigned to leaf nodes 765 and 766, respectively. The representative symbol "R" is assigned to a leaf node 741.

A code length of the non-representative symbol "a" is 1 bit. A code length of the non-representative symbol "b" is 2 bits. A code length of the representative symbol "R" and code lengths of the two non-representative symbols "c" and "d" are 4 bits. A code length of the non-representative symbol "e" is 5 bits. Code lengths of the two non-representative symbols "f" and "g" are 6 bits.

Note that the edges and nodes represented by dotted lines indicate a subtree 75 corresponding to the merge symbols "h", "i", "j", and "k" (hereinafter referred to as merge symbols "h" to "k"). The subtree 75 is a subtree having the representative symbol "R" as its root node and having each of the merge symbols "h" to "k" as a leaf node. The merge symbols "h" to "k" are assigned to leaf nodes 761, 762, 763, and 764, respectively. A code length of each of the merge symbols "h" to "k" is 6 bits. Therefore, for these merge symbols "h" to "k", the maximum value of the code lengths which are to be added to the code length of the representative symbol "R" (i.e., the maximum value of additional code lengths) is two (=6−4).

In the Huffman Tree 70, the code lengths of the non-representative symbols "e", "f", and "g" are longer than the maximum code length. Accordingly, the code length clipping unit 372 changes the code lengths of the non-representative symbols "e", "f", and "g" to the maximum code length.

Furthermore, in the Huffman tree 70, a length obtained by adding the maximum value of the additional code lengths to the code length of the representative symbol "R" is longer than the maximum code length (that is, 4+2 >4). Accordingly, the representative symbol swapping unit 373 selects the non-representative symbol "b" having the longest code length among the non-representative symbols "a" and "b" each having a code length shorter than or equal to a representative symbol maximum code length. The representative symbol maximum code length is obtained by subtracting the maximum value of the additional code lengths from the maximum code length (=4−2=2). The representative symbol swapping unit 373 exchanges the code lengths between the representative symbol "R" and the selected non-representative symbol "b".

FIG. 21 shows a modified example of the Huffman tree 70 shown in FIG. 20. This modified example shows the Huffman tree 70 in which the code length clipping unit 372 has changed the code lengths of the non-representative symbols "e", "f", and "g" to the maximum code length and the representative symbol swapping unit 373 has exchanged the code lengths between the representative symbol "R" and the non-representative symbol "b" as described above.

In other words, in the modified Huffman tree 70, the code lengths of the non-representative symbols "e", "f", and "g" (leaf nodes 744, 745, and 746) are set to the maximum code length (=4). The code length of the representative symbol "R" is set to the original code length of the non-representative symbol "b" (=2). The code length of the non-representative symbol "b" is set to the original code length of the representative symbol "R" (=4). As a result, the merge symbols "h" to "k" represented by the representative symbol "R" each have a code length shorter than or equal to the maximum code length, thus satisfying the restriction on the maximum code length.

Note that the leaf nodes 745 and 746 are nodes that cannot be traced from the root node 701. Consequently, the non-representative symbols "f" and "g" assigned to the leaf nodes 745 and 746, respectively, are violation symbols.

In this case, the violation symbol count calculation unit 374 calculates the number I of violation symbols according to the above-described equation (7) (or equation (8)) as described below.

$$I = (1/16 \times 6 + 1/4 + 1/2 - 1) \times 16 = 2$$

Therefore, in the Huffman tree 70 shown in FIG. 21, the number I of violation symbols is two. Since the calculated number I of violation symbols is larger than 0, the code length change unit 376 changes the code lengths of the non-representative symbols until the number I of violation symbols becomes 0.

Specifically, the code length change unit 376 selects, for example, the violation symbol "f". Then, the code length change unit 376 selects the non-representative symbol "a" whose code length is shorter than the maximum code length. Note that when there are multiple non-representative symbols whose code lengths are shorter than the maximum code length, the code length change unit 376 selects the first non-representative symbol from the multiple non-representative symbols in the order of longer code lengths.

The code length change unit 376 changes the code length of the violation symbol "f" to a length obtained by adding one to the code length of the non-representative symbol "a". Then, the code length modification unit 376 increments the code length of the non-representative symbol "a" by one. As a result, the code length of the violation symbol "f" and the code length of the non-representative symbol "a" become 2 bits.

Next, the violation symbol count decrement unit 377 decrements the number I of violation symbols by one, thereby updating the number I of violation symbols with one. Since the updated number I of violation symbols is larger than 0, the termination determination unit 375 decides to further change the code lengths of the non-representative symbols.

Figure 22:
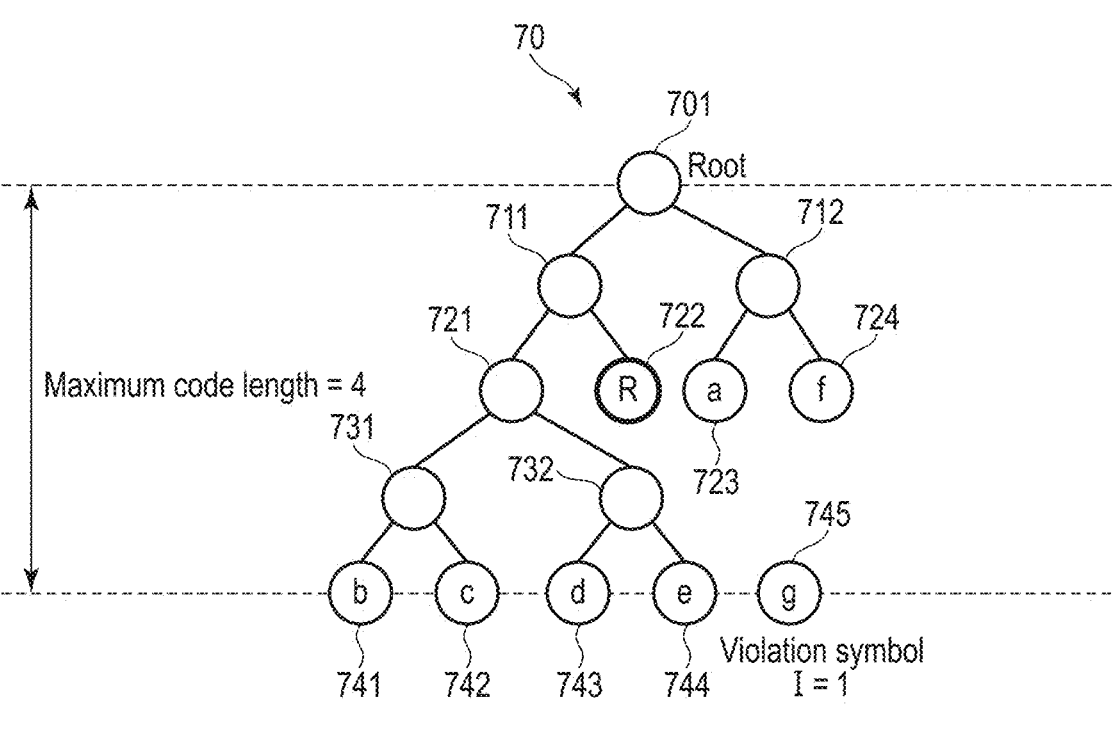
FIG. 22 is a diagram showing a modified example of the Huffman tree of FIG. 21 in the variable length coding device according to the first embodiment.

FIG. 22 shows a modified example of the Huffman tree 70 shown in FIG. 21. This modified example shows the Huffman tree 70 in which the code length change unit 376 has changed the code lengths of the non-representative symbol "a" and the violation symbol "f" as described above. In other words, in the modified Huffman Tree 70, the code length of the non-representative symbol "a" and the code length of the violation symbol "f" are set to 2 bits. The non-representative symbol "g" is still a violation symbol.

The code length change unit 376 selects the violation symbol "g" in response to the decision of further changing the code lengths of the non-representative symbols by the termination determination unit 375. Then, the code length change unit 376 selects the non-representative symbol "f" having the longest code length among the non-representative symbols "a" and "f" whose code lengths are shorter than the maximum code length. In this case, since both the code lengths of the non-representative symbols "a" and "f" are 2 bits, the code length change unit 376 may select the non-representative symbol "a". When there are multiple non-representative symbols each having the longest code length among non-representative symbols whose code lengths are shorter than the maximum code length, the code length change unit 376 selects one of the multiple non-representative symbols under specific rules. In the following descriptions, it is assumed that the code length change unit 376 has selected the non-representative symbol "f".

The code length change unit 376 changes the code length of the selected violation symbol "g" to a length obtained by adding one to the code length of the selected non-representative symbol "f". Then, the code length change unit 376 increments the code length of the non-representative symbol "f" by one. As a result, the code length of the violation symbol "g" and the code length of the non-representative symbol "f" become 3 bits.

Next, the violation symbol count decrement unit 377 decrements the number I of violation symbols by one, thereby updating the number I of violation symbols with 0. Since the updated number I of violation symbols is 0, the termination determination unit 375 decides to terminate the change of the code lengths of the non-representative symbols.

Figure 23:
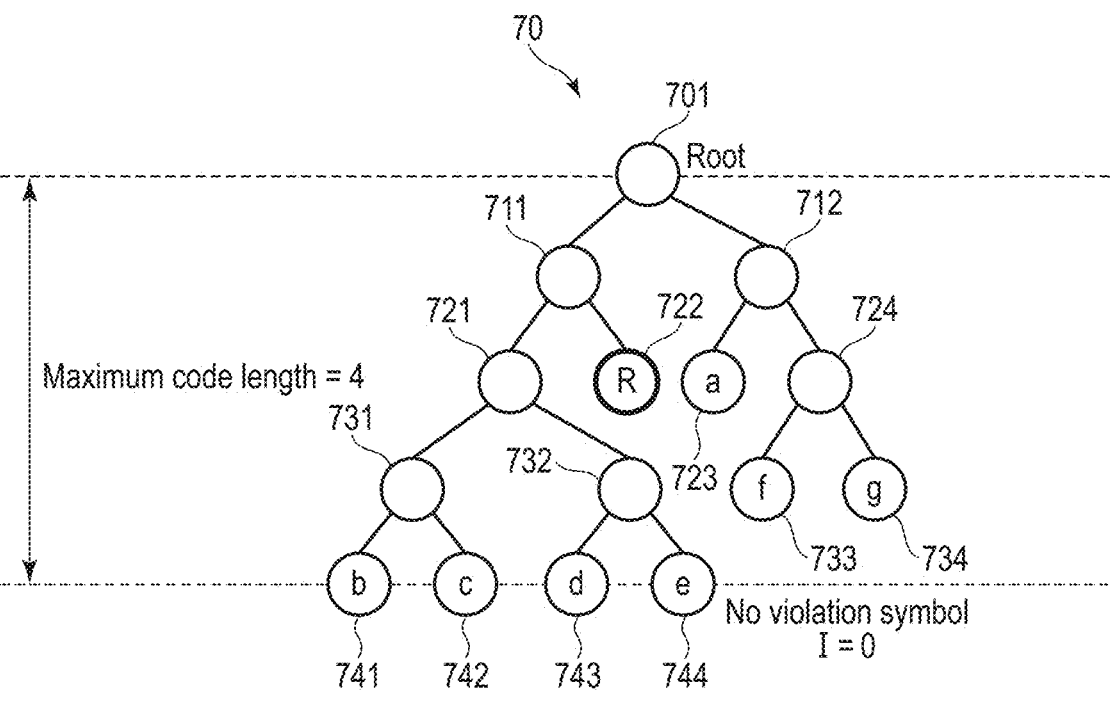
FIG. 23 is a diagram showing a modified example of the Huffman tree of FIG. 22 in the variable length coding device according to the first embodiment.

FIG. 23 shows a modified example of the Huffman tree 70 shown in FIG. 22. This modified example shows the Huffman tree 70 in which the code length change unit 376 has changed the code lengths of the non-representative symbol "f" and the violation symbol "g" as described above. In other words, in the modified Huffman tree 70, the code length of the non-representative symbol "f" and the code length of the violation symbol "g" are set to 3 bits. In addition, this Huffman tree 70 has no violation symbols.

This Huffman tree 70 is a valid Huffman tree and every intermediate node of the Huffman tree 70 has two child nodes. Therefore, Huffman codes determined based on the Huffman tree 70 are valid Huffman codes that satisfy Kraft's inequality and have no redundant code assignment (that is, K=1). In other words, the Huffman codes determined based on the Huffman tree 70 are perfect codes.

An example of the procedure of the maximum code length restriction process will be described with reference to FIG. 24 and FIG. 25.

FIG. 24 is a flowchart showing an example of the procedure of the maximum code length restriction process executed in the maximum code length restriction unit 326. The maximum code length restriction unit 326 executes the maximum code length restriction process for the H <non-representative symbol, code length> pairs and the <representative symbol, code length> pair sent from the code length determination unit 325.

First, the maximum code length restriction unit 326 changes the code lengths of all non-representative symbols that are longer than the maximum code length, to the maximum code length (step S301). Next, the maximum code length restriction unit 326 determines whether or not the code length of the representative symbol is longer than the representative symbol maximum code length (step S302). The representative symbol maximum code length is a length obtained by subtracting the maximum value of the additional code lengths from the maximum code length.

When the code length of the representative symbol is longer than the representative symbol maximum code length (Yes in step S302), the maximum code length restriction unit 326 selects a non-representative symbol having the longest code length among the non-representative symbols each having a code length shorter than or equal to the representative symbol maximum code length (step S303). The maximum code length restriction unit 326 swaps the code lengths between the selected non-representative symbol and the representative symbol (step S304) and proceeds to step S305.

When the code length of the representative symbol is shorter than or equal to the representative symbol maximum code length (No in step S302), the process by the maximum code length restriction unit 326 proceeds to step S305.

Next, the maximum code length restriction unit 326 calculates the number I of violation symbols according to the above-described equation (7) (or equation (8)) (step S305).

The maximum code length restriction unit 326 determines whether or not the calculated number I of violation symbols is 0 (step S306). The number I of violation symbols larger than 0 indicates that Huffman codes assigned based on the current code length of each symbol are invalid Huffman codes.

When the number I of violation symbols is larger than 0 (No in step S306), the maximum code length restriction unit 326 executes a first code length change process (step S307). The first code length change process is a process of changing a code length of one violation symbol to a code length shorter than or equal to the maximum code length. A specific procedure of the first code length change process will be described later with reference to a flowchart of FIG. 25.

Next, the maximum code length restriction unit 326 decrements the number I of violation symbols by one (step S308). That is, the maximum code length restriction unit 326 subtracts one from the number I of violation symbols. Then, the process by the maximum code length restriction unit 326 returns to step S306 of determining whether or not the number I of violation symbols is 0. Therefore, the maximum code length restriction unit 326 repeats step S307 of executing the first code length change process and step S308 of decrementing the number I of violation symbols, until the number I of violation symbols becomes 0.

When the number I of violation symbols is 0 (Yes in step S306), the maximum code length restriction unit 326 ends the maximum code length restriction process.

With the above maximum code length restriction process, the maximum code length restriction unit 326 can restrict the code lengths of the non-representative symbols to code lengths that are shorter than or equal to the maximum code length, and restrict the code length of the representative symbol to a code length that is shorter than or equal to the representative symbol maximum code length. By restricting the code length of the representative symbol to the code length shorter than or equal to the representative symbol maximum code length, the code lengths of the symbols represented by the representative symbol (i.e., the code lengths of the merge symbols) can be restricted to code lengths that are shorter than or equal to the maximum code length.

FIG. 25 is a flowchart showing an example of the procedure of the first code length restriction process executed in the maximum code length restriction unit 326. The first code length change process corresponds to step S307 of the maximum code length restriction process described above with reference to FIG. 24. The maximum code length restriction unit 326 executes the first code length change process when the non-representative symbols include one or more violation symbols.

First, the maximum code length restriction unit 326 selects a non-representative symbol s' having the longest code length among the non-representative symbols each having a code length shorter than the maximum code length (step S41). The maximum code length restriction unit 326 selects one violation symbol from the one or more violation symbols (step S42). Specifically, the maximum code length restriction unit 326 selects one non-representative symbol having a code length equal to the maximum code length, as the violation symbol. The maximum code length restriction unit 326 changes the code length of the selected violation symbol to a length obtained by adding one to the code length l(s') of the non-representative symbol s' (step S43). Then, the maximum code length restriction unit 326 increments the code length l(s') of the non-representative symbol s' by one (step S44) and ends the first code length change process. That is, the maximum code length restriction unit 326 adds one to the code length l(s') of the non-representative symbol s' and ends the first code length change process.

The above-described first code length change process corresponds to the operation in which the maximum code length restriction unit 326 changes the leaf node corresponding to the non-representative symbol s' to an intermediate node, and assigns the non-representative symbol s' and the violation symbol to two leaf nodes, respectively, which have the intermediate node as their parent. In this operation, no leaf node to which no symbol is assigned is generated. That is, no redundant leaf node is generated. For this reason, the maximum code length restriction unit 326 can guarantee that the Huffman codes assigned based on the code length of each symbol are perfect codes when the maximum code length restriction process including the first code length change process has been completed. Therefore, the maximum code length restriction unit 326 can reduce the processing time and the processing resources as compared to, for example, the maximum code length restriction unit 326A of the comparative example, which additionally executes a process of merging a binary tree having a redundant leaf node. Furthermore, since the maximum code length restriction process is executed on the representative symbol that represents the merge symbols, the number of symbols handled in the maximum code length restriction process can be significantly reduced. Therefore, the processing time and the processing resources can also be reduced by the reduction in the number of symbols.

The description returns to FIG. 12.

The representative symbol expansion unit 327 receives the H <non-representative symbol, code length> pairs and the <representative symbol, code length> pair for which the maximum code length restriction process has been completed, from the maximum code length restriction unit 326. The representative symbol expansion unit 327 receives the C <merge symbol, additional code length> pairs from the merge symbol additional code length determination unit 354. The representative symbol expansion unit 327 determines the code length of each of the C merge symbols by using the received <representative symbol, code length> pair and the C <merge symbol, additional code length> pairs.

The representative symbol expansion unit 327 determines the code length of each of the C merge symbols by using the code length of the representative symbol and the C additional code lengths that correspond to the C merge symbols, respectively. Specifically, for each of the C merge symbols, the representative symbol expansion unit 327 adds an additional code length corresponding to a merge symbol to the code length of the representative symbol, thereby determining the code length of the merge symbol. The representative symbol expansion unit 327 sends a list including the H <non-representative symbol, code length> pairs and C <merge symbol, code length> pairs, to a code assignment unit 328. Note that the H <non-representative symbol, code length> pairs received from the maximum code length restriction unit 326 are sent to the code assignment unit 328 as they are.

The code assignment unit 328 generates a code table according to, for example, the canonical Huffman coding by using the list including the H <non-representative symbol, code length> pairs and the C <merge symbol, code length> pairs sent by the representative symbol expansion unit 327. The canonical Huffman coding is capable of determining a code bit string (variable length code) to be assigned to each of symbols by using only code lengths of the symbols. In the canonical Huffman coding, a code bit string is assigned to each symbol according to the following rules (C1) and (C2) after sorting the list by using the code lengths as the first key and using the symbol numbers as the second key.

(C1) A code bit string to be assigned to a symbol having a short code length precedes, in lexicographic order, a code bit string to be assigned to a symbol having a long code length.

(C2) For any two symbols whose code lengths are equal, a code bit string to be assigned to one of the two symbols preceding in symbol order precedes, in the lexicographic order, a code bit string to be assigned to the other of the two symbols succeeding in the symbol order.

For example, in order to determine the lexicographic order of the code bit strings, the lexicographic order of bit values "0" and "1" is defined as an order of "0" and "1". In this case, each bit value included in a code bit string and each bit value included in another code bit string are compared in order from the higher bit to determine the order (bit order) of the corresponding bit values, thereby determining the lexicographic order of the code bit strings.

More specifically, for example, "1'b0", "2'b10", "3'b110", and "3'b111" are four code bit strings arranged in the lexicographic order. Note that a data string including at least one bit value of 0 or 1 subsequent to "X'b" indicates a bit data string of X bits. Thus, in these four code bit strings, the 1-bit code bit string "1'b0" precedes the 2-bit code bit string "2'b10" in the bit order of the most significant bits. The 2-bit code bit string "2'b10" precedes the 3-bit code bit string "3'b110" in the bit order of the next most significant bits. The 3-bit code bit string "3'b110" precedes the 3-bit code bit string "3'b111" in the bit order of the least significant bits.

FIG. 26 shows an example of a pseudo-program for the code assignment unit 328 to assign a code bit string to a symbol. In the pseudo-program, a variable "code" is used for calculating a code bit string to be assigned to a symbol.

First, the code assignment unit 328 sets the variable "code" to 0 (=1'b0). When code bit strings are to be assigned to symbols, respectively, the number of bits of the variable "code" initially depends on a minimum code length of code lengths that are associated with the symbols, respectively.

Next, in one while loop, the code assignment unit 328 determines a code bit string to be assigned to one symbol in ascending code length order, and in specific symbol order in the case of the same code length.

For example, in a first while loop, the code assignment unit 328 selects, as a target to which a code bit string is assigned, a symbol that has the shortest code length and precedes, in specific symbol order, another symbol having the same code length, if any. Then, the code assignment unit 328 assigns the variable "code" (=1'b0) as a code bit string of the selected symbol. As described above, the number of bits of the variable "code" assigned first depends on the minimum code length. In this example, it is assumed that the minimum code length is one. Then, the code assignment unit 328 performs a shift operation of shifting a value that is obtained by adding one to the variable "code", to the left by the number of bits obtained by subtracting the code length of the current symbol from the code length of the next symbol, and sets the value obtained by the shift operation as the variable "code". For example, in a case where the number of bits obtained by subtracting the code length of the current symbol from the code length of the next symbol is one, a value 2'b10 obtained by shifting 1'b1 that is a value obtained by adding one to the variable "code" (=1'b0), to the left by 1 bit is set as the variable "code".

Furthermore, for example, in a second while loop, the code assignment unit 328 selects, as a target to which a code bit string is to be assigned, a symbol that has the second shortest code length, or a symbol has the shortest code length and is the second in the specific symbol order when there is another symbol having the same code length. The code assignment unit 328 assigns the variable "code" (=2'b10) as a code bit string of the selected symbol. Then, the code assignment unit 328 performs a shift operation of shifting a value that is obtained by adding one to the variable "code", to the left by the number of bits obtained by subtracting the code length of the current symbol from the code length of the next symbol, and sets the value obtained by the shift operation as the variable "code". For example, in a case where the number of bits obtained by subtracting the code length of the current symbol from the code length of the next symbol is one, a value 3'b110 obtained by shifting 2'b11 that is a value obtained by adding one to the variable "code" (=2'b10), to the left by 1 bit is set as the variable "code".

By performing such loop processing, the code assignment unit 328 can assign a code bit string to each of the symbols by using the relationship in order between the symbols and using the code lengths corresponding to the respective symbols. In other words, in a case where the relationship in order between the symbols and the code lengths of the respective symbols have been determined, the code assignment unit 328 can uniquely determine a code bit string to be assigned to each of the symbols.

This indicates that, in a case where compressed data output by the variable length coding unit 33 includes, as a header, the code lengths that have been arranged in predetermined order and encoded, a code table (decoding table) to be used for decoding in the decompressor can be restored from the code lengths. By encoding the code lengths arranged in order of the symbols, a code amount overhead of the compressed data can be greatly reduced as compared with a case of encoding the code bit strings themselves.

The code assignment unit 328 sends the code table indicative of the code bit string assigned to each symbol to the variable length coding unit 33.

As described above, the variable length coding unit 33 converts the symbols sent from the buffer unit 31 into variable length codes by using the code table sent by the code table generation unit 32, and outputs the variable length codes as compressed data.

With the above configuration, the variable length coding device 15 can reduce the processing time and the processing resources when assigning a variable length code that has a code length shorter than or equal to the maximum code length and is a perfect code, to a symbol. Specifically, in the maximum code length restriction process, the maximum code length restriction unit 326 restricts a code length of each symbol to a code length shorter than or equal to the maximum code length while maintaining Huffman codes to be assigned based on the code length of each symbol being perfect codes. Therefore, the maximum code length restriction unit 326 can guarantee that the Huffman codes to be assigned based on the code length of each symbol are perfect codes when the maximum code length restriction process has been completed. Therefore, the maximum code length restriction unit 326 can reduce the processing time and the processing resources as compared to, for example, the maximum code length restriction unit 326A of the comparative example, which additionally executes a process of merging a binary tree having a redundant leaf node.

Second Embodiment

When the code length of the representative symbol is longer than the representative symbol maximum code length, the maximum code length restriction unit 326 of the first embodiment swaps (exchanges) the code lengths between the representative symbol and a non-representative symbol that satisfies a condition that the code length of the non-representative symbol is shorter than or equal to the representative symbol maximum code length.

However, when the code length of the representative symbol is longer than the representative symbol maximum code length, there is no non-representative symbol that satisfies the condition that its code length is shorter than or equal to the representative symbol maximum code length, in some cases. A maximum code length restriction unit 326 according to a second embodiment is further configured to change the code lengths of the representative and non-representative symbols in order to restrict (limit) the code length of the representative symbol to the representative symbol maximum code length in such cases.

A configuration of the variable length coding device 15 according to the second embodiment is similar to that of the variable length coding device 15 of the first embodiment. The variable length coding device 15 of the second embodiment is different from the variable length coding device 15 of the first embodiment in terms of a configuration that changes the code lengths of the representative and non-representative symbols being added in order to restrict the code length of the representative symbol to the representative symbol maximum code length in the above-described cases. Hereinafter, the difference from the first embodiment will be mainly described.

A case where when the code length of the representative symbol is longer than the representative symbol maximum code length, there is no non-representative symbol satisfying the condition that its code length is shorter than or equal to the representative symbol maximum code length will be specifically described with reference to FIG. 27 and FIG. 28.

FIG. 27 shows an example of non-representative symbols and a representative symbol determined based on frequencies of occurrence by the symbol merge unit 323 of the variable length coding device 15. In the example shown in FIG. 27, symbols are arranged in descending order of the frequencies of occurrence. Specifically, a frequency of occurrence of each of symbols "g" and "f" is eight. A frequency of occurrence of each of symbols "e" and "d" is seven. A frequency of occurrence of each of symbols "c" and "b" is six. A frequency of occurrence of a symbol "a" is five. A frequency of occurrence of each of symbols "h", "i", "j", and "k" is one.

The bottom four symbols "h", "i", "j", and "k are represented by one representative symbol R among the symbols in descending order of the frequencies of occurrence. In other words, the four symbols "h", "i", "j", and "k" are merge symbols. The sum of the frequencies of occurrence of the four merge symbols "h", "i", "j", and "k", i.e., four is set as a frequency of occurrence of the representative symbol "R". The remaining seven symbols "a", "b", "c", "d", "e", "f", and "g" are non-representative symbols (hereinafter referred to as non-representative symbols a" to "g").

FIG. 28 shows an example of a Huffman tree 8A generated by the Huffman tree generation unit 324 of the variable length coding device 15. The Huffman tree 8A corresponds to the non-representative symbols and the representative symbol shown in FIG. 27. Here, it is assumed that the maximum code length is 4 bits.

The Huffman tree 8A is generated based on the frequency of occurrence of each of the seven non-representative symbols "a" to "g" and the frequency of occurrence of the representative symbol "R". Specifically, the Huffman tree 8A is generated by, for example, the Huffman tree generation process described above with reference to FIG. 3 in which step S11 is replaced with a step of adding, as leaf nodes, the seven non-representative symbols "a" to "g" and the representative symbol "R".

In the generated Huffman tree 8A, a code length of each of the non-representative symbols "a" to "g" is 3 bits. In addition, a code length of the representative symbol "R" is 3 bits.

Note that the edges and nodes represented by dotted lines indicate a subtree 8B corresponding to the merge symbols "h", "i", "j", and "k" (hereinafter referred to as merge symbols "h" to "k"). The subtree 8B is a subtree having the representative symbol "R" as its root node and having each of the merge symbols "h" to "k" as a leaf node. A code length of each of the merge symbols "h" to "k" is 5 bits. Therefore, for these merge symbols "h" to "k", the maximum value of the code lengths which are to be added to the code length of the representative symbol "R" (i.e., the maximum value of additional code lengths) is two.

In the Huffman tree 8A, a length obtained by adding the maximum value of the additional code lengths to the code length of the representative symbol "R" is longer than the maximum code length (i.e., 3+2 >4). Accordingly, the representative symbol swapping unit 373 attempts to select a non-representative symbol having a code length shorter than or equal to the representative symbol maximum code length that is obtained by subtracting the maximum value of the additional code lengths from the maximum code length (=4−2=2). In the Huffman tree 8A, however, there is no non-representative symbol satisfying the condition that its code length is shorter than or equal to the representative symbol maximum code length.

Therefore, the Huffman tree 8A corresponds to the case where when the code length of the representative symbol is longer than the representative symbol maximum code length, there is no non-representative symbol satisfying the condition that its code length is shorter than or equal to the representative symbol maximum code length.

The maximum code length restriction unit 326 of the variable length coding device 15 executes a process of restricting (limiting) code lengths corresponding to respective symbols to the maximum code length by using the maximum value of additional code lengths sent from the merge symbol additional code length determination unit 354, and H <non-representative symbol, code length> pairs and one <representative symbol, code length> pair sent from the code length determination unit 325 (i.e., maximum code length restriction process). That is, the maximum code length restriction unit 326 executes the maximum code length restriction process by using the H <non-representative symbol, code length> pairs and one <representative symbol, code length, maximum value of additional code lengths> pair.

FIG. 29 is a block diagram showing an example of a configuration of the maximum code length restriction unit 326. The maximum code length restriction unit 326 includes, for example, a code length sorting unit 371, a code length clipping unit 372, a representative symbol swapping unit 373, a second representative symbol swapping unit 381, a sibling symbol code length change unit 382, a representative symbol code length change unit 383, a representative symbol restriction process termination determination unit 384, a violation symbol count calculation unit 374, a termination determination unit 375, a code length change unit 376, and a violation symbol count decrement unit 377.

The operations of the code length sorting unit 371, the code length clipping unit 372, the representative symbol swapping unit 373, the violation symbol count calculation unit 374, the termination determination unit 375, the code length change unit 376, and the violation symbol count decrement unit 377 have been described above with reference to FIG. 18. More specifically, the operation in a case where the representative symbol swapping unit 373 swaps the code lengths between the representative symbol and a non-representative symbol which is shorter than the representative symbol maximum code length, has been described as the maximum code length restriction process in the first embodiment.

When the code length of the representative symbol is longer than the representative symbol maximum code length, the representative symbol swapping unit 373 does not swap the code lengths between the representative symbol and a non-representative symbol unless there is a non-representative symbol having a code length shorter than or equal to the representative symbol maximum code length. Hereinafter, an operation in a case where when the code length of the representative symbol is longer than the representative symbol maximum code length, there is no non-representative symbol whose code length is shorter than or equal to the representative symbol maximum code length will be described.

When the code length of the representative symbol is longer than the representative symbol maximum code length, the second representative symbol swapping unit 381 swaps the code length of the representative symbol for the shortest code length among the code lengths of the non-representative symbols shorter than the code length of the representative symbol (i.e., swaps the code lengths between the representative symbol and the non-representative symbol). Note that when the code length of the representative symbol is longer than the representative symbol maximum code length but there is no non-representative symbol whose code length is shorter than the code length of the representative symbol, the second representative symbol swapping unit 381 does not swap the code lengths between the representative symbol and a non-representative symbol.

The sibling symbol code length change unit 382, the representative symbol code length change unit 383, and the representative symbol restriction process termination determination unit 384 execute a process of restricting the code length of the representative symbol to the representative symbol maximum code length (representative symbol restriction process) after the process by the second representative symbol swapping unit 381 is executed.

First, the sibling symbol code length change unit 382 selects $2^D$ non-representative symbols s that have, as their parent, the same intermediate node as the representative symbol or that have, as their transitive parent, the same intermediate node as the representative symbol. The non-representative symbols that have, as their parent, the same intermediate node as the representative symbol or that have, as their transitive parent, the same intermediate node as the representative symbol are also referred to as sibling symbols. The transitive parent is a node which can be reached while edges are traced from a symbol (leaf node) to the root node. D is a difference obtained by subtracting the code length of the representative symbol from the code length of the selected sibling symbol. In other words, the code lengths of the selected sibling symbols are the code length of the representative symbol+D. Specifically, when $2^D$ sibling symbols s of the representative symbol are searched for, it is sufficient for the sibling symbol code length change unit 382 to select $2^D$ non-representative symbols each having a code length obtained by adding D to the code length of the representative symbol, from the H <non-representative symbol, code length> pairs. Note that when a non-representative symbol having, as its parent, the same intermediate node as the representative symbol is selected, the maximum code length restriction unit 326 selects one (=$2^0$) sibling symbol s since there is no difference between the code length of the representative symbol and the code length of the selected non-representative symbol.

Next, the sibling symbol code length change unit 382 selects $2^D$ non-representative symbols s' that have code lengths shorter than the maximum code length, in the order of longer code lengths, from the non-representative symbols. Then, the sibling symbol code length change unit 382 changes the code length of each of the $2^D$ sibling symbols s and the code length of each of the $2^D$ non-representative symbols s'. For example, a case where a code length of an i-th sibling symbol s among the $2^D$ sibling symbols s and a code length of an i-th non-representative symbol s' among the $2^D$ non-representative symbols s' will be explained. Note that i is any value between one to D inclusive. In this case, the sibling symbol code length change unit 382 changes the code length of the i-th sibling symbol s to a length obtained by adding one to the code length of the i-th non-representative symbol s'. Then, the sibling symbol code length change unit 382 increments the code length of the i-th non-representative symbol s' by one.

Next, the representative symbol code length change unit 383 decrements the code length of the representative symbol by one. In other words, the representative symbol code length change unit 383 changes the code length of the <representative symbol, code length, maximum value of additional code lengths> pair by decrementing the code length by one.

The representative symbol restriction process termination determination unit 384 determines whether or not to terminate the representative symbol restriction process, based on the decremented code length of the representative symbol. Specifically, the representative symbol restriction process termination determination unit 384 determines whether or not the decremented code length of the representative symbol becomes shorter than or equal to the representative symbol maximum code length.

When the decremented code length of the representative symbol is still longer than the representative symbol maximum code length, the representative symbol restriction process by the sibling symbol code length change unit 382, the representative symbol code length change unit 383, and the representative symbol restriction process termination determination unit 384 described above is executed again. In other words, the representative symbol restriction process is repeated until the code length of the representative symbol becomes shorter than or equal to the representative symbol maximum code length.

When the decremented code length of the representative symbol becomes shorter than or equal to the representative symbol maximum code length, the representative symbol restriction process termination determination unit 384 ends the representative symbol restriction process.

The subsequent process of the violation symbol count calculation unit 374, the termination determination unit 375, the code length change unit 376, and the violation symbol count decrement unit 377 has been described above in the maximum code length restriction process of the first embodiment.

With the above configuration, the maximum code length restriction unit 326 can restrict the code length of the representative symbol to the representative symbol maximum code length, even in a case where there is no non-representative symbol satisfying the condition that its code length is shorter than or equal to the representative symbol maximum code length. Furthermore, the maximum code length restriction unit 326 can restrict the code length of the representative symbol to the representative symbol maximum code length even when there is no non-representative symbol corresponding to a code length shorter than the code length of the representative symbol.

A specific example in which code lengths are restricted to the maximum code length in the maximum code length restriction unit 326 will be described with reference to FIG. 30 to FIG. 34. Here, it is assumed that the maximum code length is 4 bits.

FIG. 30 shows an example of a Huffman tree generated in the maximum code length restriction unit 326.

A Huffman tree 80 is generated based on a frequency of occurrence of each of seven non-representative symbols "a", "b", "c", "d", "e", "f", and "g" (hereinafter referred to as non-representative symbols "a" to "g") and a frequency of occurrence of one representative symbol "R". The non-representative symbols "a" to "g" are assigned to leaf nodes 832, 833, 834, 835, 836, 837, and 838, respectively. The representative symbol "R" is assigned to a leaf node 831.

In the generated Huffman tree 80, code lengths of the non-representative symbols "a" to "g" are 3 bits. In addition, a code length of the representative symbol "R" is 3 bits.

Note that the edges and nodes represented by dotted lines indicate a subtree 85 corresponding to merge symbols "h", "i", "j", "k", "l", "m", "n", and "o" (hereinafter referred to as merge symbols "h" to "o"). The subtree 85 is a subtree having the representative symbol "R" (leaf node 831) as its root node and having each of the merge symbols "h" to "o" as a leaf node. The merge symbols "h" to "o" are assigned to leaf nodes 861, 862, 863, 864, 865, 866, 867, and 868, respectively. The code lengths of the merge symbols "h" to "o" are 6 bits. Therefore, for these merge symbols "h" to "o", the maximum value of the code lengths which are to be added to the code length of the representative symbol "R" (i.e., the maximum value of the additional code lengths) is three.

Furthermore, in the Huffman tree 80, a length obtained by adding the maximum value of the additional code lengths to the code length of the representative symbol "R" is longer than the maximum code length (i.e., 3+3 >4). Accordingly, the representative symbol swapping unit 373 attempts to select a non-representative symbol whose code length is shorter than or equal to a representative symbol maximum code length obtained by subtracting the maximum value of the additional code lengths from the maximum code length (=4−3=1). In the Huffman tree 80, however, there is no non-representative symbol satisfying the condition that its code length is shorter than or equal to the representative symbol maximum code length.

In this case, the second representative symbol swapping unit 381 attempts to select a non-representative symbol whose code length is shorter than the code length of the representative symbol "R". In the Huffman tree 80, however, there is also no non-representative symbol satisfying the condition that its code length is shorter than the code length of the representative symbol (for example, there is no non-representational symbol whose code length is 2 bits).

Accordingly, the sibling symbol code length change unit 382 selects a non-representative symbol that has, as its parent, the same intermediate node 821 as the representative symbol "R". In the example shown in FIG. 30, the non-representative symbol "a" is selected. Then, the sibling symbol code length modification unit 382 selects a non-representative symbol having the longest code length among the non-representative symbols whose code lengths are shorter than the maximum code length. In the example shown in FIG. 30, the non-representative symbol "g" is selected.

The sibling symbol code length change unit 382 changes the code length of the non-representative symbol "a" to a length obtained by adding one to the code length of the non-representative symbol "g" (=3+1=4 bits). Then, the sibling symbol code length change unit 382 increments the code length of the non-representative symbol "g" by one, thereby changing the code length to 4 bits.

FIG. 31 shows a modified example of the Huffman tree 80 shown in FIG. 30. This modified example shows the Huffman tree 80 in which the sibling symbol code length change unit 382 has changed the code lengths of the non-representative symbols "a" and "g" as described above. That is, in the modified Huffman tree 80, the code lengths of the non-representative symbols "a" and "g" are 4 bits. The non-representative symbols "a" and "g" are assigned to leaf nodes 843 and 844, respectively, that have, as their parent, the same intermediate node 838.

Since the code length of the non-representative symbol "a" has been changed (i.e., since the leaf node to which the non-representative symbol "a" is assigned has been changed from the leaf node 832 to the leaf node 843), leaf nodes having the intermediate node 821 as their parent is only the leaf node 831 of the representative symbol "R". In this case, the intermediate node 821 and the leaf node 831 can be merged. Thus, the representative symbol code length change unit 383 decrements the code length of the representative symbol "R" by one, thereby changing the code length to 2 bits.

FIG. 32 shows a modified example of the Huffman tree 80 shown in FIG. 31. This modified example shows the Huffman tree 80 in which the representative symbol code length change unit 383 has changed the code length of the representative symbol "R" as described above. That is, in the modified Huffman tree 80, the code length of the representative symbol "R" is set to 2 bits. The representative symbol "R" is assigned to the leaf node 821, which has been changed from the parent intermediate node 821.

Next, the representative symbol restriction process termination determination unit 384 determines whether or not the code length of the representative symbol "R" is shorter than or equal to the representative symbol maximum code length. Since the code length of the representative symbol "R" (=2) is longer than the representative symbol maximum code length (=1), the representative symbol restriction process termination determination unit 384 decides to change code lengths of sibling symbols and the code length of the representative symbol again.

The sibling symbol code length change unit 382 attempts to select a non-representative symbol that has, as its parent, the same intermediate node as the representative symbol "R". In the Huffman tree 80, however, there is no non-representative symbol that has, as its parent, the same intermediate node as the representative symbol "R". In this case, the sibling symbol code length change unit 382 selects non-representative symbols that have, as their transitive parent, the same intermediate node as the representative symbol "R". In FIG. 32, the two non-representative symbols "b" and "c" (leaf nodes 833 and 834) that have, as their transitive parent, the intermediate node 811 which is the parent of the representative symbol "R", are selected. In other words, the two (=$2^1$) non-representative symbols "b" and "c" each having a code length obtained by adding one to the code length of the representative symbol "R" are selected.

Next, the sibling symbol code length change unit 382 selects two non-representative symbols having code lengths shorter than the maximum code length, in the order of longer code lengths, from the non-representative symbols. In FIG. 32, the non-representative symbols "f" and "e" are selected.

The sibling symbol code length change unit 382 changes the code length of the selected non-representative symbol "b" to a length obtained by adding one to the code length of the non-representative symbol "f" (=3+1=4 bits). Then, the sibling symbol code length change unit 382 increments the code length of the non-representative symbol "f" by one, thereby changing the code length to 4 bits.

In addition, the sibling symbol code length change unit 382 changes the code length of the selected non-representative symbol "c" to a length obtained by adding one to the code length of the non-representative symbol "e" (=3+1=4 bits). Then, the sibling symbol code length change unit 382 increments the code length of the non-representative symbol "e" by one, thereby changing the code length to 4 bits.

FIG. 33 shows a modified example of the Huffman tree 80 shown in FIG. 32. This modified example shows the Huffman tree 80 in which the sibling symbol code length change unit 382 has changed the code lengths of the non-representative symbols "b", "f", "c", and "e" as described above. That is, in the modified Huffman tree 80, the code lengths of the non-representative symbols "b", "f", "c", and "e" are set to 4 bits. The non-representative symbols "f" and "b" are assigned to respective leaf nodes 849 and 84A that have the intermediate node 837 as their parent. The non-representative symbols "e" and "c" are assigned to respective leaf nodes 847 and 848 that have the intermediate node 836 as their parent.

Since the code lengths of the non-representative symbols "b" and "c" have been changed (i.e., since the leaf node to which the non-representative symbol "b" is assigned has been changed from the leaf node 833 to the leaf node 84A and the leaf node to which the non-representative symbol "c" is assigned has been changed from the leaf node 834 to the leaf node 848), leaf nodes that have the intermediate node 811 as their parent is only the leaf node 821 of the representative symbol "R". In this case, a binary tree that includes the redundant intermediate node 822, the leaf node 821, and the intermediate node 811 can be merged. Accordingly, the representative symbol code length change unit 383 decrements the code length of the representative symbol "R" by one, thereby changing the code length to 1 bit.

FIG. 34 shows a modified example of the Huffman tree 80 shown in FIG. 33. This modified example shows the Huffman tree 80 in which the representative symbol code length change unit 383 has changed the code length of the representative symbol "R" as described above. That is, in the modified Huffman tree 80, the code length of the representative symbol "R" is set to 1 bit. The representative symbol "R" is assigned to the leaf node 811, which has been changed from the parent intermediate node 811.

Next, the representative symbol restriction process termination determination unit 384 determines whether or not the code length of the representative symbol "R" is shorter than or equal to the representative symbol maximum code length. Since the code length of the representative symbol "R" (=1) is shorter than or equal to the representative symbol maximum code length (=1), the representative symbol restriction process termination determination unit 384 decides to terminate the process of changing the code lengths of the representative symbol and sibling symbols.

The Huffman tree 80 shown in FIG. 34 is a valid Huffman tree and every intermediate node of the Huffman tree 80 has two child nodes. Therefore, Huffman codes determined based on the Huffman tree 80 are Huffman codes that satisfy Kraft's inequality and have no redundant code assignment. That is, the Huffman codes determined based on the Huffman tree 80 are perfect codes.

An example of the procedure of the maximum code length restriction process will be described with reference to FIG. 35 and FIG. 36.

FIG. 35 is a flowchart showing an example of the procedure of the maximum code length restriction process executed in the maximum code length restriction unit 326. The maximum code length restriction unit 326 executes the maximum code length restriction process on H <non-representative symbol, code length> pairs and one <representative symbol, code length> pair that are sent from the code length determination unit 325.

First, the maximum code length restriction unit 326 changes the code lengths of the non-representative symbols that are longer than the maximum code length, to the maximum code length (step S501). Next, the maximum code length restriction unit 326 determines whether or not the code length of the representative symbol is longer than the representative symbol maximum code length (step S502).

When the code length of the representative symbol is shorter than or equal to the representative symbol maximum code length (No in step S502), the process by the maximum code length restriction unit 326 proceeds to step S507.

When the code length of the representative symbol is longer than the representative symbol maximum code length (Yes in step S502), the maximum code length restriction unit 326 determines whether or not there is a non-representative symbol whose code length is shorter than or equal to the representative symbol maximum code length (step S503).

When there is a non-representative symbol whose code length is shorter than or equal to the representative symbol maximum code length (Yes in step S503), the maximum code length restriction unit 326 selects a non-representative symbol having the longest code length among the non-representative symbols each having a code length shorter than or equal to the representative symbol maximum code length (step S505). The maximum code length restriction unit 326 swaps the code lengths between the selected non-representative symbol and the representative symbol (step S506) and proceeds to step S507.

When there is no non-representative symbol whose code length is shorter than or equal to the representative symbol maximum code length (No in step S503), the maximum code length restriction unit 326 executes a swap and code length change process (step S504) and proceeds to step S507. The swap and code length change process is a process for restricting the code length of the representative symbol to the representative symbol maximum code length by: swapping the code lengths between the representative symbol and a non-representative symbol; changing a code length of a sibling symbol (or code lengths of sibling symbols) of the representative symbol; and changing the code length of the representative symbol. A specific procedure of the swap and code length change process will be described later with reference to a flowchart in FIG. 36.

The subsequent procedure from step S507 to step S510 is the same as the procedure from step S305 to step S308 of the maximum code length restriction process described above with reference to FIG. 24. In other words, the maximum code length restriction unit 326 executes a process for changing a code length of a violation symbol to a code length shorter than or equal to the maximum code length.

With the above maximum code length restriction process, the maximum code length restriction unit 326 can restrict the code lengths of the non-representative symbols to the maximum code length and restrict the code length of the representative symbol to the representative symbol maximum code length. By restricting the code length of the representative symbol to the representative symbol maximum code length, code lengths of symbols represented by the representative symbol (i.e., code lengths of merge symbols) can be restricted to the maximum code length.

FIG. 36 is a flowchart showing an example of the procedure of the swap and code length change process executed in the maximum code length restriction unit 326. The swap and code length change process corresponds to step S504 of the maximum code length restriction process described above with reference to FIG. 35. The maximum code length restriction unit 326 executes the swap and code length change process when there is no non-representative symbol whose code length is shorter than or equal to the representative symbol maximum code length.

First, the maximum code length restriction unit 326 determines whether or not there is a non-representative symbol having a code length shorter than the code length of the representative symbol (step S601).

When there is no non-representative symbol having a code length shorter than the code length of the representative symbol (No in step S601), the process by the maximum code length restriction unit 326 proceeds to step S604.

When there is a non-representative symbol having a code length shorter than the code length of the representative symbol (Yes in step S601), the maximum code length restriction unit 326 selects a non-representative symbol having the shortest code length, among the non-representative symbols each having a code length shorter than the code length of the representative symbol (step S602). The maximum code length restriction unit 326 swaps the code lengths between the selected non-representative symbol and the representative symbol (step S603) and proceeds to step S604.

Next, the maximum code length restriction unit 326 selects $2^D$ non-representative symbols s (i.e., $2^D$ sibling symbols s) that have, as their parent, the same intermediate node as the representative symbol or that have, as their transitive parent, the same intermediate node as the representative symbol (step S604).

The maximum code length restriction unit 326 selects $2^D$ non-representative symbols s' each having a code length shorter than the maximum code length, in the order of longer code lengths, from the non-representative symbols (step S605). Then, the maximum code length restriction unit 326 sets a variable i to one (step S606). The variable i is a variable for specifying the i-th sibling symbol s of the $2^D$ sibling symbols s from the head and the i-th non-representative symbol s' of the $2^D$ non-representative symbols s' from the head.

The maximum code length restriction unit 326 changes the code length of the i-th sibling symbol s to a code length obtained by adding one to the code length of the i-th non-representative symbol s' (step S607). The maximum code length restriction unit 326 increments the code length of the i-th non-representative symbol s' by one (step S608). The maximum code length restriction unit 326 increments the variable i by one (step S609). Then, the maximum code length restriction unit 326 determines whether or not the variable i is larger than $2^D$ (step S610).

When the variable i is smaller than or equal to $2^D$ (No in step S610), the maximum code length restriction unit 326 returns to step S607 and further executes the steps to change the code length of the i-th sibling symbol s and the code length of the i-th non-representative symbol s'. In other words, the maximum code length restriction unit 326 repeats the procedure from step S607 to step S609 until all the code lengths of the selected $2^D$ sibling symbols s and $2^D$ non-representative symbols s' are changed.

When the variable i is larger than $2^D$ (Yes in step S610), the maximum code length restriction unit 326 decrements the code length of the representative symbol by one (step S611). Then, the maximum code length restriction unit 326 determines whether or not the code length of the representative symbol is shorter than or equal to the representative symbol maximum code length (step S612).

When the code length of the representative symbol is longer than the representative symbol maximum code length (No in step S612), the process by the maximum code length restriction unit 326 returns to step S604. That is, the maximum code length restriction unit 326 further executes the steps of changing code lengths of one or more sibling symbols of the representative symbol in order to shorten the code length of the representative symbol.

When the code length of the representative symbol is shorter than or equal to the representative symbol maximum code length (Yes in step S612), the maximum code length restriction unit 326 ends the swap and code length change process.

With the above swap and code length change process, even when there is no non-representative symbol whose code length is shorter than or equal to the representative symbol maximum code length, the maximum code length restriction unit 326 can restrict the code length of the representative symbol to the representative symbol maximum code length. Furthermore, even when there is no non-representative symbol whose code length is shorter than the code length of the representative symbol, the maximum code length restriction unit 326 can restrict the code length of the representative symbol to the representative symbol maximum code length.

Third Embodiment

Similarly to the maximum code length restriction unit 326 of the second embodiment, a maximum code length restriction unit 326 of a third embodiment is configured to change a code length of a representative symbol and code lengths of non-representative symbols in order to restrict the code length of the representative symbol to a representative symbol maximum code length in a case where there is no non-representative symbol satisfying a condition that its code length is shorter than or equal to the representative symbol maximum code length when the code length of the representative symbol is longer than the representative symbol maximum code length.

A configuration of a variable length coding device 15 according to the third embodiment is similar to that of the variable length coding devices 15 of the first and second embodiments. The variable length coding device 15 of the third embodiment is different from the variable length coding devices 15 of the first and second embodiments in terms of the procedure of changing the code lengths of the representative and non-representative symbols in order to restrict the code length of the representative symbol to the representative symbol maximum code length in the above-described case. Hereinafter, the difference from the second embodiment will be mainly described.

The maximum code length restriction unit 326 of the variable length coding device 15 executes a process of restricting code lengths corresponding to respective symbols to the maximum code length (maximum code length restriction process) by using the maximum value of additional code lengths sent from the merge symbol additional code length determination unit 354, H <non-representative symbol, code length> pairs and one <representative symbol, code length> pair that are sent from the code length determination unit 325. In other words, the maximum code length restriction unit 326 executes the maximum code length restriction process by using the H <non-representative symbol, code length> pairs and one <representative symbol, code length, maximum value of additional code lengths> pair.

FIG. 37 is a block diagram showing an example of a configuration of the maximum code length restriction unit 326. The maximum code length restriction unit 326 includes, for example, a code length sorting unit 371, a code length clipping unit 372, a representative symbol swapping unit 373, an intermediate node selection unit 391, a transitive leaf code length change unit 392, a representative symbol code length change unit 393, a violation symbol count calculation unit 374, a termination determination unit 375, a code length change unit 376, and a violation symbol count decrement unit 377.

The operations of the code length sorting unit 371, the code length clipping unit 372, the representative symbol swapping unit 373, the violation symbol count calculation unit 374, the termination determination unit 375, the code length change unit 376, and the violation symbol count decrement unit 377 have been described above with reference to FIG. 18. More specifically, the operation in which the representative symbol swapping unit 373 swaps the code lengths between the representative symbol and the non-representative symbol that is shorter than the representative symbol maximum code length has been described in the maximum code length restriction process of the first embodiment.

When the code length of the representative symbol is longer than the representative symbol maximum code length, the representative symbol swapping unit 373 does not swap the code lengths between the representative symbol and a non-representative symbol unless there is a non-representative symbol whose code length is shorter than or equal to the representative symbol maximum code length. Hereinafter, an operation in a case where there is no non-representative symbol whose code length is shorter than or equal to the representative symbol maximum code length when the code length of the representative symbol is longer than the representative symbol maximum code length will be described.

After the process of the representative symbol swapping unit 373 is executed, the intermediate node selection unit 391, the transitive leaf code length change unit 392, and the representative symbol code length change unit 393 execute a process of restricting the code length of the representative symbol to the representative symbol maximum code length (representative symbol restriction process).

First, the intermediate node selection unit 391 selects one intermediate node whose depth from the root node is equal to the representative symbol maximum code length, in a Huffman tree generated by the Huffman tree generation unit 324.

The transitive leaf code length change unit 392 identifies all leaf nodes that can be reached by tracing from the selected intermediate node in a direction of child nodes. The leaf nodes that can be reached by tracing from the intermediate node in a direction of child nodes are referred to as transitive leaf nodes. The direction of child nodes is a deeper direction.

The transitive leaf code length modification unit 392 changes a code length of one non-representative symbol among the non-representative symbols assigned to the identified transitive leaf nodes, to the code length of the representative symbol. The transitive leaf code length change unit 392 changes the code lengths of the remaining non-representative symbols among the non-representative symbols assigned to the transitive leaf nodes, to the maximum code length.

Then, the representative symbol code length change unit 393 changes the code length of the representative symbol to the representative symbol maximum code length.

The subsequent operations of the violation symbol count calculation unit 374, the termination determination unit 375, the code length change unit 376, and the violation symbol count decrement unit 377 have been described above as the maximum code length restriction process of the first embodiment.

With the above configuration, the maximum code length restriction unit 326 can restrict the code length of the representative symbol to the representative symbol maximum code length, even in a case where there is no non-representative symbol satisfying the condition that its code length is shorter than or equal to the representative symbol maximum code length.

A specific example in which code lengths are restricted to the maximum code length in the maximum code length restriction unit 326 will be described with reference to FIG. 38 to FIG. 40. Here, it is assumed that the maximum code length is 4 bits.

FIG. 38 shows an example of a Huffman tree generated in the maximum code length restriction unit 326.

The Huffman tree 90 is generated based on a frequency of occurrence of each of seven non-representative symbols "a", "b", "c", "d", "e", "f", and "g" (hereinafter referred to as non-representative symbols "a" to "g") and a frequency of occurrence of one representative symbol "R". The non-representative symbols "a" to "g" are assigned to leaf nodes 932, 933, 934, 935, 936, 937, and 938, respectively. The representative symbol "R" is assigned to a leaf node 931. In the generated Huffman tree 90, code lengths of the non-representative symbols "a" to "g" are 3 bits. In addition, a code length of the representative symbol "R" is 3 bits.

Note that the edges and nodes represented by dotted lines indicate a subtree 95 corresponding to merge symbols "h", "i", "j", and "k" (hereinafter referred to as merge symbols "h" to "k"). The subtree 95 is a subtree that has the representative symbol "R" (leaf node 931) as its root node and has each of the merge symbols "h" to "k" as a leaf node. The merge symbols "h" to "k" are assigned to leaf nodes 951, 952, 953, and 954, respectively. The code lengths of the merge symbols "h" to "k" are 5 bits. Therefore, for these merge symbols "h" to "k", the maximum value of code lengths which are to be added to the code length of the representative symbol "R" (i.e., the maximum value of additional code lengths) is two (=5−3).

Furthermore, in the Huffman tree 90, a length obtained by adding the maximum value of the additional code lengths to the code length of the representative symbol "R" is longer than the maximum code length (i.e., 3+2 >4). Accordingly, the representative symbol swapping unit 373 attempts to select a non-representative symbol whose code length is shorter than or equal to a representative symbol maximum code length obtained by subtracting the maximum value of the additional code lengths from the maximum code length (=4−2=2). In the Huffman tree 90, however, there is no non-representative symbol satisfying a condition that its code length is shorter than or equal to the representative symbol maximum code length.

Therefore, the intermediate node selection unit 391 selects an intermediate node whose depth from a root node 901 is equal to the representative symbol maximum code length. In FIG. 38, an intermediate node 924 whose depth from the root node 901 is two, is selected. Note that the intermediate node selection unit 391 excludes, from targets of the selection, intermediate nodes each of which is a parent or a transitive parent of the leaf node 931 to which the representative symbol "R" is assigned. In FIG. 38, intermediate nodes 911, 921, and 922 are excluded from the targets from which the intermediate node selection unit 391 selects an intermediate node.

The transitive leaf code length change unit 392 identifies all leaf nodes (i.e., transitive leaf nodes) that can be reached by tracing from the selected intermediate node 924 in a direction of child nodes. In FIG. 38, a leaf node 937 and a leaf node 938 are identified.

The transitive leaf code length change unit 392 selects one non-representative symbol from the non-representative symbols "f" and "g" that are assigned to the identified leaf node

937 and leaf node 938, respectively. In FIG. 38, the non-representative symbol "f" is selected.

The transitive leaf code length change unit 392 changes the code length of the selected non-representative symbol "f" to the code length of the representative symbol "R" (=3 bits). In addition, the transitive leaf code length change unit 392 changes the code lengths of all the remaining non-representative symbols assigned to the transitive leaf nodes (in this case, the code length of the non-representative symbol "g"), to the maximum code length.

Then, the representative symbol code length change unit 393 changes the code length of the representative symbol "R" to the representative symbol maximum code length (i.e., the depth of the selected intermediate node 924).

FIG. 39 shows a modified example of the Huffman tree 90 shown in FIG. 38. This modified example shows the Huffman tree 90 in which the transitive leaf code length change unit 392 has been changed the code lengths of the non-representative symbols "f" and "g" and the representative symbol code length change unit 393 has been changed the code length of the representative symbol "R" as described above.

In the modified Huffman tree 90, the code length of the non-representative symbol "f" is set to the original code length of the representative symbol "R" (=3 bits). The code length of the representative symbol "R" is set to the representative symbol maximum code length (=2 bits). The code length of the non-representative symbol "g" is set to the maximum code length (=4 bits).

Since the code length of the representative symbol "R" is set to the representative symbol maximum code length, code lengths of the merge symbols "h" to "k" that are assigned to leaf nodes 943, 944, 945, and 946 of the subtree 95, respectively, become shorter than or equal to the maximum code length. However, since a leaf node 947 is a node that cannot be traced from the root node 901, the non-representative symbol "g" assigned to the leaf node 947 is a violation symbol.

In this case, the violation symbol count calculation unit 374 calculates the number I of violation symbols by using the above-described equation (7) (or equation (8)).

$$I = (1/4 + 1/8 \times 6 + 1/16 - 1) \times 16 = 1$$

Since the calculated number I of violation symbols is larger than 0, the code length change unit 376 changes the code lengths of the non-representative symbols until the number I of violation symbols becomes 0.

Specifically, the code length change unit 376 selects the violation symbol "g". Then, the code length change unit 376 selects the non-representative symbol "f" having a code length shorter than the maximum code length. Note that if there are multiple non-representative symbols each having a code length shorter than the maximum code length, the code length change unit 376 selects a non-representative symbol from the multiple non-representative symbols in the order of longer code lengths.

The code length change unit 376 changes the code length of the selected violation symbol "g" to a length obtained by adding one to the code length of the selected non-representative symbol "f" (=3+1=4 bits). Then, the code length change unit 376 increments the code length of the non-representative symbol "f" by one, thereby changing the code length to 4 bits.

Next, the violation symbol count decrement unit 377 decrements the number I of violation symbols by one, thereby updating the number I of violation symbols with 0. Since the updated number I of violation symbols is 0, the termination determination unit 375 decides to terminate the change of the code lengths of the non-representative symbols.

FIG. 40 shows a modified example of the Huffman tree 90 shown in FIG. 39. This modified example shows the Huffman tree 90 in which the code length change unit 376 has changed the code length of the non-representative symbol "f" and the code length of the violation symbol "g". That is, in the modified Huffman tree 90, the code length of the non-representative symbol "f" and the code length of the violation symbol "g" are set to 4 bits. In addition, this Huffman tree 90 has no violation symbols.

The Huffman tree 90 is a valid Huffman tree and every intermediate node of the Huffman tree 90 has two child nodes. Therefore, Huffman codes determined based on the Huffman tree 90 are Huffman codes that satisfy Kraft's inequality and have no redundant code assignment (i.e., K=1). In other words, the Huffman codes determined based on the Huffman tree 90 are perfect codes.

An example of the procedure of the maximum code length restriction process will be described with reference to FIG. 41 and FIG. 42.

FIG. 41 is a flowchart showing an example of the procedure of the maximum code length restriction process executed in the maximum code length restriction unit 326. The maximum code length restriction unit 326 executes the maximum code length restriction process on H <non-representative symbol, code length> pairs and one <representative symbol, code length> pair, which are sent from the code length determination unit 325.

First, the maximum code length restriction unit 326 changes the code lengths of the non-representative symbols that are longer than the maximum code length, to the maximum code length (step S701). Next, the maximum code length restriction unit 326 determines whether or not the code length of the representative symbol is longer than the representative symbol maximum code length (step S702).

When the code length of the representative symbol is shorter than or equal to the representative symbol maximum code length (No in step S702), the process by the maximum code length restriction unit 326 proceeds to step S707.

When the code length of the representative symbol is longer than the representative symbol maximum code length (Yes in step S702), the maximum code length restriction unit 326 determines whether or not there is a non-representative symbol whose code length is shorter than or equal to the representative symbol maximum code length (step S703).

When there is a non-representative symbol whose code length is shorter than or equal to the representative symbol maximum code length (Yes in step S703), the maximum code length restriction unit 326 selects a non-representative symbol having the longest code length, among the non-representative symbols each having a code length shorter than or equal to the representative symbol maximum code length (step S705). The maximum code length restriction unit 326 swaps the code lengths between the selected non-representative symbol and the representative symbol (step S706) and proceeds to step S707.

When there is no non-representative symbol whose code length is shorter than or equal to the representative symbol maximum code length (No in step S703), the maximum code length restriction unit 326 executes a second code length change process (step S704) and proceeds to step S707. The second code length change process is a process for changing the code length of the representative symbol to a code length shorter than or equal to the representative symbol maximum code length by: identifying an intermediate node having a depth from the root node that is equivalent to the representative symbol maximum code length, changing code lengths of non-representative symbol to which transitive leaf nodes of this intermediate node are assigned, respectively, and changing the code length of the representative symbol. A specific procedure of the second code length change process will be described later with reference to a flowchart in FIG. 42.

The subsequent procedure from step S707 to step S710 is similar to the procedure from step S305 to step S308 of the maximum code length restriction process described above with reference to FIG. 24. That is, the maximum code length restriction unit 326 executes a process of changing a code length of a violation symbol to a code length shorter than or equal to the maximum code length.

With the above maximum code length restriction process, the maximum code length restriction unit 326 can restrict the code lengths of the non-representative symbols to the maximum code length and restrict the code length of representative symbol to the representative symbol maximum code length. By restricting the code length of the representative symbol to the representative symbol maximum code length, code lengths of symbols represented by the representative symbol (i.e., code lengths of merge symbols) can be restricted to the maximum code length.

FIG. 42 is a flowchart showing an example of the procedure of the second code length restriction process executed in the maximum code length restriction unit 326. The second code length restriction process corresponds to step S704 of the maximum code length restriction process described above with reference to FIG. 41. The maximum code length restriction unit 326 executes the second code length change process when there is no non-representative symbol whose code length is shorter than or equal to the representative symbol maximum code length.

First, the maximum code length restriction unit 326 selects an intermediate node whose depth from the root node is equal to the representative symbol maximum code length (step S801). The maximum code length restriction unit 326 identifies non-representative symbols assigned to all leaf nodes (transitive leaf nodes) that can be reached by tracing from the selected intermediate node in child node direction (step S802). The maximum code length restriction unit 326 selects one non-representative symbol from the identified non-representative symbols (step S803).

The maximum code length restriction unit 326 changes the code length of the selected non-representative symbol to the code length of the representative symbol (step S804). The maximum code length restriction unit 326 changes the code lengths of the remaining non-representative symbols obtained by excluding the non-representative symbol selected in step S803 from all the non-representative symbols assigned to the transitive leaf nodes, to the maximum code length (step S805). Then, the maximum code length restriction unit 326 changes the code length of the representative symbol to the representative symbol maximum code length (step S806), and ends the second code length change process.

With the above second code length change process, the maximum code length restriction unit 326 can restrict the code length of the representative symbol to the representative symbol maximum code length even when there is no non-representative symbol whose code length is shorter than or equal to the representative symbol maximum code length.

When identifying the non-representative symbols assigned to the transitive leaf nodes in step S802 of the second code length change process shown in FIG. 42 is executed for a certain Huffman tree, the calculation amount may be increased. However, in a case where a specific combination of the maximum code length, the number of non-representative symbols, a code length of a representative symbol, and the maximum value of additional code lengths is used, patterns of a structure of a Huffman tree is limited, and thus the non-representative symbols assigned to the transitive leaf nodes can be identified with a small calculation amount.

An example in which patterns of a structure of a Huffman tree are limited in a case where a specific combination of the maximum code length, the number of non-representative symbols, a code length of a representative symbol, and the maximum value of additional code lengths is used, will be described with reference to FIG. 43 to FIG. 46. Here, it is assumed that the maximum code length is three, the number of non-representative symbols is eight, a code length of a representative symbol is three, and the maximum value of additional code lengths is two. The maximum code length is generally fixed to a value specified in a compression standard or the like. In addition, the number of non-representative symbols is a fixed value in a case where the Huffman tree is generated by using one or more representative symbols. Therefore, it is reasonable to assume that the maximum code length and the number of non-representative symbols are fixed. That is, in FIG. 43 to FIG. 46, under this assumption, a case where the code length of the representative symbol is three and the maximum value of additional code lengths is two is assumed. In this case, the representative symbol maximum code length is one (=3 −2) that is obtained by subtracting the maximum value of additional code lengths from the maximum code length. Therefore, the code length of the representative symbol is longer than the representative symbol maximum code length (3 >1) and violates a restriction on the representative symbol maximum code length. In other words, code lengths of merge symbols represented by the representative symbol violate a restriction on the maximum code length.

In such a case, it will be considered that after clipping code lengths of the non-representative symbols, there is no non-representative symbol that can be swapped for the representative symbol and thus the violation of the restriction on the representative symbol maximum code length is not resolved. The non-representative symbol that can be swapped for the representative symbol is a non-representative symbol whose code length is shorter than or equal to the representative symbol maximum code length. That is, in this case, there is no non-representative symbol whose code length is shorter than or equal to the representative symbol maximum code length (i.e., there is no non-representative symbol whose code length is one). Furthermore, since the maximum code length is three, the minimum value of the code lengths of the non-representative symbols is either two or three. Therefore, the structure of the Huffman tree assumed in this case is limited to four patterns shown in FIG. 43 to FIG. 46.

FIG. 43 shows a first pattern of the Huffman tree assumed in the above-described case. The first pattern corresponds to a case where the minimum value of the code lengths of the non-representative symbols is three.

In this case, by selecting any four non-representative symbols from the non-representative symbols indicated in the Huffman tree 90, non-representative symbols corresponding to all of leaf nodes that can be reached by tracing from a selected intermediate node (for example, intermediate node 912) in a direction of child nodes can be selected. In the example shown in FIG. 43, the non-representative symbols "d", "e", "f", and "g" are selected. Note that intermediate nodes that are transitive parents of the representative symbol "R" (in FIG. 43, intermediate nodes 911 and 921) are excluded from target intermediate nodes from which the intermediate node selection unit 391 selects an intermediate node.

FIG. 44 shows a second pattern of the Huffman tree assumed in the above-described case. The second pattern corresponds to a case where the minimum value of the code lengths of the non-representative symbols is two and there is one non-representative symbol whose code length is two.

In this case, by selecting the one non-representative symbol whose code length is two and any two non-representative symbols whose code lengths are three from the non-representative symbols indicated by the Huffman tree 90, non-representative symbols corresponding to all of leaf nodes that can be reached by tracing from a selected intermediate node in a direction of child nodes can be selected. In the example shown in FIG. 44, the non-representative symbols "d", "e", and "f" are selected.

FIG. 45 shows a third pattern of the Huffman tree assumed in the above-described case. The third pattern corresponds to a case where the minimum value of the code lengths of the non-representative symbols is two and there are two non-representative symbols whose code lengths are two.

In this case, by selecting the two non-representative symbols whose code lengths are two from the non-representative symbols indicated in the Huffman tree 90, non-representative symbols corresponding to all of leaf nodes that can be reached by tracing from a selected intermediate node in a direction of child nodes can be selected. In the example shown in FIG. 45, the non-representative symbols "d" and "f" are selected.

FIG. 46 shows a fourth pattern of the Huffman tree assumed in the above-described case. The fourth pattern corresponds to a case where the minimum value of the code lengths of the non-representative symbols is two and there are two non-representative symbols whose code lengths are two but is different from the third pattern.

In the example shown in FIG. 46, the non-representative symbols "d" and "f" are also selected. In the fourth pattern, the nodes to which the non-representative symbols "b" and "c" are assigned are different from those in the third pattern.

Thus, the maximum code length restriction unit 326 of the third embodiment can identify non-representative symbols corresponding to all of leaf nodes that can be reached by tracing from a selected intermediate node in a direction of child nodes, with a small calculation amount, in the case of using a specific combination of the maximum code length, the number of non-representative symbols, a code length of a representative symbol, and the maximum value of the additional code lengths. Note that, as described above, even when an example in which a structure of a Huffman tree is shown and symbols are assigned to leaf nodes is illustrated, the maximum code length restriction unit 326 may not actually manage the structure of the Huffman tree and the relationship between each leaf node and each symbol. For example, when managing a <representative symbol, code length> pair and a list of <non-representative symbol, code length> pairs, the maximum code length restriction unit 326 can perform the selection of symbols and the change of code lengths, and the like.

As described above, according to the first to third embodiments, processing time and processing resources can be reduced when code words that have respective code lengths shorter than or equal to an upper limit and are perfect codes are assigned to symbols, respectively. The frequency table generation unit 321 generates a frequency table including N symbols, and N frequencies of occurrence that are associated with the N symbols, respectively, based on frequencies of occurrence of input symbols for each symbol. The Huffman tree generation unit 324 generates a Huffman tree based on the frequency table. The code length determination unit 325 determines N code lengths that correspond to the N symbols, respectively, based on the Huffman tree. In a case where the N code lengths include a first code length that is longer than the maximum code length, the maximum code length restriction unit 326 selects a first symbol corresponding to the first code length from the N symbols, selects, from the N symbols, a second symbol corresponding to a second code length that is shorter than the maximum code length, changes the second code length corresponding to the second symbol to a code length that is obtained by adding one to the second code length, and changes the first code length corresponding to the first symbol to a code length that is equal to the changed second code length. The code assignment unit 328 determines N variable length codes that are assigned to the N symbols, respectively, based on the N code lengths. The variable length coding unit 33 converts each of the input symbols into a variable length code, based on the N variable length codes that are assigned to the N symbols, respectively. N is an integer of two or more. The variable length code into which each of the input symbols is converted has a bit length between one bit length and the maximum code length inclusive.

With the configuration, the variable length coding device 15 can proceed the maximum code length restriction process while maintaining variable length codes to be assigned as perfect codes. Accordingly, the variable length coding device 15 can guarantee that the variable length codes assigned based on the code length of each symbol are perfect codes when the maximum code length restriction process has been completed. Therefore, the code table generation unit 32 of the variable length coding device 15 can reduce the processing time and the processing resources as compared to, for example, the code table generation unit 32A of the comparative example, which additionally executes the merge process.

Each of the various functions described in the first to third embodiments may be realized by a circuit (e.g., processing circuit). An exemplary processing circuit may be a programmed processor such as a central processing unit (CPU). The processor executes computer programs (instructions) stored in a memory thereby performs the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiments may be realized in a processing circuit.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A variable length coding device comprising coding circuitry configured to:

generate a frequency table based on frequencies of occurrence of input symbols for each symbol, the frequency table including N symbols, and N frequencies of occurrence that are associated with the N symbols, respectively;

generate a Huffman tree based on the frequency table;

determine N code lengths that corresponds to the N symbols, respectively, based on the Huffman tree;

in a case where the N code lengths include a first code length that is longer than a maximum code length:

select a first symbol corresponding to the first code length from the N symbols;

select, from the N symbols, a second symbol corresponding to a second code length that is shorter than the maximum code length;

change the second code length corresponding to the second symbol to a code length that is obtained by adding one to the second code length; and change the first code length corresponding to the first symbol to a code length that is equal to the changed second code length;

determine N variable length codes that are assigned to the N symbols, respectively, based on the N code lengths; and convert each of the input symbols into a variable length code, based on the N variable length codes that are assigned to the N symbols, respectively, wherein N is an integer of two or more, and the variable length code into which each of the input symbols is converted has a bit length between one bit length and the maximum code length inclusive.

2. The variable length coding device according to claim 1, wherein the coding circuitry is configured to:

divide L symbols of the N symbols into M symbol sets;

generate M representative symbols that represent the M symbol sets, respectively;

generate the Huffman tree, based on frequencies of occurrence of respective H symbols and frequencies of occurrence of the respective M representative symbols, the H symbols being obtained by excluding the L symbols from the N symbols;

determine H code lengths corresponding to the respective H symbols and M code lengths corresponding to the respective M representative symbols, based on the Huffman tree;

in a case where a third code length corresponding to a first representative symbol of the M representative symbols is longer than a representative symbol maximum code length and the H symbols include a third symbol corresponding to a fourth code length that is shorter than or equal to the representative symbol maximum code length:

change the first representative symbol in order for the first representative symbol to correspond to the fourth code length; and change the third symbol in order for the third symbol to correspond to the third code length; and in a case where the H code lengths include the first code length that is longer than the maximum code length:

select, from the H symbols, the first symbol corresponding to the first code length;

select, from the H symbols, the second symbol corresponding to the second code length that is shorter than the maximum code length;

change the second code length corresponding to the second symbol to a code length that is obtained by adding one to the second code length; and change the first code length corresponding to the first symbol to a code length that is equal to the changed second code length, L is an integer of one or more, M is an integer of one or more, and H is an integer of one or more.

3. The variable length coding device according to claim 1, wherein the coding circuitry is configured to:

divide L symbols of the N symbols into M symbol sets;

generate M representative symbols that represents the M symbol sets, respectively;

generate the Huffman tree, based on frequencies of occurrence of respective H symbols and frequencies of occurrence of the respective M representative symbols, the H symbols being obtained by excluding the L symbols from the N symbols;

determine H code lengths that correspond to the H symbols, respectively, and M code lengths that correspond to the M representative symbols, respectively, based on the Huffman tree;

in a case where a third code length corresponding to a first representative symbol of the M representative symbols is longer than a representative symbol maximum code length and the H symbols do not include a symbol corresponding to a code length that is shorter than or equal to the representative symbol maximum code length:

select, from the H symbols, a third symbol corresponding to a fourth code length that is equal to the third code length;

change the third code length corresponding to the first representative symbol to a code length that is obtained by subtracting one from the third code length; and change the fourth code length corresponding to the third symbol to a longer code length;

in a case where the changed third code length is longer than the representative symbol maximum code length:

select, from the H symbols, two symbols each corresponding to a fifth code length that is equal to a code length obtained by adding one to the changed third code length, further change the changed third code length corresponding to the first representative symbol to a code length that is obtained by subtracting one from the changed third code length; and change the fifth code length corresponding to each of the selected two symbols to a longer code length;

in a case where the further changed third code length is longer than the representative symbol maximum code length:

select, from the H symbols, four symbols each corresponding to a sixth code length that is equal to a code length obtained by adding two to the further changed third code length;

change the further changed third code length corresponding to the first representative symbol to a code length obtained by subtracting one from the further changed third code length, and change the sixth code length corresponding to each of the selected four symbols to a longer code length; and in a case where the H code lengths include the first code length that is longer than the maximum code length:

select, from the H symbols, the first symbol corresponding to the first code length;

select, from the H symbols, the second symbol corresponding to the second code length that is shorter than the maximum code length;

change the second code length corresponding to the second symbol to a code length that is obtained by adding one to the second code length; and change the first code length corresponding to the first symbol to a code length that is equal to the changed second code length, L is an integer of one or more, M is an integer of one or more, and H is an integer of one or more.

4. The variable length coding device according to claim 1, wherein the coding circuitry is configured to:

divide L symbols of the N symbols into M symbol sets;

generate M representative symbols that represent the M symbol sets, respectively;

generate the Huffman tree, based on frequencies of occurrence of respective H symbols and frequencies of occurrence of the respective M representative symbols, the H symbols being obtained by excluding the L symbols from the N symbols;

determine H code lengths that correspond to the H symbols, respectively, and M code lengths that correspond to the M representative symbols, respectively, based on the Huffman tree;

in a case where a third code length corresponding to a first representative symbol of the M representative symbols is longer than a representative symbol maximum code length and the H symbols do not include a symbol corresponding to a code length that is shorter than or equal to the representative symbol maximum code length:

select an intermediate node whose depth from a root node is shorter than or equal to the representative symbol maximum code length, in the Huffman tree;

select a third symbol assigned to each of all leaf nodes that are capable of being reached by tracing from the selected intermediate node in a deeper direction;

change a code length corresponding to the third symbol to a longer code length; and change the third code length corresponding to the first representative symbol to the representative symbol maximum code length; and in a case where the H code lengths include the first code length that is longer than the maximum code length:

select, from the H symbols, the first symbol corresponding to the first code length;

select, from the H symbols, the second symbol corresponding to the second code length that is shorter than the maximum code length;

change the second code length corresponding to the second symbol to a code length that is obtained by adding one to the second code length; and change the first code length corresponding to the first symbol to a code length that is equal to the changed second code length, L is an integer of one or more, M is an integer of one or more, and H is an integer of one or more.

5. The variable length coding device according to claim 2, wherein the M symbol sets include a first symbol set that is represented by the first representative symbol, in a case where the first representative symbol is r and a number of symbols that are included in the first symbol set is K(r), the representative symbol maximum code length is obtained by subtracting f(K(r)) from the maximum code length, and f is a function of the number K(r) of the symbols that are included in the first symbol set.

6. The variable length coding device according to claim 5, wherein the f(K(r)) is defined by $$\lceil \log_2(K(r)) \rceil.$$

7. The variable length coding device according to claim 1, wherein the coding circuitry is configured to:

change code lengths of all symbols each corresponding to a code length that is longer than the maximum code length, among the N symbols, to the maximum code length;

calculate a number I of violation symbols among the N symbols;

repeat a process as many times as the number I violation symbols, the process including: selecting, from the N symbols, a fourth symbol corresponding to a code length that is equal to the maximum code length; selecting, from the N symbols, a fifth symbol corresponding to a code length that is shorter than the maximum code length; increasing the code length corresponding to the fifth symbol by one; and changing the code length corresponding to the fourth symbol to a code length that is equal to the increased code length.

8. The variable length coding device according to claim 7, wherein the coding circuitry is configured to calculate the number I of violation symbols by $$I = \left( \sum_{s \in AllSymbol} 2^{-clip(l(s))} - 1 \right) \times 2^{lmax},$$

where

AllSymbol is a symbol set that includes the N symbols, s is a symbol that is an element of the symbol set AllSymbol, l(s) is a code length corresponding to the symbol s, clip(l(s)) is: the maximum code length if the code length l(s) is longer than the maximum code length; and the code length l(s) if the code length l(s) is shorter than or equal to the maximum code length, and lmax is the maximum code length.

9. The variable length coding device according to claim 2, wherein the L symbols are lower L symbols among the N symbols that are sorted in descending order of frequencies of occurrence.

10. The variable length coding device according to claim 2, wherein the L symbols are symbols obtained by excluding upper H symbols among the N symbols that are sorted in descending order of frequencies of occurrence, from the N symbols.

11. The variable length coding device according to claim 2, wherein the M symbol sets include a first symbol set that is represented by the first representative symbol, and the coding circuitry is configured to determine an frequency of occurrence of the first representative symbol, based on frequencies of occurrence of one or more symbols included in the first symbol set.

12. The variable length coding device according to claim 2, wherein the M symbol sets include a first symbol set that is represented by the first representative symbol, the coding circuitry is configured to determine a structure of a subtree that includes leaf nodes to which all symbols in the first symbol set are assigned, respectively, and a code length of a fourth symbol in the first symbol set is obtained by adding a depth from a root node of the subtree to the leaf node to which the fourth symbol is assigned, to a code length corresponding to the first representative symbol.

13. The variable length coding device according to claim 12, wherein the structure of the subtree is a balanced binary tree.

14. The variable length coding device according to claim 12, wherein the coding circuitry is configured to determine the structure of the subtree, based on a frequency of occurrence of each symbol in the first symbol set.

15. The variable length coding device according to claim 12, wherein the coding circuitry is configured to determine the structure of the subtree by selecting one of tree structures prepared in advance.

16. A memory system comprising:

a nonvolatile memory; and controller circuitry including the variable length coding device according to claim 1, wherein the controller circuitry is configured to write, into the nonvolatile memory, data that includes the variable length code into which each of the input symbols is converted.

17. A method of controlling a nonvolatile memory, the method comprising:

generating a frequency table based on frequencies of occurrence of input symbols for each symbol, the frequency table including N symbols, and N frequencies of occurrence that are associated with the N symbols, respectively;

generating a Huffman tree based on the frequency table;

determining N code lengths that corresponds to the N symbols, respectively, based on the Huffman tree;

selecting, from the N symbols, a first symbol corresponding to a first code length, the first code length being included in the N code lengths, the first code length being longer than a maximum code length;

selecting, from the N symbols, a second symbol corresponding to a second code length, the second code length being shorter than the maximum code length;

changing the second code length corresponding to the second symbol to a code length that is obtained by adding one to the second code length;

changing the first code length corresponding to the first symbol to a code length that is equal to the changed second code length;

determining N variable length codes that are assigned to the N symbols, respectively, based on the N code lengths in which the changed first code length and the changed second code length are included;

converting each of the input symbols into a variable length code, based on the N variable length codes that are assigned to the N symbols, respectively; and writing, into the nonvolatile memory, data including the variable length code into which each of the input symbols is converted, wherein N is an integer of two or more, and the variable length code into which each of the input symbols is converted has a bit length between one bit length and the maximum code length inclusive.

* * * * *